United States Patent
Wang et al.

(10) Patent No.: US 11,905,444 B2
(45) Date of Patent: Feb. 20, 2024

(54) QUANTUM DOTS AND PROCESSES FOR PREPARATION THEREOF

(71) Applicant: THE UNIVERSITY OF QUEENSLAND, St Lucia (AU)

(72) Inventors: Lianzhou Wang, Indooroopilly (AU); Yang Bai, Chapel Hill (AU); Mengmeng Hao, Toowong (AU)

(73) Assignee: The University of Queensland, Queensland (AU)

( * ) Notice: Subject to any disclaimer, the term of this patent is extended or adjusted under 35 U.S.C. 154(b) by 71 days.

(21) Appl. No.: 17/426,816

(22) PCT Filed: Feb. 3, 2020

(86) PCT No.: PCT/AU2020/050070
§ 371 (c)(1),
(2) Date: Jul. 29, 2021

(87) PCT Pub. No.: WO2020/154775
PCT Pub. Date: Aug. 6, 2020

(65) Prior Publication Data
US 2022/0145171 A1    May 12, 2022

(30) Foreign Application Priority Data
Feb. 1, 2019 (AU) .................... 2019900305

(51) Int. Cl.
| | |
|---|---|
| C09K 11/02 | (2006.01) |
| C01G 21/00 | (2006.01) |
| C07F 7/24 | (2006.01) |
| C09K 11/06 | (2006.01) |
| C09K 11/66 | (2006.01) |
| B82Y 20/00 | (2011.01) |
| B82Y 40/00 | (2011.01) |
| H01L 31/0352 | (2006.01) |

(52) U.S. Cl.
CPC .......... *C09K 11/025* (2013.01); *C01G 21/006* (2013.01); *C07F 7/24* (2013.01); *C09K 11/06* (2013.01); *C09K 11/665* (2013.01); *B82Y 20/00* (2013.01); *B82Y 40/00* (2013.01); *C01P 2002/34* (2013.01); *C01P 2002/72* (2013.01); *C01P 2002/82* (2013.01); *C01P 2002/84* (2013.01); *C01P 2004/64* (2013.01); *H01L 31/035218* (2013.01)

(58) Field of Classification Search
CPC .. C09K 11/025; C09K 11/665; C01G 21/006; B82Y 20/00; B82Y 40/00; C01P 2002/34; C07F 7/24
See application file for complete search history.

(56) References Cited

U.S. PATENT DOCUMENTS

| | | | |
|---|---|---|---|
| 2017/0233645 A1 | 8/2017 | Zhong et al. | |
| 2017/0342316 A1* | 11/2017 | Luther | H10K 30/35 |
| 2018/0252967 A1* | 9/2018 | Li | G02F 1/133608 |

OTHER PUBLICATIONS

Hazarika et al, "Perovskite Quantum Dot Photovoltaic Materials beyond the Reach of THin Films: Full-Range Tunding of A-site Cation Comosition", ACS Nano, 2018, 12, pp. 10327-10337; Sep. 25, 2018.*
Hazarika, A., et al., "Perovskite Quantum Dot Photovoltaic Materials Beyond the Reach of the Thin Films: Full-Range Tuning of A-Site Cation Composition," ACS Nano, 12, 10327-10337, 2018.
Lorenzon, M., et al., "Role of Nonradiative Defects and Environmental Oxygen on Exciton Recombination Processes in CsPbBr3 Perovskite Nanocrystals," Nano Letters, 17, 3844-3853, 2017.
Mei, G., et al., "Bright and Efficient Light-Emitting Diodes Based on Perovskite Quantum Dots with Formamidine-Methylamine Hybrid Cations," Journal of Physics D: Applied Physics, 51, 454003 (2018).
Protesescu, L., et al., "Nanocrystals of Cesium Lead Halide Perovskites (CsPbX3, X = Cl, Br, and I): Novel Optoelectronic Materials Showing Bright Emission with Wide Color Gamut," Nano Letters, 15, 3692-3696, (2015).
Protesescu, L., et al., "Dismantling the "Red Wall" of Colloidal Perovskites: Highly Luminescent Formamidinium and Formamidinium-Cesium Lead Iodide Nanocrystals," ACS Nano, 11, 3119-3134 (2017) and Supporting Information (p. 1-11).
Sanehira, E.M., et al., "Enhanced mobility CsPbI3 quantum dot arrays for record-efficiency, high-voltage photovoltaic cells,"Science Advances, 3, eaao4204, (2017).
Song, J., et al., "Quantum Dot Light-Emitting Diodes Based on Inorganic Perovskite Cesium Lead Halides (CsPbX 3)," Advanced Materials, 27, 7162-7167 (2015).
Swarnkar, A., et al., "Quantum dot-induced phase stabilization of a-CsPbI3 perovskite for high-efficiency photovoltaics," Science, vol. 354, Issue 6308, 92-95 (2016) and Supplementary Material (p. 1-24).
Xue, J., et al., "Surface Ligand Management for Stable FAPbI3 Perovskite Quantum Dot Solar Cells," Joule 2, 1866-1878 (2018).
International Preliminary Report on Patentability for corresponding application No. PCT/AU2020/050070, dated Aug. 12, 2021.
International Search Report for PCT/AU2020/050070, dated Mar. 10, 2020, 4 pages.
Written Opinion of the ISA for PCT/AU2020/050070, dated Mar. 10, 2020, 6 pages.

\* cited by examiner

*Primary Examiner* — C Melissa Koslow
(74) *Attorney, Agent, or Firm* — Nixon & Vanderhye, PC

(57) ABSTRACT

Disclosed are processes for preparing hybrid perovskite quantum dots and the resulting hybrid perovskite quantum dots and uses thereof. Such quantum dots are useful as semiconductors in devices such as solar cells and light-emitting diodes.

19 Claims, 16 Drawing Sheets

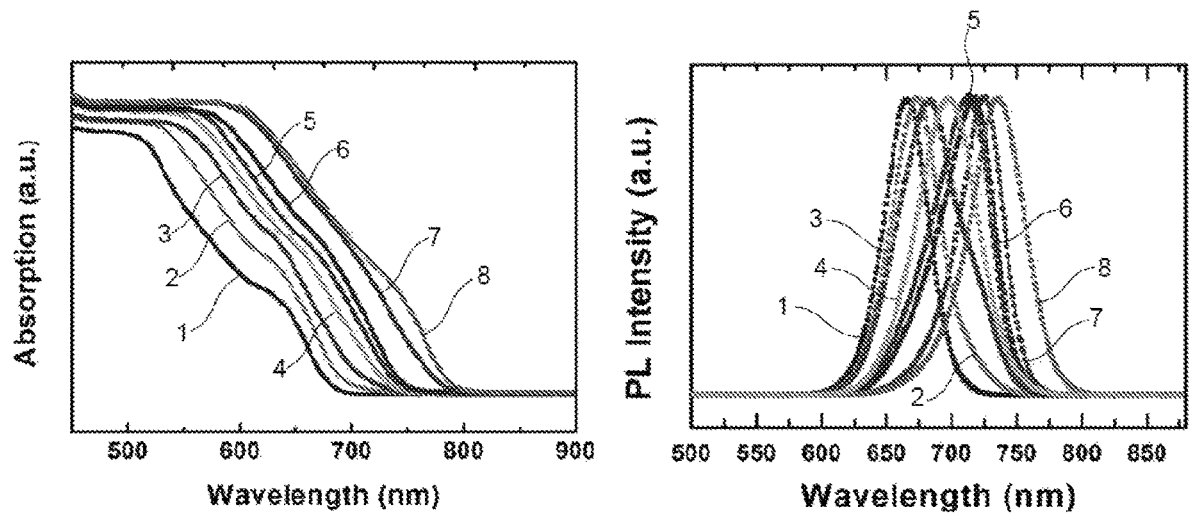
Fig. 1A
Fig. 1B
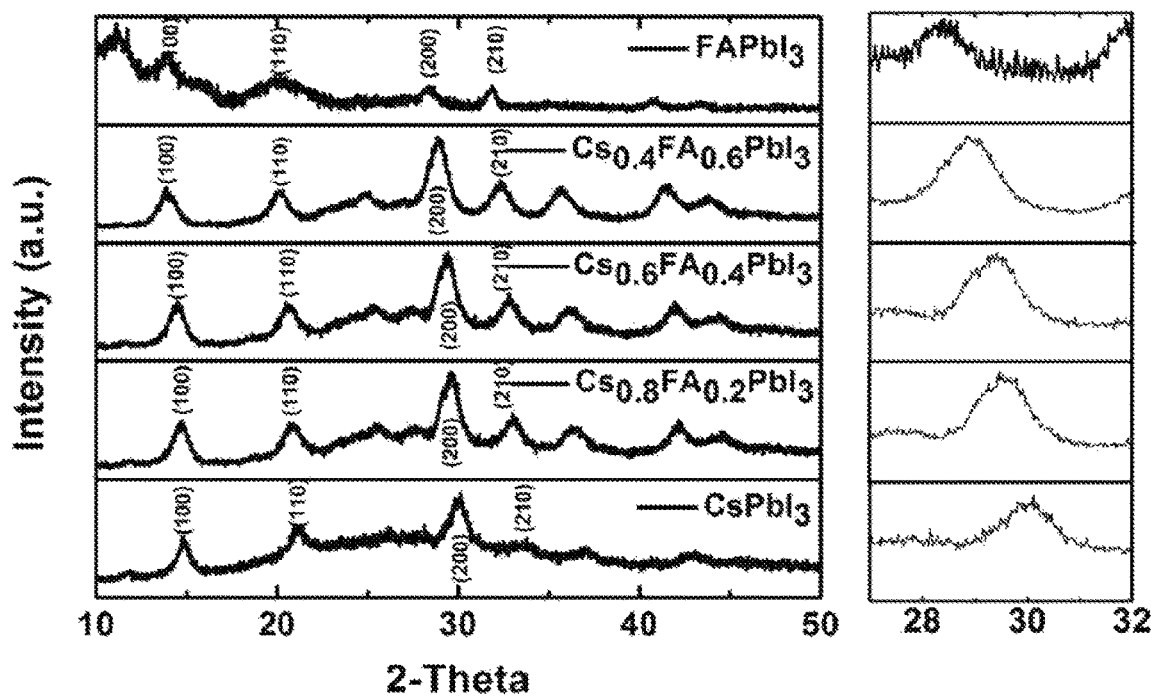
Fig. 1C

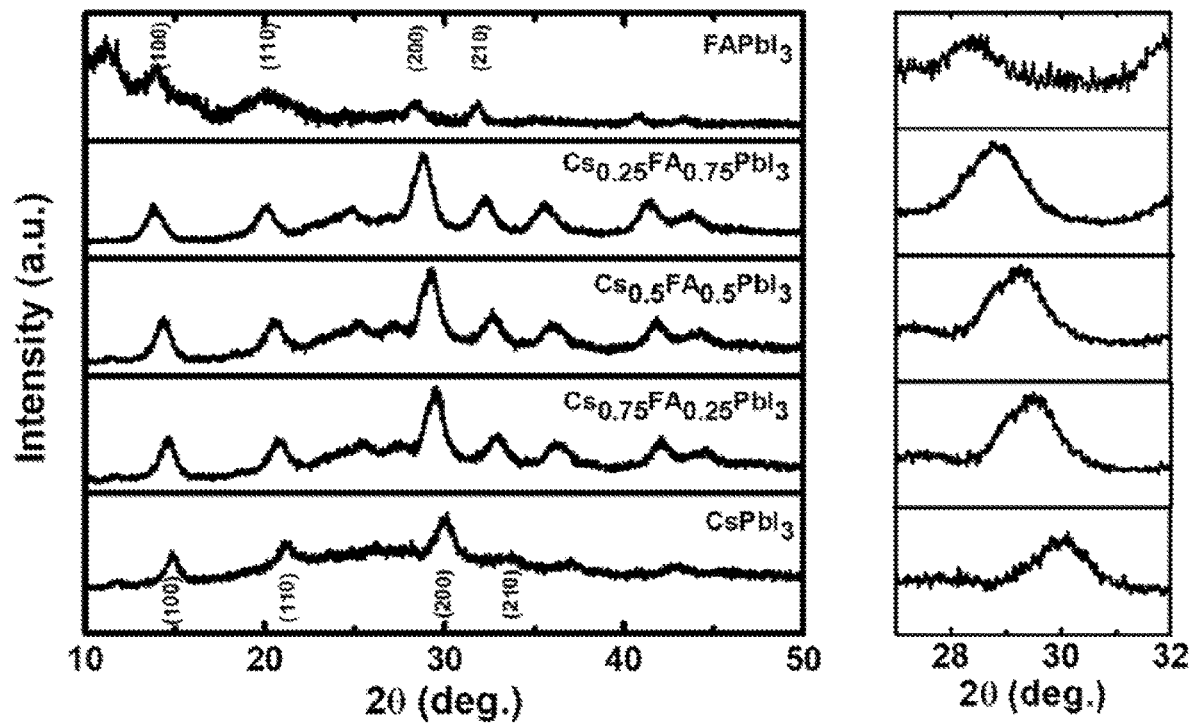
Fig. 1D
Fig. 2A    Fig. 2B    Fig. 2C    Fig. 2D    Fig. 2E
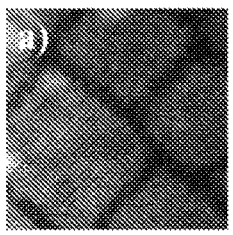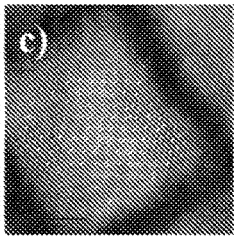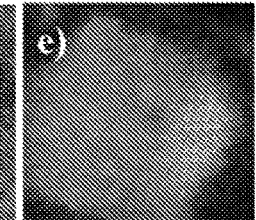
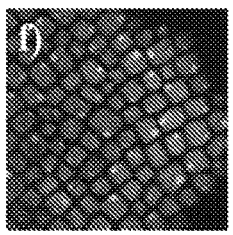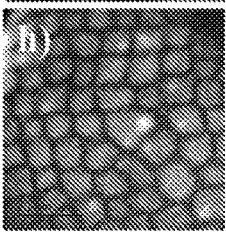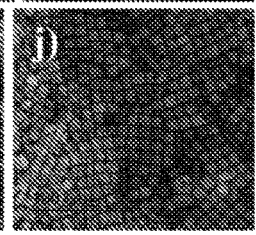
Fig. 2F    Fig. 2G    Fig. 2H    Fig. 2I    Fig. 2J

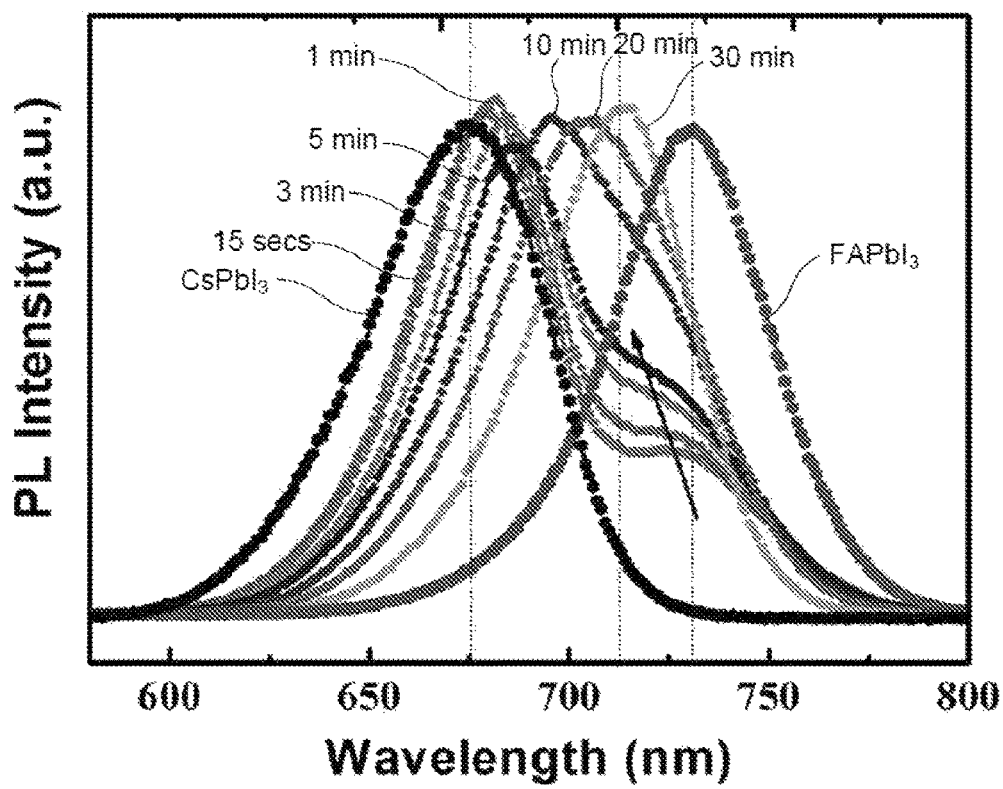
Fig. 3
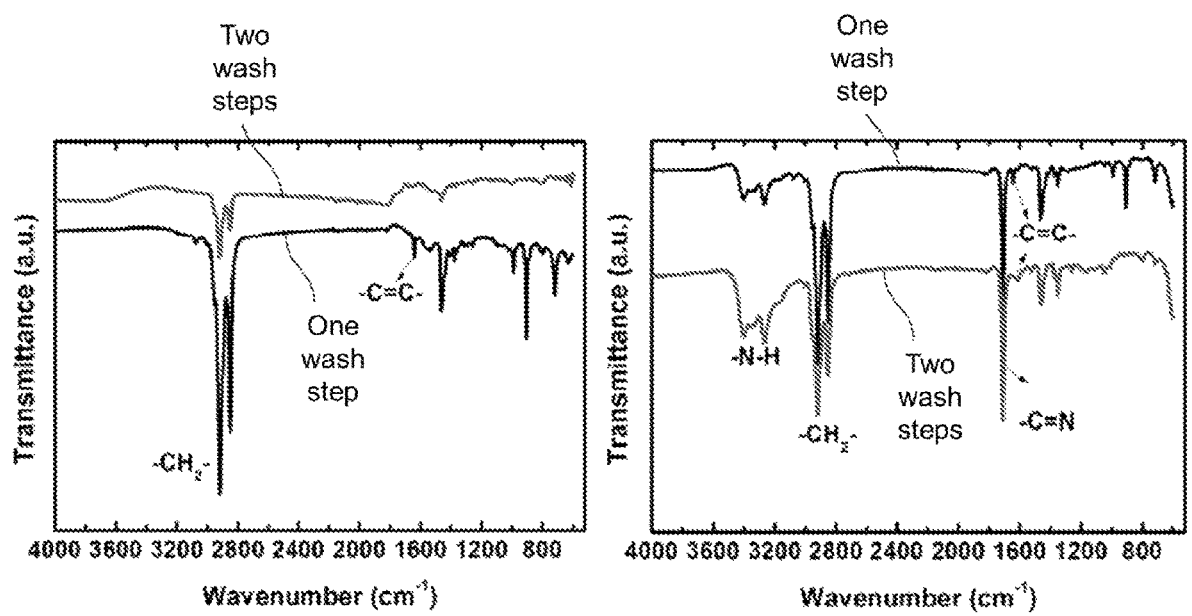
Fig. 4A
Fig. 4B

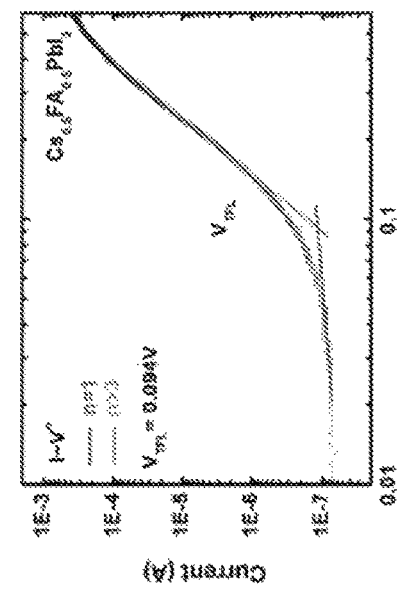
Fig. 8C
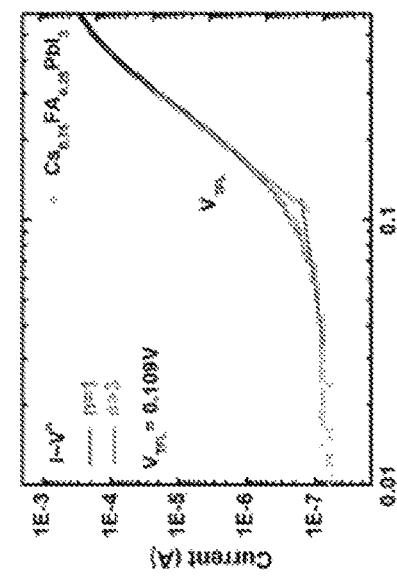
Fig. 8B
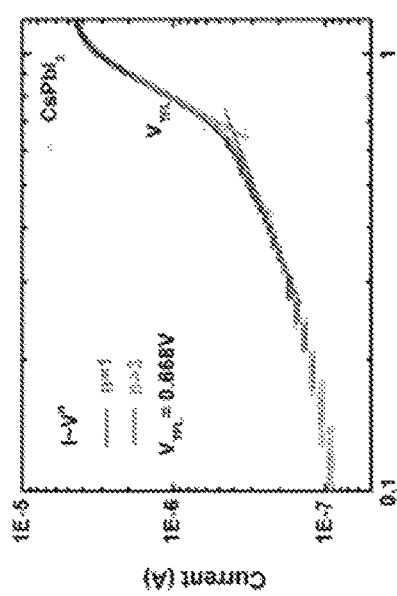
Fig. 8A
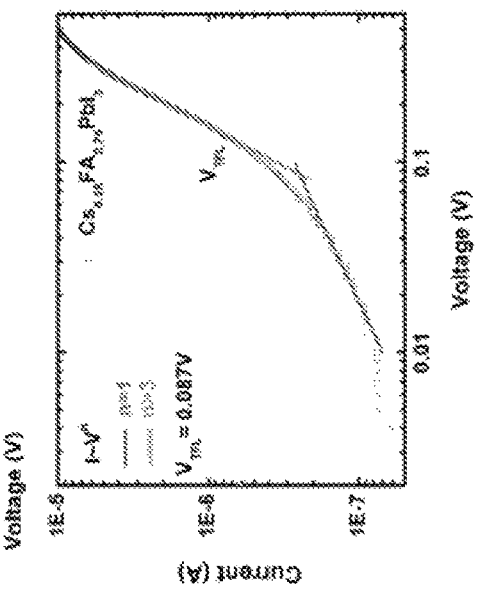
Fig. 8E
Fig. 8D

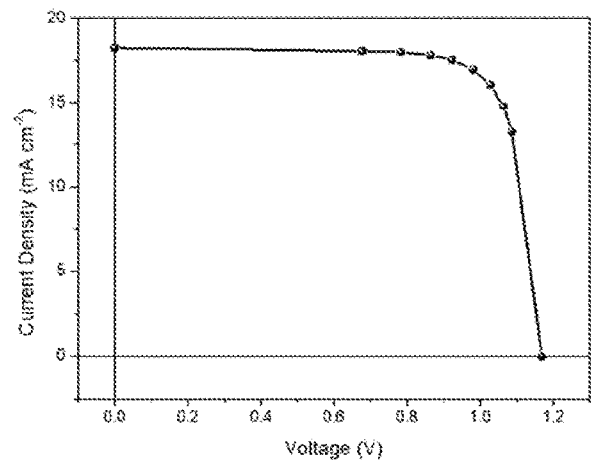
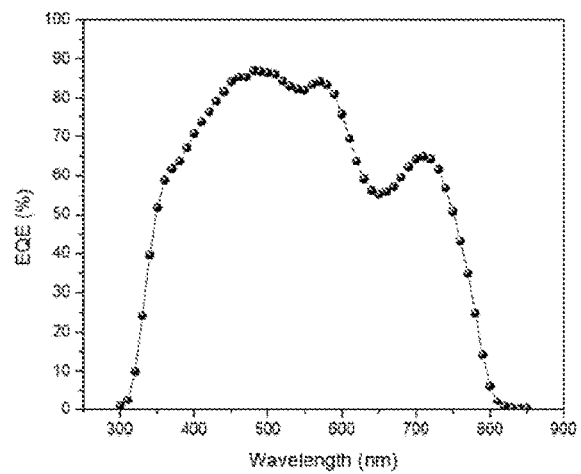
Fig. 9A        Fig. 9B
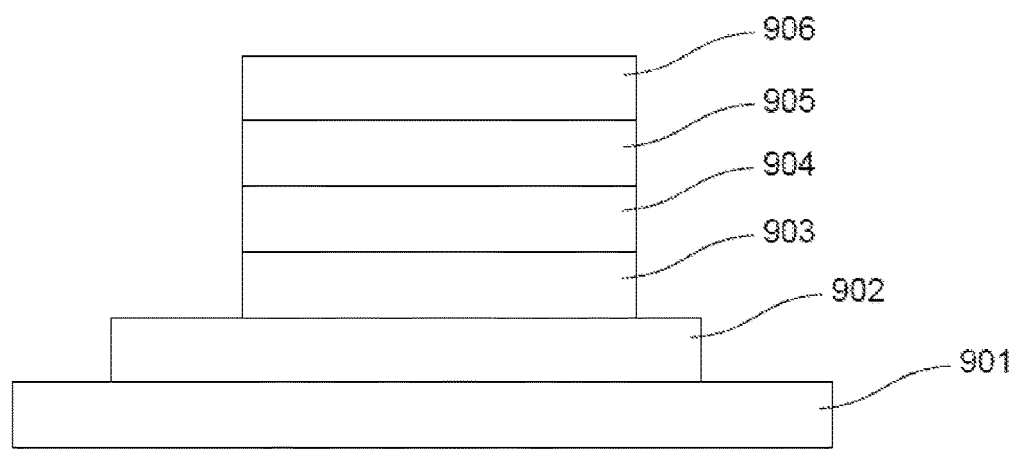
Fig. 9C

QUANTUM DOTS AND PROCESSES FOR PREPARATION THEREOF

This application is the U.S. national phase of International Application No. PCT/AU2020/050070 filed 3 Feb. 2020, which designated the U.S. and claims priority to Australian Provisional Application No. 2019900305 entitled "Quantum Dots and Processes for Preparation Thereof" filed on 1 Feb. 2019, the entire contents of each of which are hereby incorporated herein by reference.

FIELD OF THE INVENTION

This invention relates generally to processes for preparing hybrid perovskite quantum dots and the resulting hybrid perovskite quantum dots and uses thereof.

BACKGROUND OF THE INVENTION

The reference in this specification to any prior publication (or information derived from it), or to any matter which is known, is not, and should not be taken as an acknowledgment or admission or any form of suggestion that the prior publication (or information derived from it) or known matter forms part of the common general knowledge in the field of endeavour to which this specification relates.

Colloidal quantum dots (QDs) represent a promising material in numerous photonic technologies, including solar cells, light emitting diodes (LEDs), lasers, radiation detectors and photodetectors (Lorenzon et al. (2017) *Nano letters,* 17(6): 3844-3853). Such quantum dots are especially advantageous due to the tunability in the material bandgap, energetic position of the electronic states and surface chemistry, low temperature solution synthesis process and facile printable technology for film fabrication (Sanehira et al. (2017) *Science Advances,* 3(10): eaao4204). As a result, interest into colloidal quantum dots has increased in recent years.

Compared with traditional group III-V quantum dots, colloidal perovskite quantum dots have a superior charge diffusion length and fewer defects due to their specific ionic structure. High power conversion efficiencies have been reported in solar cell devices with perovskite quantum dots, including 10.7% power conversion efficiency in a solar cell device utilising $CsPbI_3$ quantum dots (Swarnkar et al. (2016) *Science,* 354(6308): 92-95), which was further increased to 13.4% upon introduction of a formamidinium iodide surface ligand (Sanehira et al. 2017). However, the use of $CsPbI_3$ quantum dots in solar cell devices is limited by the poor stability of the quantum dots due to humidity induced phase transition from cubic to orthorhombic phase, and their large bandgap, which is only adjustable from 2.2 eV to 1.8 eV.

Properties of perovskite quantum dots may be tailored by changing the composition of the quantum dots, for example, by chemical substitution or alloying. Recently it has been shown that alloying a formamidinium cation (FA) into $CsPbI_3$ quantum dots improves the phase stability and reduces the bandgap of the quantum dots (Hazarika et al. (2018) *ACS Nano,* 12(10): 10327-10337; Protesescu et al. (2017) *ACS Nano,* 11(3): 3119-3134). Direct synthesis of such hybrid quantum dots is widely unsuccessful due to the hot-injection process used, wherein the FA is prevented from incorporation into the crystal lattice due to the oleylamine-rich environment typically required for the synthesis of $CsPbI_3$. New synthetic methodologies for the preparation of hybrid quantum dots are desired.

Improved hybrid quantum dots and processes for their preparation thereof are required.

SUMMARY OF THE INVENTION

In one aspect, the present invention provides a process for preparing hybrid perovskite quantum dots, the process comprising the steps of: preparing first quantum dots having a first composition and a first surface ligand at a first target amount; preparing second quantum dots having a second composition and a second surface ligand at a second target amount; and preparing a solution comprising a ratio of the first and second quantum dots so that the first and second quantum dots undergo ligand-mediated cation exchange to form hybrid quantum dots having a composition determined by the first and second compositions and the ratio.

In some embodiments, the first quantum dots are synthesised with a first surface ligand at a first amount and are at least partially purified to reduce the amount of the first surface ligand to the first target amount.

In some embodiments, the first composition and the second composition independently comprise a compound of formula I:

$$AMX_3 \qquad (I)$$

wherein:
A is an alkali metal cation, $CH_3NH_3^+$ or $NH_2CH{=}NH_2^+$;
M is a metal cation; and
each X is independently a halide;
wherein the second composition is a composition other than the first composition.

In some embodiments, a molar ratio of a compound of formula I in the first quantum dots to the first surface ligand at the first target amount is in the range of from 1:2 to 1:25. In particular embodiments, the molar ratio is in the range of from 1:2.5 to 1:5.5.

In some embodiments, a molar ratio of a compound of formula I in the first quantum dots to the first surface ligand at the first amount is in the range of from 1:20 to 1:45. In particular embodiments, the molar ratio is in the range of from 1:25 to 1:40.

In some embodiments, a molar ratio of the first surface ligand at the first target amount to the first surface ligand at the first amount is in the range of from 1:2 to 1:25. In particular embodiments, the molar ratio is in the range of from 1:4 to 1:16.

In some embodiments, the process comprises preparing the first quantum dots using a process comprising the steps of: preparing a first product solution comprising the first quantum dots comprising the first surface ligand at the first amount; and at least partially purifying the first quantum dots to create a first solution comprising the first quantum dots comprising the first surface ligand at the first target amount.

In some embodiments, the process comprises at least partially purifying the first quantum dots using a process comprising the steps of: precipitating the first quantum dots from the first product solution; separating the precipitate from the first product solution; and dispersing the precipitate in a first solvent to form the first solution.

In some embodiments, the first quantum dots are precipitated from the first product solution by adding a solvent selected from the group consisting of methanol, ethanol, acetone, methyl acetate, ethyl acetate, propanol, pentanol, acetonitrile and combinations thereof.

In some embodiments, the first solvent is selected from the group consisting of toluene, chloroform, isooctane, pentane, heptane, cyclohexane, benzene, hexane and combinations thereof.

In some embodiments, the first target amount is a concentration in the range of from 0.01 g/mL to 0.5 g/mL in the first solution. In particular embodiments, the first target amount is a concentration in the range of from 0.05 g/mL to 0.1 g/mL in the first solution.

In some embodiments, the first amount is a concentration in the range of from 0.1 g/mL to 0.9 g/mL in the first product solution. In particular embodiments, the first amount is a concentration in the range of from 0.5 g/mL to 0.7 g/mL in the first product solution.

In some embodiments, the first composition is $CsPbI_3$.

In some embodiments, the second quantum dots are synthesised with a second surface ligand at a second amount and are at least partially purified to reduce the amount of the second surface ligand to the second target amount.

In some embodiments, a molar ratio of a compound of formula I in the second quantum dots to the second surface ligand at the second target amount is in the range of from 1:3 to 1:30. In particular embodiments, the molar ratio is in the range of from 1:9 to 1:25. In some embodiments, the molar ratio is in the range of from 1:9 to 1:15.

In some embodiments, a molar ratio of a compound of formula I in the second quantum dots to the second surface ligand at the second amount is in the range of from 1:15 to 1:40. In particular embodiments, the molar ratio is in the range of from 1:20 to 1:35.

In some embodiments, a molar ratio of the second surface ligand at the second target amount to the second surface ligand at the second amount is in the range of from 1:1.2 to 1:15. In particular embodiments, the molar ratio is in the range of from 1:1.5 to 1:4.

In some embodiments, the process comprises preparing the second quantum dots using a process comprising the steps of: preparing a second product solution comprising the second quantum dots comprising the second surface ligand at the second amount; and at least partially purifying the second quantum dots to create a second solution comprising the second quantum dots comprising the second surface ligand at the second target amount.

In some embodiments, the process comprises at least partially purifying the second quantum dots using a process comprising the steps of: precipitating the second quantum dots from the second product solution; separating the precipitate from the second product solution; and dispersing the precipitate in a second solvent to form the second solution.

In some embodiments, the second quantum dots are precipitated from the second product solution by adding a solvent selected from the group consisting of methanol, ethanol, acetone, methyl acetate, ethyl acetate, propanol, pentanol, acetonitrile and combinations thereof.

In some embodiments, the second solvent is selected from the group consisting of toluene, chloroform, isooctane, pentane, heptane, cyclohexane, benzene, hexane and combinations thereof.

In some embodiments, the second target amount is a concentration in the range of from 0.05 g/mL to 0.7 g/mL in the second solution. In particular embodiments, the second target amount is a concentration in the range of from 0.2 g/mL to 0.5 g/mL in the second solution.

In some embodiments, the second amount is a concentration in the range of from 0.1 g/mL to 0.9 g/mL in the second product solution. In particular embodiments, the second amount is a concentration in the range of from 0.5 g/mL to 0.7 g/mL in the second product solution.

In some embodiments, the second composition is $FAPbI_3$.

In some embodiments, the first and second surface ligands are independently selected from the group consisting of an amine selected from the group consisting of optionally substituted alkyl amine, optionally substituted alkenyl amine, optionally substituted aralkyl amine and optionally substituted aryl amine; a phosphine selected from the group consisting of optionally substituted trialkyl phosphine, optionally substituted alkyl phosphine, optionally substituted alkenyl phosphine, optionally substituted aryl phosphine, optionally substituted triaryl phosphine and optionally substituted aralkyl phosphine; an alkali metal cation; an acid selected from the group consisting of optionally substituted alkyl carboxylic acid, optionally substituted alkenyl carboxylic acid, optionally substituted aralkyl carboxylic acid and optionally substituted aryl carboxylic acid; a halide or a pseudo halide; a thiol selected from the group consisting of optionally substituted alkyl thiol, optionally substituted alkenyl thiol, optionally substituted aryl thiol and optionally substituted cycloalkyl thiol; and combinations thereof.

In some embodiments, the amine is selected from the group consisting of oleylamine, benzylamine, formamidine, methylamine and combinations thereof.

In some embodiments, the phosphine is selected from the group consisting of trioctyl phosphine, benzyl phosphine and triphenyl phosphine.

In some embodiments, the alkali metal cation is selected from the group consisting of $Cs^+$, $Rb^+$ and $K^+$.

In some embodiments, the acid is selected from the group consisting of oleic acid, benzoic acid and acetic acid. In particular embodiments, the acid is oleic acid.

In some embodiments, the halide or pseudo halide is selected from the group consisting of $I^-$, $Br^-$, $Cl^-$ and $SCN^-$.

In some embodiments, the thiol is selected from the group consisting of 1,2-ethanedithiol, 1-hexanethiol and cyclohexanethiol.

In some embodiments, the hybrid perovskite quantum dots have the formula $Cs_yFA_{1-y}PbI_3$, wherein y is a value in the range of from 0.1 to 0.9 and is determined by the ratio of the first and second quantum dots.

In another aspect, the invention provides hybrid perovskite quantum dots produced by the process of the invention.

It will be appreciated that the broad forms of the invention and their respective features can be used in conjunction and/or independently, and reference to separate broad forms is not intended to be limiting. Furthermore, it will be appreciated that features of the method can be performed using the system or apparatus and that features of the system or apparatus can be implemented using the method.

BRIEF DESCRIPTION OF THE DRAWINGS

Various examples and embodiments of the present invention will now be described with reference to the accompanying drawings, in which:

FIG. 1 illustrates the optical characterisation of the $CsPbI_3$, $FAPbI_3$ and $[Cs/FA]PbI_3$ quantum dots. (A) shows the UV-vis absorption spectra and (B) shows the steady-state photoluminescence (PL) spectra of the quantum dots with various stoichiometry, wherein (1) to (8) represents the samples $CsPbI_3$, $Cs_{0.9}FA_{0.1}PbI_3$, $Cs_{0.8}FA_{0.2}PbI_3$, $Cs_{0.6}FA_{0.4}PbI_3$, $Cs_{0.5}FA_{0.5}PbI_3$, $Cs_{0.4}FA_{0.6}PbI_3$, $Cs_{0.2}FA_{0.8}PbI_3$, and $FAPbI_3$, respectively. (C) and (D) show X-ray powder diffraction (XRD) spectra of the hybrid quantum dots with differing stoichiometry. The magnified image (right) shows the peak shifting towards a lower angle with an increasing proportion of FA.

FIG. 2 displays high resolution scanning transmission electron microscope (STEM) images of the synthesised quantum dots, wherein (A) and (F) are $CsPbI_3$, (B) and (G) are $Cs_{0.75}FA_{0.25}PbI_3$, (C) and (H) are $Cs_{0.5}FA_{0.5}PbI_3$, (D) and (I) are $Cs_{0.25}FA_{0.75}PbI_3$, and (E) and (J) are $FAPbI_3$.

FIG. 3 presents PL spectra at various time points (15 s, 1 min, 3 mins, 5 mins, 10 mins, 20 mins and 30 mins) during cation-exchange between $CsPbI_3$ and $FAPbI_3$ at a molar ratio of 1:1 to form hybrid $Cs_{0.5}FA_{0.5}PbI_3$ quantum dots.

FIG. 4 presents Fourier-transformed infrared (FTIR) spectra of (A) $CsPbI_3$ and (B) $FAPbI_3$ quantum dots subjected to a single (one wash step) or double purification step (two wash steps). Peaks corresponding to —C═C— species (1640 cm$^{-1}$) from oleic acid and —C≡N species (1712 cm$^{-1}$) from formamidinium are indicated, along with —CH$_2$— and —N—H species.

FIG. 8 displays SCLC measurements for an electron-only device comprising (A) $CsPbI_3$; (B) $Cs_{0.75}FA_{0.25}PbI_3$; (C) $Cs_{0.5}FA_{0.5}PbI_3$; (D) $Cs_{0.25}FA_{0.75}PbI_3$; and (E) $FAPbI_3$ quantum dots.

FIG. 9 displays the characteristics of a solar cell comprising hybrid $Cs_{0.5}FA_{0.5}PbI_3$ quantum dots: (A) is a graph showing a stabilised J-V curve of a solar cell device; (B) is a graph showing the external quantum efficiency (EQE) of the solar cell; and (C) is a schematic side view of an example of a solar cell constructed using a quantum dot film.

DETAILED DESCRIPTION OF THE INVENTION

I. Definitions

Figure 5A:
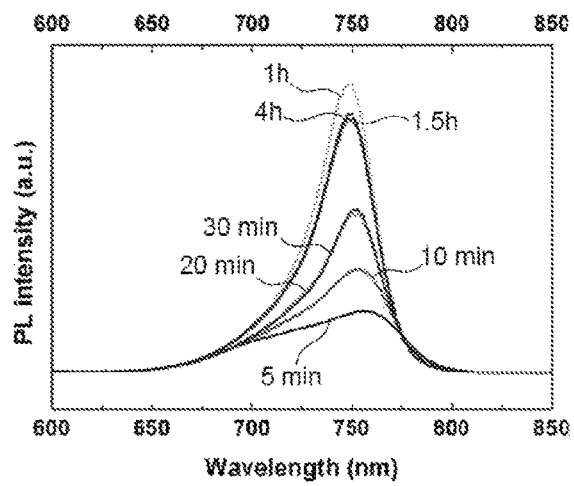
FIG. 5 presents PL spectra at various time points during cation exchange between $CsPbI_3$ and $FAPbI_3$ quantum dots previously subjected to (A) a single or (B) a double purification step.

Unless defined otherwise, all technical and scientific terms used herein have the same meaning as commonly understood by those of ordinary skill in the art to which the invention belongs. Although any methods and materials similar or equivalent to those described herein can be used in the practice or testing of the present invention, preferred methods and materials are described. For the purposes of the present invention, the following terms are defined below.

The articles "a" and "an" are used herein to refer to one or to more than one (i.e. to at least one) of the grammatical object of the article. By way of example, "an element" means one element or more than one element.

By "about" is meant a quantity, level, value, number, frequency, percentage, dimension, size, amount, weight or length that varies by as much 15, 14, 13, 12, 11, 10, 9, 8, 7, 6, 5, 4, 3, 2 or 1% to a reference quantity, level, value, number, frequency, percentage, dimension, size, amount, weight or length.

As used herein, the term "alkali metal cation" refers to a positively charged group 1 element, excluding hydrogen. Exemplary alkali metal cations include, but are not limited to, Li$^+$, Na$^+$, K$^+$, Rb$^+$, Cs$^+$ and Fr$^+$.

As used herein, the term "alkenyl" includes within its meaning monovalent ("alkenyl") and divalent ("alkenylene") straight-chain or branched chain unsaturated hydrocarbon group having one or more double bonds between carbon atoms and having 2 to 20 carbon atoms. Where appropriate, the alkenyl group may have a specified number of carbon atoms. For example, C$_2$-C$_6$ as in "C$_2$-C$_6$alkenyl" includes groups having 2, 3, 4, 5 or 6 carbon atoms in a linear or branched arrangement. Unless indicated otherwise, the stereochemistry about each double bond may be independently cis or trans, or E or Z as appropriate. Examples of suitable alkenyl groups include, but are not limited to, ethenyl, vinyl, allyl, 1-methylvinyl, 1-propenyl, 2-propenyl, 2-methyl-1-propenyl, 2-methyl-1-propenyl, 1-butenyl, 2-butenyl, 3-butentyl, 1,3-butadienyl, 1-pentenyl, 2-pententyl, 3-pentenyl, 4-pentenyl, 1,3-pentadienyl, 2,4-pentadienyl, 1,4-pentadienyl, 3-methyl-2-butenyl, 1-hexenyl, 2-hexenyl, 3-hexenyl, 1,3-hexadienyl, 1,4-hexadienyl, 2-methylpentenyl, heptenyl, octenyl, nonenyl, decenyl and oleyl.

As used herein, the term "alkyl" includes within its meaning monovalent ("alkyl") and divalent ("alkylene") straight chain or branched chain saturated hydrocarbon group having 1 to 20 carbon atoms. Where appropriate, the alkyl group may have a specified number of carbon atoms, for example, C$_{1-6}$alkyl which includes alkyl groups having 1, 2, 3, 4, 5 or 6 carbon atoms in a linear or branched arrangement. Examples of suitable alkyl groups include, but are not limited to, methyl, ethyl, n-propyl, i-propyl, n-butyl, i-butyl, t-butyl, s-butyl, amyl, 1,2-dimethylpropyl, 1,1-dimethylpropyl, pentyl, i-pentyl, hexyl, 1-methylpentyl, 2,2-dimethylbutyl, 3,3-dimethylbutyl, 1,2-dimethylbutyl, 1,3-dimethylbutyl, 1,2,2-trimethylpropyl, 1,1,2-trimethylpropyl, 2-methylbutyl, 3-methylbutyl, 4-methylbutyl, n-hexyl, 2-methylpentyl, 3-methylpentyl, 4-methylpentyl, 5-methylpentyl, 2-ethylbutyl, 3-ethylbutyl, heptyl, octyl, nonyl, and decyl.

As used herein, the term "amount" refers to a quantity of an item.

As used herein, the term "and/or" refers to and encompasses any and all possible combinations of one or more of the associated listed items, as well as the lack of combinations when interpreted in the alternative (or).

"Aralkyl" means alkyl as defined above which is substituted with an aryl group as defined herein, e.g., —CH$_2$phenyl (benzyl), —(CH$_2$)$_2$phenyl, —(CH$_2$)$_3$phenyl, —CH$_2$CH(CH$_3$)CH$_2$phenyl, and the like and derivatives thereof.

As used herein, the term "aryl" or "aromatic" as a group or part of a group denotes (i) an optionally substituted monocyclic, or fused polycyclic, aromatic carbocycle (ring structure having ring atoms that are all carbon) that may have up to 10 atoms per ring, for example, from 4 to 10 atoms per ring denoted C$_{4-10}$aryl. Examples of aryl groups include phenyl, naphthyl, phenanthryl and the like; (ii) an optionally substituted partially saturated bicyclic aromatic carbocyclic moiety in which a phenyl and a C$_{5-7}$cycloalkyl or C$_{5-7}$cycloalkenyl group are fused together to form a cyclic structure, such as tetrahydronaphthyl, indenyl or indanyl. The group may be a terminal group or a bridging group.

The term "composition" is used herein to refer to the constituents of an item. For example, the term "first composition" refers to the constituents of the first quantum dots, and the term "second composition" refers to the constituents of the second quantum dots. In particular embodiments, "composition" refers to the chemical composition. For example, in some embodiments, the quantum dots may have a composition represented by formula I or II as defined herein.

Throughout this specification and the claims which follow, unless the context requires otherwise, the word "comprise", and variations such as "comprises" and "comprising", will be understood to imply the inclusion of a stated integer or step or group of integers or steps but not the exclusion of any other integer or step or group of integers or steps. Thus, the use of the term "comprising" and the like indicates that the listed integers are required or mandatory, but that other integers are optional and may or may not be present. By "consisting of" is meant including, and limited to, whatever follows the phrase "consisting of". Thus, the phrase "consisting of" indicates that the listed elements are required or mandatory, and that no other elements may be present. By "consisting essentially of" is meant including any elements listed after the phrase, and limited to other elements that do not interfere with or contribute to the activity or action specified in the disclosure for the listed elements. Thus, the phrase "consisting essentially of" indicates that the listed elements are required or mandatory, but that other elements are optional and may or may not be present depending upon whether or not they affect the activity or action of the listed elements.

The term "cycloalkyl" means a saturated or partially saturated, monocyclic, fused or spiro polycyclic, carbocycle that may contain from 3 to 9 carbon atoms per ring, such as cyclopropyl, cyclobutyl, cyclopentyl, cyclohexyl, spiro[3.3] heptane, and the like, unless otherwise specified. It includes monocyclic systems such as cyclopropyl and cyclohexyl, bicyclic systems such as decalin, and polycyclic systems such as adamantane. The group may be a terminal group or a bridging group.

The abbreviation "FA" is used herein to refer to formamidinium ($NH_2CH=NH_2^+$).

As used herein, the terms "halogen" or "halo" are synonymous and refer to fluorine, chlorine, bromine or iodine. The term "halide" is used to refer to a halogen anion. The term "pseudo halogen" is used herein to refer to a polyatomic analogue of a halogen. Exemplary pseudo halogens include, but are not limited to, SCN, SeCN, PCO, OCI, OBr, and OI. The term "pseudo halide" is used herein to refer to a pseudo halogen anion.

As used herein, the term "ligand-mediated cation exchange" refers to the exchange of one or more cations between compounds (e.g. the quantum dots), which is facilitated by one or more ligands. In preferred embodiments, the one or more ligands is one or more surface ligands.

As used herein, the term "metal" refers to a metallic element such as an alkali metal, an alkaline earth metal, a transition metal, and a basic metal. The term "metal" also includes a semi-metallic element such as Si and the like.

The term "perovskite" as used herein refers to a compound which has the perovskite structure. Similarly, perovskite quantum dots refers to quantum dots possessing the perovskite structure.

By "product solution" is meant a solution in which precursors of the quantum dots have been reacted to form the quantum dots. The product solution has not been purified or partially purified.

As used herein, the term "purified" refers to an item which has been subjected to a process to remove contaminants. The extent of purification will depend on the process used. For example, in some embodiments, purified quantum dots may have 90%, 95%, 96%, 97%, 98%, 99% or 100% purity (and all integers therebetween). The term "partially purified" refers to an item which has been subjected to a process to remove contaminants but still retains some contaminants. For example, in some embodiments, partially purified quantum dots may have 30%, 35%, 40%, 45%, 50%, 55%, 60%, 65%, 70%, 75%, 80%, 85% or 90% purity (and all integers therebetween). In some embodiments, the contaminant is a surface ligand.

The term "quantum dots" is used herein to refer to a semiconductor crystal, which is typically several nanometers in size, such as from about 1 nm to about 100 nm. As used herein, the term "hybrid quantum dots" refers to quantum dots formed by two or more quantum dots, preferably two quantum dots, and contain a mixture of chemical elements determined by the composition of the precursor quantum dots (i.e. the first and second quantum dots). In particular embodiments, the hybrid quantum dots comprise a mixture of chemical elements represented by A (i.e. in the A-site). For example, in some embodiments, the hybrid quantum dots comprise a compound of formula II:

$$A^1_y A^2_{1-y} MX_3 \tag{II}$$

wherein:
$A^1$ is an alkali metal cation, $CH_3NH_3^+$ or $NH_2CH=NH_2^+$;
$A^2$ is an alkali metal cation, $CH_3NH_3^+$ or $NH_2CH=NH_2^+$;
M is a metal cation;
each X is independently a halide; and
y is a value in the range of from 0.1 to 0.9;
wherein $A^1$ is other than $A^2$.

The hybrid quantum dots may also be referred to as being formed of a compound of formula II, or represented by formula II.

The term "solution" is used herein to refer to a mixture of a solid and a liquid. While in some embodiments, the term "solution" refers to a mixture wherein the solid is dissolved in the liquid, this term also encompasses a colloidal solution, where the solid is dispersed in the liquid.

The term "substituted" and variants such as "optionally substituted" as used herein, unless otherwise indicated, mean that a substituent may be further substituted by one or more additional substituents, which may be optional or otherwise. The term "optionally substituted" unless stated otherwise, denotes that the group may or may not be further substituted or fused (so as to form a polycyclic system), with one or more non-hydrogen substituent groups. Suitable chemically viable optional substituents for a particular functional group will be apparent to those skilled in the art. Preferred optional substituents include, but are not limited to, halogen, —$NH_2$, —OH, —COOH, —$C_{1-20}$ alkyl, $C_{4-8}$ aryl, $C_{1-20}$ alkenyl, halogen, or —SH.

By "surface ligand" is meant a compound which binds to the surface of the quantum dots. In preferred embodiments, the surface ligand binds through non-covalent interactions.

Each embodiment described herein is to be applied mutatis mutandis to each and every embodiment unless specifically stated otherwise.

2. Process for Preparation of Hybrid Perovskite Quantum Dots

The synthesis of quantum dots involves the presence of ligands which bind to the surface of the quantum dots (surface ligands). Such ligands are then separated from the quantum dots through several rounds of purification, or washing steps, as it is thought that the presence of the ligand promotes degradation of the quantum dots. However, when the ligand is removed from the surface of the quantum dots, the elements of the quantum dots, particularly those at the surface, become exposed to external influences, such as heat, humidity and oxygen, thereby resulting in decomposition of the quantum dots. Such degradation hinders the subsequent use of the quantum dots.

This invention is based, in part, on the identification that hybrid quantum dots with a high power conversion efficiency and high stability may be prepared by retaining a specific amount of surface ligand on the precursor quantum dots (i.e. the first and second quantum dots) prior to ligand-mediated cation exchange to form the hybrid quantum dots. It is thought that such amount of surface ligand improves the efficiency of cation exchange between the precursor quantum dots and the stability of both the precursor and resulting hybrid quantum dots.

In one aspect of the invention, there is provided a process for preparing hybrid perovskite quantum dots, the process comprising, consisting or consisting essentially of the steps of: preparing first quantum dots having a first composition and a first surface ligand at a first target amount; preparing second quantum dots having a second composition and a second surface ligand at a second target amount; and preparing a solution comprising a ratio of the first and second quantum dots so that the first and second quantum dots undergo ligand-mediated cation exchange to form hybrid quantum dots having a composition determined by the first and second compositions and the ratio.

Accordingly, the above described process uses first and second quantum dots, having respective first and second compositions, and then involves ligand-mediated cation exchange in order to produce hybrid quantum dots, whose composition is based on the first and second compositions and a ratio of the first and second quantum dots. This allows the composition of the final hybrid quantum dots to be highly controlled, which in turn allows quantum dots to be manufactured which have carefully controlled properties, such as a specific bandgap, or the like. This allows quantum dots to be manufactured for specific applications, such as for use in solar cells, LEDs, or similar.

In addition, the approach retains target amounts of surface ligands prior to performing the ligand-mediated cation exchange. This helps mediate the cation exchange, allowing this to occur more rapidly than in traditional techniques, for example allowing this to be completed in minutes, as opposed to hours, thereby vastly increasing the rate of production of quantum dots.

Furthermore, retaining a certain amount of surface ligands prior to cation exchange helps preserve the quantum dot structure, resulting in higher quality hybrid quantum dots than can be achieved using existing techniques.

The first and second quantum dots may be of any composition suitable for forming hybrid perovskite quantum dots. In some embodiments, the first composition and the second composition independently comprise, consist or consist essentially of a compound of formula I:

$$AMX_3 \qquad (I)$$

wherein:
A is an alkali metal cation, $CH_3NH_3^+$ or $NH_2CH\!=\!NH_2^+$;
M is a metal cation; and
each X is independently a halide;
wherein the second composition is a composition other than the first composition.

The first and second quantum dots may also be referred to as independently being formed of a compound of formula I, or represented by formula I.

In some embodiments, A is selected from the group consisting of $Li^+$, $K^+$, $Rb^+$, $Cs^+$, $CH_3NH_3^+$, and $NH_2CH\!=\!NH_2^+$ (FA); especially $Cs^+$, $CH_3NH_3^+$ or $NH_2CH\!=\!NH_2^+$; most especially $Cs^+$ or $NH_2CH\!=\!NH_2^+$. In preferred embodiments, A in the first composition is other than A of the second composition. In particular embodiments, A is $Cs^+$ in the first composition, and A is $NH_2CH\!=\!NH_2^+$ in the second composition.

In some embodiments, M is selected from the group consisting of Sb, Mn, Cu, Pb, Sn, Bi and Ge cations; especially a Pb or Sn cation; most especially a Pb cation. In some embodiments M is a divalent metal cation; especially $Pb^{2+}$, $Sn^{2+}$, $Bi^{2+}$ or $Ge^{2+}$; most especially $Pb^{2+}$ or $Sn^{2+}$; even more especially $Pb^{2+}$. In preferred embodiments, M is the same in the first and second compositions. In particular embodiments, M is $Pb^{2+}$ in the first and second compositions.

In some embodiments, each X is independently selected from the group consisting of $I^-$, $Cl^-$, $Br^-$ and $F^-$; especially $I^-$, $Cl^-$ or $Br^-$; most especially $I^-$. In preferred embodiments, each instance of X is the same in the first and second compositions. In particular embodiments, each instance of X is $I^-$ in the first and second compositions.

In some embodiments, the first and second quantum dot compositions are selected from the group consisting of $CH_3NH_3PbI_3$, $CsSnI_3$, $FAPbI_3$ and $CsPbI_3$.

In some embodiments, the first composition is inorganic and the second composition is organic. In preferred embodiments, the first composition is $CsPbI_3$ and the second composition is $FAPbI_3$.

In some embodiments, the first and second quantum dots may themselves be hybrid quantum dots, such as $CsPb_zSn_{1-z}I_3$, wherein z is a value between 0 and 1. In such embodiments, the formulae for the composition of the first and second quantum dots and the hybrid perovskite quantum dots (formulas I and II) will be altered accordingly.

There is also provided a process for preparing hybrid perovskite quantum dots, the process comprising, consisting or consisting essentially of the steps of: providing first quantum dots comprising a first surface ligand; providing second quantum dots comprising a second surface ligand; and preparing a solution comprising the first and second quantum dots so that the first and second quantum dots undergo ligand-mediated cation exchange to form hybrid perovskite quantum dots; wherein the first and second quantum dots independently comprise a compound of formula I:

$$AMX_3 \qquad (I)$$

wherein:
A is an alkali metal cation, $CH_3NH_3^+$ or $NH_2CH\!=\!NH_2^+$;
M is a metal cation; and
each X is independently a halide;
wherein the molar ratio of the compound of formula I in the first quantum dots to the first surface ligand is in the range of from 1:2 to 1:25, and the molar ratio of the compound of formula I in the second quantum dots to the second surface ligand is in the range of from 1:3 to 1:30.

In another aspect, there is provided a process for preparing hybrid perovskite quantum dots, the process comprising, consisting or consisting essentially of: preparing a solution comprising first quantum dots comprising a first surface ligand and second quantum dots comprising a second surface ligand so that the first and second quantum dots undergo ligand-mediated cation exchange to form hybrid perovskite quantum dots; wherein the first and second quantum dots independently comprise a compound of formula I; wherein the molar ratio of the compound of formula I in the first quantum dots to the first surface ligand is in the range of from 1:2 to 1:25, and the molar ratio of the compound of formula I in the second quantum dots to the second surface ligand is in the range of from 1:3 to 1:30.

In particular embodiments of any one of the above aspects, the second quantum dots are other than the first quantum dots. Suitable embodiments of the compound of formula I, the first and second quantum dots, the hybrid quantum dots and the first and second surface ligands are as described herein.

In particular embodiments of any one of the above aspects, a molar ratio of the compound of formula I in the first quantum dots to the first surface ligand is in the range of from 1:2 to 1:25, 1:2.1 to 1:20, 1:2.2 to 1:14, 1:2.3 to 1:10, 1:2.4 to 1:7, 1:2.5 to 1:5.5, or 1:3.5 to 1:4.5 (and all integers therebetween); especially from 1:2.5 to 1:5.5 (and all integers therebetween); most especially about 1:2.5, 1:3, 1:3.5, 1:4, 1:4.5, 1:5 or 1:5.5. In such embodiments, the amount of the first surface ligand is the first target amount.

In particular embodiments of any one of the above aspects, a molar ratio of the compound of formula I in the second quantum dots to the second surface ligand is in the range of from 1:3 to 1:30, 1:5 to 1:29, 1:6 to 1:28, 1:7 to 1:27, 1:8 to 1:26, 1:9 to 1:25, 1:10 to 1:24, 1:11 to 1:23 (and all integers therebetween); especially 1:9 to 1:25 (and all integers therebetween); most especially about 1:9, 1:10, 1:11, 1:12, 1:13, 1:14, 1:15, 1:16, 1:17, 1:18, 1:19, 1:20, 1:21, 1:22, 1:23, 1:24 or 1:25. In some embodiments, a molar ratio of the compound of formula I in the second quantum dots to the second surface ligand is in the range of from 1:3 to 1:21, 1:4 to 1:20, 1:5 to 1:19, 1:6 to 1:18, 1:7 to 1:17, 1:8 to 1:16; 1:9 to 1:15; 1:10 to 1:14; 1:11 to 1:13 (and all integers therebetween); especially 1:9 to 1:15 (and all integers therebetween); most especially about 1:9, 1:10, 1:11, 1:12, 1:13, 1:14, 1:15. In such embodiments, the amount of the second surface ligand is the second target amount.

The molar ratios may alternatively be referred to herein as the molar ratio of M in the first or second quantum dots to the first and/or second surface ligands.

The invention also provides a process for preparing hybrid perovskite quantum dots having a defined composition, comprising: preparing first quantum dots having a first composition and comprising a first surface ligand at a first target amount; preparing second quantum dots having a second composition and comprising a second surface ligand at a second target amount; and preparing a solution comprising a ratio of the first and second quantum dots so that the first and second quantum dots undergo ligand-mediated cation exchange to form hybrid quantum dots having a composition defined by the first and second compositions and the ratio.

2.1 First Quantum Dots

The first quantum dots may be any quantum dots which are suitable for formation of hybrid perovskite quantum dots, and their composition (i.e. the first composition) will be dependent on the desired composition of the hybrid quantum dots. In particular embodiments, the first quantum dots are perovskite quantum dots.

The first target amount is an amount of the first surface ligand suitable for maintaining the stability of the first quantum dots and facilitating efficient ligand-mediated cation exchange. In some embodiments, the first target amount is an amount relative to the amount of the compound of formula I in the first quantum dots. In particular embodiments, a molar ratio of the compound of formula I in the first quantum dots to the first surface ligand at the first target amount is in the range of from 1:2 to 1:25, 1:2.1 to 1:20, 1:2.2 to 1:14, 1:2.3 to 1:10, 1:2.4 to 1:7, 1:2.5 to 1:5.5, or 1:3.5 to 1:4.5 (and all integers therebetween); especially from 1:2.5 to 1:5.5 (and all integers therebetween); most especially about 1:2.5, 1:3, 1:3.5, 1:4, 1:4.5, 1:5 or 1:5.5.

Without wishing to be bound by theory, it is thought that the speed of the cation exchange between the first and second quantum dots is limited by the amount of the surface ligand present during cation exchange. The presence of the first surface ligand at the first target amount is thought to maximise the efficiency of the cation exchange between the first and second quantum dots whilst not having detrimental effects on the stability and quality of the resulting hybrid quantum dots.

The first quantum dots may be synthesised with the first surface ligand at the first target amount. In such embodiments, the quantum dots are not purified or partially purified prior to the step of preparing the solution comprising the ratio of the first and second quantum dots. In alternative embodiments, the first quantum dots are synthesised with a first surface ligand at a first amount and are at least partially purified to reduce the amount of the first surface ligand to the first target amount. In particular embodiments, the first quantum dots are subjected to a single purification or partial purification step.

The first amount is the amount of the first surface ligand bound to the first quantum dots following synthesis. In some embodiments, the first amount is the amount of the first surface ligand in the product solution following reaction of precursor compounds to form the first quantum dots. A skilled person will appreciate that the first amount will depend on the quantity of the surface ligand present during synthesis of the quantum dots and will be well aware of suitable quantities of surface ligands for synthesis of the quantum dots, which will depend on the particular synthetic route used.

In some embodiments, a molar ratio of the compound of formula I in the first quantum dots to the first surface ligand at the first amount is in the range of from 1:20 to 1:45, 1:21 to 1:44, 1:22 to 1:43, 1:23 to 1:42, 1:24 to 1:41, 1:25 to 1:40, 1:26 to 1:39, 1:27 to 1:38, 1:28 to 1:37, 1:29 to 1:36 or 1:30 to 1:35 (and all integers therebetween); especially from 1:25 to 1:40 (and all integers therebetween); most especially about 1:25, 1:26, 1:27, 1:28, 1:29, 1:30, 1:31, 1:32, 1:33, 1:34, 1:35, 1:36, 1:37, 1:38, 1:39 or 1:40.

The first target amount and first amount may be expressed in amounts relative to each other. In particular embodiments, a molar ratio of the first surface ligand at the first target amount to the first surface ligand at the first amount is in the range of from 1:2 to 1:25, 1:2.5 to 1:23, 1:3 to 1:21, 1:3.5 to 1:19, 1:4 to 1:16, 1:4.5 to 1:14 or 1:5 to 1:12 (and all integers therebetween); especially from 1:4 to 1:16 (and all integers therebetween); most especially about 1:4, 1:5, 1:6, 1:7, 1:8, 1:9, 1:10, 1:11, 1:12, 1:13, 1:14, 1:15 or 1:16.

In preferred embodiments, the first quantum dots are synthesised with a first surface ligand at a first amount and are at least partially purified to reduce the amount of the first surface ligand to the first target amount. In this regard, in some embodiments, the process of the invention comprises preparing the first quantum dots using a process comprising, consisting or consisting essentially of the steps of: preparing a first product solution comprising the first quantum dots comprising the first surface ligand at the first amount; and at least partially purifying the first quantum dots to create a first solution comprising the first quantum dots comprising the first surface ligand at the first target amount.

In particular embodiments, the first quantum dots are not further purified prior to the step of preparing the solution comprising the ratio of the first and second quantum dots.

Without wishing to be bound by theory, it is thought that the use of a single purification step results in first quantum dots comprising the first surface ligand at the first target amount. Repeating the purification step is thought to result in first quantum dots with an amount of first surface ligand less than the first target amount, which may result in inefficient cation exchange during preparation of the hybrid quantum dots and resulting hybrid quantum dots with a lower stability.

A skilled person will be well aware of processes suitable for at least partially purifying the first quantum dots. For example, suitable processes include, but are not limited to, precipitation, extraction such as liquid-liquid extraction, electrophoresis, and size-based separation including ultracentrifugation, ultrafiltration, diafiltration and size-exclusion chromatography. Suitable processes are further discussed in Shen et al. (2017) *Chem Commun,* 53: 827-841, the entire content of which is incorporated herein.

In some embodiments, the first quantum dots are partially purified by precipitation. In this regard, in some embodiments the process of the invention comprises at least partially purifying the first quantum dots using a process comprising, consisting or consisting essentially of the steps of: precipitating the first quantum dots from the first product solution; separating the precipitate from the first product solution; and dispersing the precipitate in a first solvent to form the first solution.

The first quantum dots may be precipitated from the first product solution by adding a solvent which causes precipitation or flocculation of the quantum dots. A skilled person will readily be able to identify a suitable solvent. In some embodiments, the solvent is an anti-solvent. In some embodiments, the first quantum dots are precipitated from the first product solution by adding a solvent selected from the group consisting of methanol, ethanol, acetone, methyl acetate, ethyl acetate, propanol, pentanol, acetonitrile and combinations thereof; especially methyl acetate.

The precipitate may be dispersed in any solvent capable of dispersing the precipitated quantum dots. A skilled person will be well aware of such solvents. In some embodiments, the first solvent is selected from the group consisting of toluene, chloroform, isooctane, pentane, heptane, cyclohexane, benzene, hexane and combinations thereof; especially hexane. In some embodiments, the first solvent is selected from the group consisting of toluene, chloroform, isooctane, pentane, heptane, cyclohexane, benzene, hexane, octane and combinations thereof; especially hexane, toluene and octane; most especially hexane.

In particular embodiments, the precipitate is separated from the first product solution by centrifuging the first product solution and discarding the liquid.

In some embodiments, the first quantum dots having a first composition and a first surface ligand at a first target amount are in a solution. In some embodiments, the solution is the first solution. In these embodiments, the first target amount may be a concentration in the range of from 0.01 g/mL to 0.5 g/mL, 0.02 g/mL to 0.4 g/mL, 0.03 g/mL to 0.3 g/mL, 0.04 g/mL to 0.2 g/mL or 0.05 g/mL to 0.1 g/mL (and all integers therebetween); especially 0.05 g/mL to 0.1 g/mL (and all integers therebetween); most especially about 0.05 g/mL, 0.06 g/mL, 0.07 g/mL, 0.08 g/mL, 0.09 g/mL or 0.1 g/mL. In such embodiments, the first quantum dots may be at a concentration of 0.05 g/mL.

In some embodiments, the first quantum dots comprising the first surface ligand at the first amount are in solution, particularly in the first product solution. In such embodiments, the first amount may be a concentration in the range of from 0.1 g/mL to 0.9 g/mL, 0.2 g/mL to 0.85 g/mL, 0.3 g/mL to 0.8 g/mL, 0.4 g/mL to 0.75 g/mL, 0.5 g/mL to 0.7 g/mL or 0.55 g/mL to 0.65 g/mL (and all integers therebetween); especially from 0.5 g/mL to 0.7 g/mL (and all integers therebetween); most especially about 0.55 g/mL, 0.56 g/mL, 0.57 g/mL, 0.58 g/mL, 0.59 g/mL, 0.6 g/mL, 0.61 g/mL, 0.62 g/mL, 0.63 g/mL, 0.64 g/mL or 0.65 g/mL. In such embodiments, the first quantum dots may be at a concentration of 0.05 g/mL.

The first quantum dots may be synthesised using procedures standard in the art and the synthetic route will depend on the first composition. For example, the first quantum dots may be synthesised using the process described in Protesescu et al. (2017) *ACS Nano,* 11: 3119-3134; Hazarika et al. (2018) *ACS Nano,* 12: 10327-10337; Swarnkar et al. (2016) *Science,* 354(6308): 92-95; Protesescu et al. (2015) *Nano Letters,* 15: 3692-3696; Lorenzon et al. (2017) *Nano Letters,* 17: 3844-3853; Sanehira et al. (2017) *Science Advances,* 3: eaao4204; US 2017/0233645 A1; and/or Xue et al. (2018) *Joule,* 2: 1866-1878.

For example, first quantum dots may be synthesised by preparing a reaction solution comprising a first precursor including an alkali metal cation, $CH_3NH_3^+$ or $NH_2CH=NH_2^+$ (A in formula I), and a second precursor including a metal cation (M in formula I) and a halide (X in formula I); and carrying out a reaction between the first and second precursors to form the first quantum dots (first product solution). The preparation of the reaction solution may further comprise mixing the first precursor, second precursor or combination thereof with a solvent, such as 1-octadecene. The reaction solution further comprises a first surface ligand, examples of which are described herein, and include oleic acid.

In preferred embodiments, the first precursor is prepared by mixing a compound comprising alkali metal cation, $CH_3NH_3^+$ or $NH_2CH=NH_2^+$ (A in formula I), such as an alkali metal carbonate (e.g. $Cs_2CO_3$), with the first surface ligand (e.g. oleic acid) in a solvent (e.g. 1-octadecene) to form the first precursor (e.g. an alkali metal carboxylate, such as Cs-oleate). The first precursor is optionally heated and injected into a heated solution comprising the second precursor (e.g. a metal halide ($MX_2$), such as $PbI_2$) in a solvent (e.g. 1-octadecene) to form the reaction solution, and a reaction is carried out between the first and second precursors to form the quantum dots (first product solution). The reaction may be carried out at a predetermined temperature, such as a temperature of greater than about 70° C. (e.g. a temperature in the range of from about 70° C. to about 200° C.). The first quantum dots may be at least partially purified from the first product solution using the methods described supra, e.g. precipitation.

As a further example, first quantum dots may be synthesised by preparing a reaction solution comprising a first precursor including an alkali metal cation, $CH_3NH_3^+$ or $NH_2CH=NH_2^+$ (A in formula I), a second precursor including a metal cation (M in formula I), and a third precursor including a halide (X in formula I); and carrying out a reaction between the first, second and third precursors to form the first quantum dots (first product solution). The preparation of the reaction solution may further comprise mixing the first precursor, second precursor, third precursor or combination thereof with a solvent, such as 1-octadecene. The reaction solution further comprises a first surface ligand, examples of which are described herein, and include oleic acid.

In preferred embodiments, the first precursor (e.g. a compound comprising $NH_2CH=NH_2^+$, such as formamidinium acetate), second precursor (e.g. a metal acetate, such as lead acetate trihydrate) and first surface ligand (e.g. oleic acid) are mixed in a solvent (e.g. 1-octadecene) at elevated temperature (e.g. 50 to 100° C.) to form a reaction solution. A solution comprising the third precursor (e.g. an alkenylammonium halide such as oleylammonium iodide) in a solvent (e.g. an organic solvent such as toluene) is injected into the reaction solution, and a reaction is carried out to form the first quantum dots (first product solution). The reaction may be carried out at a predetermined temperature, such as a temperature of greater than about 50° C. (e.g. a temperature in the range of from about 50° C. to about 150° C.). The first quantum dots may be at least partially purified from the first product solution using the methods described supra, e.g. precipitation.

The processes of the invention, in some embodiments, involve determining the concentration of the quantum dots, surface ligands and ratios therebetween. A skilled person will be well aware of suitable procedures for determining the concentration and ratios. For example, a sample of a specific volume may be removed from the solution in which the concentration of the quantum dots and/or surface ligand is required to be determined; the quantum dots may be separated from the surface ligand in the sample using a purification procedure, such as any one of the processes described supra; the quantum dots may be dried (e.g. using evaporation, such as in an oven under vacuum at, e.g., 50° C.), and surface ligand may be dried (e.g. using evaporation, such as a rotary evaporator); each may be weighed; and the concentration in the sample may be calculated, from which ratios can be obtained.

The molar ratios of the compound of formula I in the quantum dots and surface ligands discussed herein may be determined using procedures routine in the art. For example, the number of moles or molar concentration of the compound of formula I in the quantum dots may be determined using spectroscopy, such as atomic absorption spectroscopy or atomic emission spectroscopy, and deducing the results from the result for, for example, M in formula I (such as Pb in $CsPbI_3$). The molar concentration of the surface ligand may readily be determined using standard procedures in the art of which a skilled person will be well aware and may be calculated from the weight of the surface ligand as obtained above. Ratios may then be calculated.

2.2 Second Quantum Dots

The second quantum dots may be any quantum dots which are suitable for formation of hybrid perovskite quantum dots, and their composition (i.e. the second composition) will be dependent on the desired composition of the hybrid quantum dots. In particular embodiments, the second quantum dots are perovskite quantum dots.

The second target amount is an amount of the second surface ligand suitable for maintaining the stability of the second quantum dots and facilitating efficient ligand-mediated cation exchange. In some embodiments, the second target amount is an amount relative to the amount of the compound of formula I in the second quantum dots. In particular embodiments, a molar ratio of the compound of formula I in the second quantum dots to the second surface ligand at the second target amount is in the range of from 1:3 to 1:30, 1:5 to 1:29, 1:6 to 1:28, 1:7 to 1:27, 1:8 to 1:26, 1:9 to 1:25, 1:10 to 1:24, 1:11 to 1:23 (and all integers therebetween); especially 1:9 to 1:25 (and all integers therebetween); most especially about 1:9, 1:10, 1:11, 1:12, 1:13, 1:14, 1:15, 1:16, 1:17, 1:18, 1:19, 1:20, 1:21, 1:22, 1:23, 1:24 or 1:25. In some embodiments, a molar ratio of the compound of formula I in the second quantum dots to the second surface ligand at the second target amount is in the range of from 1:3 to 1:21, 1:4 to 1:20, 1:5 to 1:19, 1:6 to 1:18, 1:7 to 1:17, 1:8 to 1:16; 1:9 to 1:15; 1:10 to 1:14; 1:11 to 1:13 (and all integers therebetween); especially 1:9 to 1:15 (and all integers therebetween); most especially about 1:9, 1:10, 1:11, 1:12, 1:13, 1:14, 1:15.

Without wishing to be bound by theory, the presence of the second surface ligand at the second target amount is thought to maximise the efficiency of the cation exchange between the first and second quantum dots whilst not having detrimental effects on the stability and quality of the resulting hybrid quantum dots.

The second quantum dots may be synthesised with the second surface ligand at the second target amount. In such embodiments, the quantum dots are not purified or partially purified prior to the step of preparing the solution comprising the ratio of the first and second quantum dots. In alternative embodiments, the second quantum dots are synthesised with a second surface ligand at a second amount and are at least partially purified to reduce the amount of the second surface ligand to the second target amount. In particular embodiments, the second quantum dots are subjected to a single purification or partial purification step.

The second amount is the amount of the second surface ligand bound to the second quantum dots following synthesis. In some embodiments, the second amount is the amount of the second surface ligand in the product solution following reaction of precursor compounds to form the second quantum dots. A skilled person will appreciate that the second amount will depend on the quantity of the surface ligand present during synthesis of the quantum dots and will be well aware of suitable quantities of surface ligands for synthesis of the quantum dots, which will depend on the particular synthetic route used.

In some embodiments, a molar ratio of the compound of formula I in the second quantum dots to the second surface ligand at the second amount is in the range of from 1:15 to 1:40, 1:16 to 1:39, 1:17 to 1:38, 1:18 to 1:37, 1:19 to 1:36, 1:20 to 1:35, 1:21 to 1:34, 1:22 to 1:33, 1:23 to 1:32, 1:24 to 1:31 or 1:25 to 1:30; especially 1:20 to 1:35 (and all integers therebetween); most especially about 1:20, 1:21, 1:22, 1:23, 1:24, 1:25, 1:26, 1:27, 1:28, 1:29, 1:30, 1:31, 1:32, 1:33, 1:34 or 1:35.

The second target amount and second amount may be expressed in amounts relative to each other. In particular embodiments, a molar ratio of the second surface ligand at the second target amount to the second surface ligand at the second amount is in the range of from 1:1.2 to 1:15, 1:1.3 to 1:10, 1:1.4 to 1:7, 1:1.5 to 1:4, 1:2 to 1:3.5 or 1:2.5 to 1:3 (and all integers therebetween); especially 1:1.5 to 1:4 (and all integers therebetween); most especially about 1:1.5, 1:2, 1:2.5, 1:3, 1:3.5 or 1:4.

In preferred embodiments, the second quantum dots are synthesised with a second surface ligand at a second amount and are at least partially purified to reduce the amount of the second surface ligand to the second target amount. In this regard, in some embodiments, the process of the invention comprises preparing the second quantum dots using a process comprising, consisting or consisting essentially of the steps of: preparing a second product solution comprising the second quantum dots comprising the second surface ligand at the second amount; and at least partially purifying the second quantum dots to create a second solution comprising the second quantum dots comprising the second surface ligand at the second target amount.

In particular embodiments, the second quantum dots are not further purified prior to the step of preparing the solution comprising the ratio of the first and second quantum dots.

Without wishing to be bound by theory, it is thought that the use of a single purification step results in second quantum dots comprising the second surface ligand at the second target amount. Repeating the purification step is thought to result in second quantum dots with an amount of second surface ligand less than the second target amount, which may result in inefficient cation exchange during preparation of the hybrid quantum dots and resulting hybrid quantum dots with a lower stability.

A skilled person will be well aware of processes suitable for at least partially purifying the second quantum dots. Suitable processes are as discussed in relation to the first quantum dots discussed supra.

In some embodiments, the second quantum dots are partially purified by precipitation. In this regard, in some embodiments, the process of the invention further comprises at least partially purifying the second quantum dots using a process comprising, consisting or consisting essentially of the steps of: precipitating the second quantum dots from the second product solution; separating the precipitate from the second product solution; and dispersing the precipitate in a second solvent to form the second solution.

The second quantum dots may be precipitated from the second product solution by adding a solvent which causes precipitation or flocculation of the second quantum dots. A skilled person will readily be able to identify a suitable solvent. In some embodiments, the solvent is an anti-solvent. In some embodiments, the second quantum dots are precipitated from the second product solution by adding a solvent selected from the group consisting of methanol, ethanol, acetone, methyl acetate, ethyl acetate, propanol, pentanol, acetonitrile and combinations thereof; especially methyl acetate.

The precipitate may be dispersed in any solvent capable of dispersing the precipitated quantum dots. A skilled person will be well aware of such solvents. In some embodiments, the second solvent is selected from the group consisting of toluene, chloroform, isooctane, pentane, heptane, cyclohexane, benzene, hexane and combinations thereof; especially hexane. In some embodiments, the second solvent is selected from the group consisting of toluene, chloroform, isooctane, pentane, heptane, cyclohexane, benzene, hexane, octane and combinations thereof; especially hexane, toluene and octane; most especially hexane.

In particular embodiments, the precipitate is separated from the second product solution by centrifuging the second product solution and discarding the liquid.

In some embodiments, the second quantum dots having a second composition and a second surface ligand at a second target amount are in a solution. In some embodiments, the solution is the second solution. In these embodiments, the second target amount may be a concentration in the range of from 0.05 g/mL to 0.7 g/mL, 0.09 g/mL to 0.65 g/mL, 0.13 g/mL to 0.6 g/mL, 0.17 g/mL to 0.55 g/mL or 0.2 g/mL to 0.5 g/mL (and all integers therebetween); especially 0.2 g/mL to 0.5 g/mL (and all integers therebetween); most especially about 0.2 g/mL, 0.25 g/mL, 0.3 g/mL, 0.35 g/mL, 0.4 g/mL, 0.45 g/mL or 0.5 g/mL. In such embodiments, the second quantum dots may be at a concentration of 0.05 g/mL.

In some embodiments, the second quantum dots comprising the second surface ligand at the second amount are in a solution, particularly in the second product solution. In such embodiments, the second amount may be a concentration in the range of from 0.1 g/mL to 0.9 g/mL, 0.2 g/mL to 0.85 g/mL, 0.3 g/mL to 0.8 g/mL, 0.4 g/mL to 0.75 g/mL, 0.5 g/mL to 0.7 g/mL or 0.55 g/mL to 0.65 g/mL (and all integers therebetween); especially from 0.5 g/mL to 0.7 g/mL (and all integers therebetween); especially about 0.55 g/mL, 0.56 g/mL, 0.57 g/mL, 0.58 g/mL, 0.59 g/mL, 0.6 g/mL, 0.61 g/mL, 0.62 g/mL, 0.63 g/mL, 0.64 g/mL or 0.65 g/mL. In such embodiments, the second quantum dots may be at a concentration of 0.05 g/mL.

The second quantum dots may be synthesised using procedures standard in the art and the synthetic route will depend on the second composition. For example, the second quantum dots may be synthesised using the process described in Protesescu et al. (2017) *ACS Nano*, 11: 3119-3134; Hazarika et al. (2018) *ACS Nano*, 12: 10327-10337; Swarnkar et al. (2016) *Science*, 354(6308): 92-95; Protesescu et al. (2015) *Nano Letters*, 15: 3692-3696; Lorenzon et al. (2017) *Nano Letters*, 17: 3844-3853; Sanehira et al. (2017) *Science Advances*, 3: eaao4204; and/or Xue et al. (2018) *Joule*, 2: 1866-1878. Suitable procedures for the synthesis of the second quantum dots, and for calculating amounts and ratios of the second quantum dots and surface ligands are as described supra for the first quantum dots, wherein the first quantum dots, first surface ligand and first product solution are replaced by the second quantum dots, second surface ligand and second product solution, respectively.

2.3 Surface Ligand

The surface ligand may be any compound which is capable of binding to the surface of the quantum dot. The first and second surface ligands may be the same or different. In some embodiments, the first and second surface ligands are the same. In particular embodiments, the surface ligand is a compound which is capable of facilitating cation exchange.

In some embodiments, the first and second surface ligands are independently selected from the group consisting of an amine selected from the group consisting of optionally substituted alkyl amine, optionally substituted alkenyl amine, optionally substituted aralkyl amine and optionally substituted aryl amine; a phosphine selected from the group consisting of optionally substituted trialkyl phosphine, optionally substituted alkyl phosphine, optionally substituted alkenyl phosphine, optionally substituted aryl phosphine, optionally substituted triaryl phosphine and optionally substituted aralkyl phosphine; an alkali metal cation; an acid selected from the group consisting of optionally substituted alkyl carboxylic acid, optionally substituted alkenyl carboxylic acid, optionally substituted aralkyl carboxylic acid and optionally substituted aryl carboxylic acid; a halide or a pseudo halide; a thiol selected from the group consisting of optionally substituted alkyl thiol, optionally substituted alkenyl thiol, optionally substituted aryl thiol and optionally substituted cycloalkyl thiol; and combinations thereof.

In some embodiments, the amine is selected from the group consisting of optionally substituted $C_{1-20}$alkyl amine, optionally substituted $C_{2-20}$alkenyl amine, optionally substituted $C_{4-8}$aryl $C_{1-20}$alkyl amine, optionally substituted $C_{4-8}$aryl amine, and combinations thereof. In particular embodiments, the amine is selected from the group consisting of optionally substituted $C_1$alkyl amine, optionally substituted $C_{18}$alkenyl amine, optionally substituted $C_6$aryl $C_1$alkyl amine and optionally substituted $C_6$aryl amine, and combinations thereof. In preferred embodiments, the amine is selected from the group consisting of oleylamine, benzylamine, formamidine, methylamine and combinations thereof; especially oleylamine.

In some embodiments, the phosphine is selected from the group consisting of optionally substituted tri $C_{1-20}$alkyl phosphine, optionally substituted $C_{1-20}$alkyl phosphine, optionally substituted $C_{2-20}$alkenyl phosphine, optionally substituted $C_{4-8}$aryl phosphine, optionally substituted tri $C_{4-8}$aryl phosphine, optionally substituted $C_{4-8}$aryl $C_{1-20}$alkyl phosphine, and combinations thereof. In particular embodiments, the phosphine is selected from the group consisting of optionally substituted tri $C_8$alkyl phosphine, optionally substituted $C_6$aryl $C_1$alkyl phosphine, optionally substituted tri $C_6$aryl phosphine, and combinations thereof. In preferred embodiments, the phosphine is selected from the group consisting of trioctylphosphine, benzyl phosphine, triphenylphosphine and combinations thereof.

In some embodiments, the alkali metal cation is selected from the group consisting of Cs$^+$, Rb$^+$, Fr$^+$, Li$^+$, Na$^+$ and K$^+$; especially Cs$^+$, Rb$^+$ or K$^+$.

In some embodiments, the acid is selected from the group consisting of optionally substituted C$_{1-20}$alkyl carboxylic acid, optionally substituted C$_{2-20}$alkenyl carboxylic acid, optionally substituted C$_{4-8}$aryl C$_{1-20}$alkyl carboxylic acid, optionally substituted C$_{4-8}$aryl carboxylic acid and combinations thereof. In particular embodiments the acid is selected from the group consisting of optionally substituted C$_{17}$alkenyl carboxylic acid, optionally substituted C$_6$aryl carboxylic acid, optionally substituted C$_1$alkyl carboxylic acid and combinations thereof. In preferred embodiments, the acid is selected from the group consisting of oleic acid, benzoic acid, acetic acid and combinations thereof; especially oleic acid.

In some embodiments, the surface ligand is a carboxylate, such as a optionally substituted C$_{1-20}$alkyl carboxylate, optionally substituted C$_{2-20}$alkenyl carboxylate, optionally substituted C$_{4-8}$aryl C$_{1-20}$alkyl carboxylate or optionally substituted C$_{4-8}$aryl carboxylate; including oleate, benzoate or acetate.

In some embodiments, the halide or pseudo halide is selected from the group consisting of I$^-$, Br$^-$, Cl$^-$, SCN$^-$ and combinations thereof.

In some embodiments, the thiol is selected from the group consisting of optionally substituted C$_{1-20}$ alkyl thiol, optionally substituted C$_{2-20}$ alkenyl thiol, optionally substituted C$_{4-8}$aryl thiol, optionally substituted C$_{4-8}$cycloalkyl thiol, and combinations thereof. In particular embodiments, the thiol is selected from the group consisting of optionally substituted C$_{2-6}$alkyl thiol, optionally substituted C$_6$cycloalkyl thiol and combinations thereof. In preferred embodiments, the thiol is selected from the group consisting of 1,2-ethanedithiol, 1-hexanethiol, cyclohexanethiol and combinations thereof.

Without wishing to be bound by theory, it is thought that surface ligands with greater than six carbon atoms in an alkyl, alkenyl, aryl or cycloalkyl chain will result in a greater speed of cation exchange between the first and second quantum dots.

Thus, in some embodiments, the first and second surface ligands are independently selected from the group consisting of: an amine selected from the group consisting of optionally substituted C$_{6-20}$alkyl amine, optionally substituted C$_{6-20}$alkenyl amine, optionally substituted C$_{6-8}$aryl C$_{1-20}$alkyl amine and optionally substituted C$_{6-8}$aryl amine; a phosphine selected from the group consisting of optionally substituted tri C$_{6-20}$alkyl phosphine, optionally substituted C$_{6-20}$alkyl phosphine, optionally substituted C$_{6-20}$alkenyl phosphine, optionally substituted C$_{6-8}$aryl phosphine, optionally substituted tri C$_{6-8}$aryl phosphine and optionally substituted C$_{6-8}$aryl C$_{1-20}$alkyl phosphine; an acid selected from the group consisting of optionally substituted C$_{6-20}$alkyl carboxylic acid, optionally substituted C$_{6-20}$alkenyl carboxylic acid, optionally substituted C$_{6-8}$aryl C$_{1-20}$alkyl carboxylic acid and optionally substituted C$_{6-8}$aryl carboxylic acid; a thiol selected from the group consisting of optionally substituted C$_{6-20}$alkyl thiol, optionally substituted C$_{6-20}$alkenyl thiol, optionally substituted C$_{6-8}$aryl thiol and optionally substituted C$_{6-8}$cycloalkyl thiol; and combinations thereof.

In particular embodiments, the amine is selected from the group consisting of optionally substituted C$_{18}$alkenyl amine, optionally substituted C$_6$aryl C$_1$alkyl amine, optionally substituted C$_6$aryl amine, and combinations thereof. In preferred embodiments, the amine is selected from the group consisting of oleylamine, benzylamine, and combinations thereof; especially oleylamine.

In particular embodiments, the phosphine is selected from the group consisting of optionally substituted tri C$_8$alkyl phosphine, optionally substituted C$_6$aryl C$_1$alkyl phosphine, optionally substituted tri C$_6$aryl phosphine, and combinations thereof. In preferred embodiments, the phosphine is selected from the group consisting of trioctylphosphine, benzyl phosphine, triphenylphosphine and combinations thereof.

In particular embodiments the acid is selected from the group consisting of optionally substituted C$_{17}$alkenyl carboxylic acid, optionally substituted C$_6$aryl carboxylic acid, and combinations thereof. In preferred embodiments, the acid is selected from the group consisting of oleic acid, benzoic acid, and combinations thereof; especially oleic acid.

In particular embodiments, the thiol is selected from the group consisting of optionally substituted C$_6$alkyl thiol, optionally substituted C$_6$ cycloalkyl thiol and combinations thereof. In preferred embodiments, the thiol is selected from the group consisting of 1-hexanethiol, cyclohexanethiol and combinations thereof.

In particular embodiments, the first and second surface ligands are acids, especially oleic acid.

The surface ligands may be optionally substituted by one or more optional substituents, preferably one or two optional substituents. Suitable optional substituents include, but are not limited to, C$_{1-20}$alkyl, C$_{2-20}$alkenyl, halogen, —OH, —COOH, —NH$_2$, —SH or C$_{4-8}$aryl.

The surface ligands may be prepared using standard procedures in the art. A skilled person will be well aware of such procedures. A number of the surface ligands are commercially available from a number of sources, including, for example, Sigma-Aldrich Co. LLC. For example, oleylamine, benzylamine, formamidine (in the form of formamidine acetate), methylamine, trioctylphosphine, triphenyl phosphine, cesium, rubidium, potassium, oleic acid, benzoic acid, acetic acid, thiocyanate, 1,2-ethanedithiol, 1-hexanethiol and cyclohexanethiol are commercially available from Sigma-Aldrich Co. LLC.

2.4 Hybrid Perovskite Quantum Dots

The hybrid quantum dots produced by the process of the invention may be any quantum dots formed by a mixture of a ratio of the first to the second quantum dots. The hybrid quantum dots have a defined composition that is determined by the first and second compositions, and the ratio of the first to the second quantum dots. Thus, the hybrid quantum dots comprise a compound of the formula AMX$_3$, wherein the quantum dots comprise a mixture of chemical elements represented by A, M or X. In preferred embodiments, the hybrid quantum dots comprise a mixture of chemical elements represented by A. In some embodiments, the hybrid quantum dots comprise a compound of formula II:

$$A^1_y A^2_{1-y} MX_3 \quad\quad\quad (II)$$

wherein:
A$^1$ is an alkali metal cation, CH$_3$NH$_3^+$ or NH$_2$CH=NH$_2^+$;
A$^2$ is an alkali metal cation, CH$_3$NH$_3^+$ or NH$_2$CH=NH$_2^+$;
M is a metal cation;
each X is independently a halide; and
y is a value in the range of from 0.1 to 0.9;
wherein A$^1$ is other than A$^2$.

The hybrid quantum dots may also be referred to as being formed of a compound of formula II, or represented by formula II.

Suitable alkali metal cations, metal cations and halides are as defined supra for a compound of formula I.

In particular embodiments, $A^1$ is $Cs^+$, $A^2$ is $NH_2CH=NH_2^+$, M is $Pb^{2+}$ and X is $I^-$.

Y is a value in the range of from 0.1 to 0.9 (and all integers therebetween) and is determined by the ratio of the first to the second quantum dots. In some embodiments, y is 0.1, 0.15, 0.2, 0.25, 0.3, 0.35, 0.4, 0.45, 0.5, 0.55, 0.6, 0.65, 0.7, 0.75, 0.8, 0.85 or 0.9. In particular embodiments, y is a value in the range of from 0.25 to 0.5; especially 0.25, 0.3, 0.35, 0.4, 0.45 or 0.5; most especially 0.5.

In particular embodiments, the hybrid perovskite quantum dots have the formula $Cs_yFA_{1-y}PbI_3$, wherein y is as defined above.

In some embodiments, the ratio of the first quantum dots to the second quantum dots is in the range of from 1:9 to 9:1, 1:8 to 8:1, 1:7 to 7:1, 1:6 to 6:1, 1:5 to 5:1, 1:4 to 4:1, 1:3 to 3:1 or 1:2 to 2:1 (and all integers therebetween); especially about 1:9, 1:8, 1:7, 1:6, 1:5, 1:4, 1:3, 1:2, 1:1, 2:1, 3:1, 4:1. 5:1. 6:1, 7:1, 8:1 or 9:1; most especially about 1:1. In particular embodiments, the ratio of the first to the second quantum dots is a molar ratio of the quantum dots. In alternative embodiments, the ratio of the first to the second quantum dots is a ratio of the concentration of the quantum dots.

The process of the invention involves preparing a solution comprising a ratio of the first and second quantum dots so that the first and second quantum dots undergo ligand-mediated cation exchange to form hybrid quantum dots. In some embodiments, this involves combining the first and second solutions.

A skilled person will be well aware of suitable conditions for conducting ligand-mediated cation exchange. In some embodiments, ligand-mediated cation exchange is conducted under ambient conditions. The solution may be mixed for a period of time sufficient for completion of cation exchange and formation of the hybrid quantum dots, such as a period in the range of from 10 minutes to 16 hours, 12 minutes to 10 hours, 15 minutes to 4 hours, 20 minutes to 2 hours, 25 minutes to 1 hour (and all integers therebetween); especially about 15 minutes, 20 minutes, 25 minutes, 30 minutes, 35 minutes, 40 minutes, 45 minutes, 50 minutes, 55 minutes or 1 hour; most especially about 30 minutes.

The solution comprising a ratio of the first and second dots may comprise any solvent suitable for the first and second quantum dots to undergo ligand-mediated cation exchange. A skilled person will be well aware of such solvents. For example, suitable solvents include, but are not limited to, toluene, chloroform, isooctane, pentane, heptane, cyclohexane, benzene, hexane and combinations thereof; especially hexane. In some embodiments, the solvent is selected from the group consisting of toluene, chloroform, isooctane, pentane, heptane, cyclohexane, benzene, hexane, octane and combinations thereof; especially hexane, toluene and octane; most especially hexane. The quantum dots may be in any concentration suitable for efficient cation exchange. A skilled person will readily be able to determine such amounts. In some embodiments, the quantum dots are in a concentration in the range of from about 0.01 to 0.1 g/mL, such as about 0.05 g/mL.

Following cation exchange, the hybrid quantum dots may be at least partially purified, for example, to reduce the amount of the first and second surface ligand from a third amount following synthesis to a third target amount. In this regard, in some embodiments, the process of the invention further comprises at least partially purifying the hybrid quantum dots to create a third solution comprising the hybrid quantum dots comprising the first and second surface ligand at a third target amount. In particular embodiments, the first and second surface ligands are the same.

Without wishing to be bound by theory, the third target amount is the amount of surface ligand that does not result in significant degradation of the hybrid quantum dots.

Suitable processes for purification of the hybrid quantum dots are as described supra for the first and second quantum dots. In preferred embodiments, the hybrid quantum dots are purified by precipitation. Thus, in some embodiments, the process further comprises at least partially purifying the hybrid quantum dots using a process comprising precipitating the hybrid quantum dots; separating the precipitate; and dispersing the precipitate in a third solvent to form a third solution.

This process may be repeated to further purify the hybrid quantum dots.

The hybrid quantum dots may be precipitated by adding a solvent which causes precipitation or flocculation of the quantum dots. A skilled person will readily be able to identify a suitable solvent. In some embodiments, the solvent is an anti-solvent.

In some embodiments, the hybrid quantum dots are precipitated by adding a solvent selected from the group consisting of methanol, ethanol, acetone, methyl acetate, ethyl acetate, propanol, pentanol, acetonitrile and combinations thereof; especially ethyl acetate. In some embodiments, the solvent further comprises a ligand. In particular embodiments, the ligand is selected from the surface ligands described supra for the first and second surface ligands. In some embodiments, the ligand is formamidinium iodide.

The precipitate may be dispersed in any solvent capable of dispersing the precipitated hybrid quantum dots. A skilled person will be well aware of such solvents. In some embodiments, the third solvent is selected from the group consisting of toluene, chloroform, isooctane, pentane, heptane, cyclohexane, benzene, hexane and combinations thereof; especially hexane. In some embodiments, the third solvent is selected from the group consisting of toluene, chloroform, isooctane, pentane, heptane, cyclohexane, benzene, hexane, octane and combinations thereof; especially hexane and octane; most especially hexane.

In particular embodiments, the precipitate is separated by centrifuging the solution and discarding the liquid.

In some embodiments, the molar ratio of the compound of formula II in the hybrid quantum dots to the surface ligand at the third amount is in the range of from 1:0.5 to 1:8, 1:0.75 to 1:7, 1:1 to 1:5.5, 1:1.5 to 1:5 (and all integers therebetween); especially 1:1 to 1:5.5 (and all integers therebetween); most especially about 1:1, 1:1.5, 1:2, 1:2.5, 1:3, 1:3.5, 1:4, 1:4.5, 1:5 or 1:5.5.

In some embodiments, the third amount of the surface ligand is a concentration in the range of from 0.01 g/mL to 0.25 g/mL, 0.015 g/mL to 0.20 g/mL or 0.02 g/mL to 0.12 g/mL (and all integers therebetween); especially 0.02 g/mL to 0.12 g/mL (and all integers therebetween); most especially about 0.02, 0.03, 0.04, 0.05, 0.06, 0.07, 0.08, 0.09, 0.1, 0.11 or 0.12 g/mL.

In some embodiments, the molar ratio of the compound of formula II in the hybrid quantum dots to the surface ligand at the third target amount is in the range of from 1:0.05 to 1:1, 1:0.075 to 1:0.75, 1:0.1 to 1:0.5 (and all integers therebetween); especially 1:0.1 to 1:0.5 (and all integers therebetween); most especially about 1:0.1, 1:0.15, 1:0.2, 1:0.25, 1:0.3, 1:0.35, 1:0.4, 1:0.45 or 1:0.5.

In some embodiments, the third target amount of the surface ligand is a concentration in the range of from 0.002 g/mL to 0.05 g/mL, 0.003 g/mL to 0.04 g/mL, 0.004 g/mL to 0.03 g/mL or 0.005 g/mL to 0.02 g/mL (and all integers therebetween); especially 0.005 g/mL to 0.02 g/mL (and all integers therebetween); most especially about 0.005, 0.008, 0.01, 0.012, 0.014, 0.016, 0.018 or 0.02 g/mL. In such embodiments, the hybrid quantum dots may be at a concentration of 0.05 g/mL.

While the hybrid perovskite quantum dots may be used following purification, in some embodiments, a third surface ligand may be added to the hybrid perovskite quantum dots following purification. Without wishing to be bound by theory, ligands with shorter carbon chains (i.e. less than 6 carbon atoms) are thought to reduce the space between quantum dots when used in films or agglomerates which is likely to improve charge transport of the film or agglomerate. Thus, if the first and/or second surface ligands possess longer carbon chains, the third target amount of the surface ligand may be minimised and a third surface ligand with a lower number of carbon atoms may be added.

In such embodiments, the third surface ligand may be selected from the group consisting of optionally substituted $C_{1-5}$alkyl amine, optionally substituted $C_{2-5}$ alkenyl amine; a phosphine selected from the group consisting of optionally substituted $triC_{1-5}$alkyl phosphine, optionally substituted $C_{1-5}$alkyl phosphine, and optionally substituted $C_{2-5}$alkenyl phosphine; an alkali metal cation; an acid selected from the group consisting of optionally substituted $C_{1-5}$alkyl carboxylic acid, and optionally substituted $C_{2}$-5alkenyl carboxylic acid; a halide or a pseudo halide; a thiol selected from the group consisting of optionally substituted $C_{1-6}$alkyl thiol, optionally substituted $C_{2-5}$alkenyl thiol, and optionally substituted $C_{4-5}$cycloalkyl thiol; and combinations thereof.

In particular embodiments, the amine is formamidine, methylamine or combinations thereof.

In particular embodiments, the alkali metal cation is selected from the group consisting of $Cs^+$, $Rb^+$, $Fr^+$, $Li^+$, $Na^+$ and $K^+$; especially $Cs^+$, $Rb^+$ or $K^+$.

In particular embodiments, the acid is acetic acid.

In particular embodiments, the halide or pseudo halide is selected from the group consisting of $I^-$, $Br^-$, $Cl^-$, $SCN^-$ and combinations thereof.

In particular embodiments, the thiol is 1,2-ethanedithiol.

Optional substituents are as described supra.

In a further aspect, the invention provides hybrid perovskite quantum dots produced by the process of the invention. Preferred embodiments of the hybrid perovskite quantum dots are as described supra.

In another aspect, there is provided hybrid perovskite quantum dots comprising a compound of formula II and a surface ligand, wherein the molar ratio of the compound of formula II to the surface ligand is in the range of from 1:0.05 to 1:1.

In some embodiments, the molar ratio of the compound of formula II to the surface ligand is in the range of from 1:0.075 to 1:0.75, 1:0.1 to 1:0.5 (and all integers therebetween); especially 1:0.1 to 1:0.5 (and all integers therebetween); most especially about 1:0.1, 1:0.15, 1:0.2, 1:0.25, 1:0.3, 1:0.35, 1:0.4, 1:0.45 or 1:0.5.

Suitable embodiments of the compound of formula II, and the surface ligand are as discussed supra.

In a further aspect, there is provided hybrid perovskite quantum dots comprising a compound of formula II and a surface ligand, wherein the molar ratio of the compound of formula II to the surface ligand is in the range of from 1:0.5 to 1:8.

In some embodiments, the molar ratio of the compound of formula II in the hybrid quantum dots to the surface ligand is in the range of from 1:0.5 to 1:8, 1:0.75 to 1:7, 1:1 to 1:5.5, 1:1.5 to 1:5 (and all integers therebetween); especially 1:1 to 1:5.5 (and all integers therebetween); most especially about 1:1, 1:1.5, 1:2, 1:2.5, 1:3, 1:3.5, 1:4-, 1:4.5, 1:5 or 1:5.5.

Suitable embodiments of the compound of formula II, and the surface ligand are as discussed supra.

3. Use of Hybrid Perovskite Quantum Dots

The hybrid perovskite quantum dots produced by the process of the invention may be used as a semiconductor and may be used in any device in which the presence of a semiconductor is desirable, such as an electroluminescent device, a solar battery, a display device or a non-linear optical device.

Thus, a further aspect provides a semiconductor device comprising hybrid perovskite quantum dots produced by the process of the invention. In some embodiments, the semiconductor device is a electroluminescent device, a solar battery, a display device or a non-linear optical device; especially a solar battery. Thus, the invention further provides a solar cell comprising hybrid perovskite quantum dots produced by the process of the invention.

A skilled person will be well aware of suitable methods for preparing a solar cell. In some embodiments, the solar cell comprises a substrate, an electrode, an electron transport material layer, a film comprising hybrid perovskite quantum dots of the invention, a solid-state hole transport material and an electrode layer. An example solar cell structure is shown in FIG. 9C.

In this example, the solar cell includes a glass substrate 901, an indium tin oxide (ITO) electrode 902, a tin oxide layer 903 that acts as an electron transport material, a perovskite quantum dots film 904, a Spiro-OMe TAD film 905 that acts as a solid-state hole transport material, and a gold electrode layer 906.

Without wishing to be bound by theory, the ability to control the composition of the hybrid quantum dots by the inclusion of a specific ratio of the first quantum dots to the second quantum dots allows the optical properties of the hybrid quantum dots to be tailored to the requirements of the semiconductor device. For example, the composition of the hybrid quantum dots may be tailored to provide hybrid quantum dots which absorb light at a desired wavelength. A solar battery, for example, which comprises a solar cell comprising multiple hybrid quantum dots with varying compositions may be produced which absorbs light over a range of wavelengths, thereby converting a greater amount of light into energy than a solar battery comprising a solar cell comprising quantum dots with a single composition and improving the efficiency of the solar battery and cell.

A further aspect of the invention provides a solar cell comprising a plurality of hybrid perovskite quantum dots produced by the process of the invention, wherein the plurality of hybrid perovskite quantum dots have different compositions. For example, in some embodiments, the plurality of hybrid perovskite quantum dots have the composition defined by formula II as defined supra, wherein y=0.25, 0.4 and 0.5. In some embodiments, hybrid perovskite quantum dots with different y values are deposited in separate layers within the solar cell.

In particular embodiments, the hybrid quantum dots produced by the process of the invention form a film in the solar cell. The film may be of any thickness suitable for efficient energy conversion. For example, in some embodiments, the film thickness is in the range of from about 100 to about 600 nm, about 200 nm to about 500 nm, or about 300 nm to about 400 nm (and all integers therebetween); especially in the range of from about 200 nm to about 500 nm, or from about 300 nm to about 400 nm (and all integers therebetween); more especially in the range of from about 300 nm to about 400 nm (and all integers therebetween); more especially about 300, 310, 320, 330, 340, 350, 360, 370, 380, 390 or 400 nm. A skilled person will be well aware of suitable methods to achieve such coating thicknesses, including varying the volume of the coating solution applied to the substrate, varying the parameters of the coating method (e.g. increasing or decreasing the blade gap when blade coating), varying the concentration of the quantum dots in the coating solution (e.g. from about 37.5 mg/mL to 75 mg/mL), and repeating the coating process multiple times (e.g. from 1 to 10 times (and all integers therebetween), especially 2 to 5 times (and all integers therebetween), including 2, 3, 4 or 5 times).

The components of the solar cell may be of any thickness suitable for achieving efficient energy conversion. A skilled person will readily be able to optimise the layers using methods routine in the art. For example, in some embodiments, the electron transport material layer has a thickness in the range of from 10-70 nm, 20-60 nm or 30-50 nm (and all integers therebetween); especially about 20, 25, 30, 35, 40, 45 and 50 nm; most especially about 40 nm. Exemplary electron transport materials include, but are not limited to, $SnO_2$ and $TiO_2$.

In some embodiments, the hybrid quantum dots produced by the process of the invention may be used as a light-emitting diode in a display device, such as a television, smartphone or computer display.

The invention further provides a use of hybrid perovskite quantum dots produced by the process of the invention as a semiconductor; and the use of hybrid perovskite quantum dots produced by the process of the invention as a light-emitting diode.

The semiconductor device maybe prepared using methods routine in the art. A skilled person will be well aware of suitable methods. Suitable methods typically involve depositing the hybrid quantum dots onto a surface of the device. Quantum dots are routinely deposited on surfaces in the art, and a skilled person will be well aware of suitable methods for doing so. For example, in some embodiments, the hybrid quantum dots produced by the process of the invention are deposited on a surface of a device by spin coating (also referred to herein as spin casting), dip coating, curtain coating, blade coating (also referred to herein as doctor blading), spraying, drop casting, or *Langmuir*-Blodgett methods; especially spin coating. In some embodiments, the hybrid quantum dots produced by the process of the invention are deposited on a surface by spin coating or blade coating; especially blade coating. This process may be repeated until a film of the desired thickness is formed. Suitable solvents for deposition using, for example, spin coating or blade coating, include, but are not limited to, octane and hexane; especially octane.

While the substrate onto which the quantum dots of the invention are deposited may be rigid, the quantum dots may also be deposited on a flexible substrate using methods described above, particularly blade coating.

Suitable rigid substrates include, but are not limited to, glass, plastic or metal, optionally coated with ITO or fluorine-doped tin oxide (FTO).

Suitable flexible substrates include, but are not limited to, polyethylene terephthalate (PET) or polyethylene naphthalate (PEN) substrates, optionally coated with ITO or FTO; or ITO or FTO substrates.

In order that the invention may be readily understood and put into practical effect, particular preferred embodiments will now be described by way of the following non-limiting examples.

EXAMPLES

All chemicals were purchased from Sigma Aldrich and used without purification, unless otherwise stated. Cesium carbonate ($Cs_2CO_3$, 99.9%), lead (II) iodide ($PbI_2$ 99.9985%, Alfa Aesar), oleic acid (OA, technical grade 90%), oleylamine (OAm, technical grade 70%), 1-octadecene (ODE, technical grade 90%), toluene (anhydrous 99.8%), hexane (reagent grade ≥95%), octane (anhydrous, ≥99%), methyl acetate (MeOAc, anhydrous 99.5%), lead (II) acetate trihydrate ($Pb(OAc)_2 \cdot 3H_2O$, 99.999%), oleylammonium iodide (OAmI) and formamidinium acetate (99%) were used.

All quantum dots were prepared under nitrogen using the standard Schlenk line technique as described in further detail below.

Example 1—Preparation of First Quantum Dots ($CsPbI_3$)

0.1 g of $Cs_2CO_3$ was mixed with 0.4 mL oleic acid and 10 mL 1-octadecene under vacuum for 30 mins at 120° C. to form a Cs-oleate solution. The solution was cooled and kept under $N_2$ gas until use. 0.4 g $PbI_2$ and 20 mL 1-octadecene were stirred in a 100 mL round bottom flask and degassed under vacuum at 120° C. for 1 hour. The flask was then filled with $N_2$ and heated to 160° C. 3.2 mL of the Cs-oleate solution, pre-heated to 70° C. under $N_2$ atmosphere, was swiftly injected into the reaction mixture. The reaction mixture turned dark red and the reaction was quenched by immediate immersion of the flask into an ice-water bath (approximately 5 seconds after injection). The concentrations of oleic acid (surface ligand) and quantum dots, and the molar ratios therebetween were calculated using the process described below. The surface ligand was present at a concentration of 0.5-0.7 g/mL, the quantum dots were present at a concentration of 50 mg/mL, and the surface ligand was present at a ratio of 25-40 moles per mole of Pb in the quantum dots at this point. The synthesised $CsPbI_3$ quantum dots (first quantum dots) were precipitated by adding 50 mL methyl acetate, and were centrifuged at 8,000 rpm for 5 mins. The supernatant was discarded, and the precipitate was redispersed in 5 mL of hexane. The concentrations of oleic acid (surface ligand) and quantum dots, and the molar ratios therebetween were calculated using the process described below. The surface ligand was present at a concentration of 0.05-0.10 g/mL, the quantum dots were present at a concentration of 50 mg/mL, and the surface ligand was present at a ratio of 2.5-5.5 moles per mole of Pb in the quantum dots at this point.

The concentrations of oleic acid (surface ligand), quantum dots, and the molar ratios therebetween were calculated by the following process: A sample of 1 g of the quantum dots was dried and redispersed in 20 mL hexane. 5 mL of ethanol was added to dissolve the surface ligand ($CsPbI_3$ is not dissolved), and the weight of the solution was determined ($W_1$). The mixture was sealed and centrifuged at 10,000 rpm for 10 mins. The supernatant (containing surface ligand, ethanol and hexane) was decanted, and the weight of the quantum dots pellet (agglomerate) was determined ($W_2$) and used to calculate the weight and number of moles of lead in the quantum dots. The amount of surface ligand was determined using the following equation: $W_1-W_2-W_{hexane/ethanol}$ (wherein $W_{hexane/ethanol}$ is the weight of the hexane and ethanol).

Example 2—Preparation of Second Quantum Dots (FAPbI$_3$)

0.152 g of lead (II) acetate trihydrate, 0.156 g of formamidinium acetate, 16 mL of dried 1-octadecene, and 4 mL of dried oleic acid were combined in a 25 mL 3-neck flask, and dried under vacuum for 30 min at 50° C. The mixture was heated to 80° C. under N$_2$, followed by the injection of 0.474 g of oleylammonium iodide in 4 mL of toluene. After 10 seconds, the reaction mixture was cooled by a water bath. The concentrations of oleic acid (surface ligand), quantum dots, and the molar ratios therebetween were calculated using the process described in Example 1. The surface ligand was present at a concentration of 0.5-0.7 g/mL, the quantum dots were present at a concentration of 50 mg/mL, and the surface ligand was present at a ratio of 20-35 moles per mole of Pb in the quantum dots at this point. 30 mL of methyl acetate was added to the reaction mixture, and the mixture was centrifuged at 8,000 rpm for 5 mins. The supernatant was discarded, and the precipitate was redispersed in 5 mL of hexane. The concentrations of oleic acid (surface ligand) and quantum dots, and the molar ratios therebetween were calculated as per the process in Example 1. The surface ligand was present at a concentration of 0.2-0.5 g/mL, the quantum dots were present at a concentration of 50 mg/mL, and the surface ligand was present at a ratio of 9-15 moles per mole of Pb in the quantum dots at this point.

Example 3—Preparation of Hybrid Quantum Dots ([Cs/FA]PbI$_3$)

CsPbI$_3$ and FAPbI$_3$ quantum dots (prepared by the procedure of Examples 1 and 2) were dispersed in hexane, and their molar concentrations were determined. A 1:1 molar ratio of the CsPbI$_3$ and FAPbI$_3$ quantum dots was mixed in hexane and stirred for 30 mins at ambient temperature to undergo cation exchange to form hybrid quantum dots (Cs$_{0.5}$FA$_{0.5}$PbI$_3$). The surface ligand was present at a concentration of 0.05 to 0.1 g/mL in the sample of CsPbI$_3$ quantum dots (50 mg/mL) and a ratio of 2.5-5.5 moles per mole of Pb in the CsPbI$_3$ quantum dots (determined using the protocol of Example 1) used for cation exchange. The surface ligand was present at a concentration of 0.2 to 0.5 g/mL in the FAPbI$_3$ quantum dots (50 mg/mL) and a ratio of 9-15 moles per mole of Pb in the FAPbI$_3$ quantum dots (determined using the protocol of Example 2) used for cation exchange. Samples were taken at 15 s, 1 min, 3 mins, 5 mins, 10 mins, 20 mins and 30 mins to monitor the progression of the cation exchange and analysed using in situ photoluminescence (PL). PL spectra and time-resolved fluorescence emission spectra were measured at room temperature on a fluorescence spectrophotometer (FLSP-900, Edinburgh Instruments).

The hybrid quantum dots were purified by adding ethyl acetate. Hybrid quantum dots (50 mg/mL in hexane) were mixed with twice the volume of ethyl acetate. The solution was centrifuged at 8,000 rpm for 5 mins to pellet the hybrid quantum dots. The hybrid quantum dots pellet was dispersed in hexane at a concentration of 50 mg/mL to obtain an ink. The above purification process was repeated, and the quantum dots were dispersed in octane. The concentration and molar concentrations and ratios were calculated as per Example 1. The concentration of surface ligand (oleic acid) was 0.005-0.02 g/mL in the Cs$_{0.5}$FA$_{0.5}$PbI$_3$ quantum dots (50 mg/mL), and 0.1-0.5 moles of surface ligand was present per mole of Pb in the hybrid quantum dots. A summary of the molar ratio of the surface ligand to the Pb in the quantum dots at various steps during synthesis is provided in Table 1.

TABLE 1

Molar ratio of the surface ligand to the Pb in the quantum dots.

| Number of purifications | CsPbI$_3$ | FAPbI$_3$ |
|---|---|---|
| 0 | 25-40 | 20-35 |
| 1 | 2.5-5.5 | 9-15 |
| 2* | 0.1-0.2 | 1-5 |
| | [Cs/FA]PbI$_3$ | |
| 0 | 2.5-10 | |
| 1 | 1.0-5.5 | |
| 2 | 0.1-0.5 | |

*Doubly purified quantum dots produced according to the process of Example 4 only.

Results

In situ photoluminescence (PL) measurements were carried out on each sample taken during cation exchange between CsPbI$_3$ and FAPbI$_3$ quantum dots to monitor the progression of the cation exchange reaction (FIG. 3). Two clear peaks corresponding to CsPbI$_3$ and FAPbI$_3$ appear in samples taken at 15 secs and 1 min. Gradually the two peaks shifted into a single emission peak, which narrows as the cation exchange progresses and completes between 20 mins and 30 mins. This spectra indicates that exchange occurs simultaneously in both particles, i.e. the peaks corresponding to CsPbI$_3$ shift to longer wavelengths, while the peaks corresponding to FAPbI$_3$ shifts to shorter wavelengths. This suggests that the quantum dots serve as cation sources for each other. Cation exchange performed in toluene and octane produced comparable results.

Example 4—Dependence of Cation Exchange Reaction on Surface Ligand Amount

Singly purified CsPbI$_3$ and FAPbI$_3$ quantum dots were prepared according to Examples 1 and 2, respectively. Doubly purified CsPbI$_3$ and FAPbI$_3$ quantum dots were prepared according to Examples 1 and 2. However, following redispersion in 5 mL of hexane, the quantum dots were precipitated by adding 10 mL of methyl acetate, and were centrifuged at 8,000 rpm for 5 mins. The supernatant was discarded, and the precipitate was redispersed in 5 mL of hexane to produce doubly purified quantum dots. Singly and doubly purified CsPbI$_3$ and FAPbI$_3$ quantum dots in hexane were directly used for Fourier-transform infrared (FTIR) spectroscopy measurements with an FTIR spectrometer (Nicolet 5700 FTIR). Photoluminescence (PL) spectra and time-resolved fluorescence emission spectra were measured at room temperature on a fluorescence spectrophotometer (FLSP-900, Edinburgh Instruments). The steady-state PL emissions were measured at 450 nm light source excitation using a monochromatised Xe lamp, while the time-resolved PL decays were carried out with a 377 nm pulsed diode laser excitation source.

Results $CsPbI_3$ quantum dots subjected to a double purification step have significantly less —C=C— species (peak at 1640 $cm^{-1}$) than singly purified $CsPbI_3$ quantum dots, which is indicative of a lower amount of the surface ligand, oleic acid (FIG. 4A). $FAPbI_3$ quantum dots subjected to a double purification step have significantly less —C=C— species (peak at 1640 $cm^{-1}$) than singly purified $FAPbI_3$ quantum dots, which is indicative of a lower amount of oleic acid (FIG. 4B). $FAPbI_3$ quantum dots subjected to a double purification step also have a stronger —C≡N signal (peak at 1712 $cm^{-1}$) than singly purified $FAPbI_3$ quantum dots, which is indicative of the presence of formamidinium, likely exposed due to the loss of the oleic acid surface ligand.

Figure 5B:
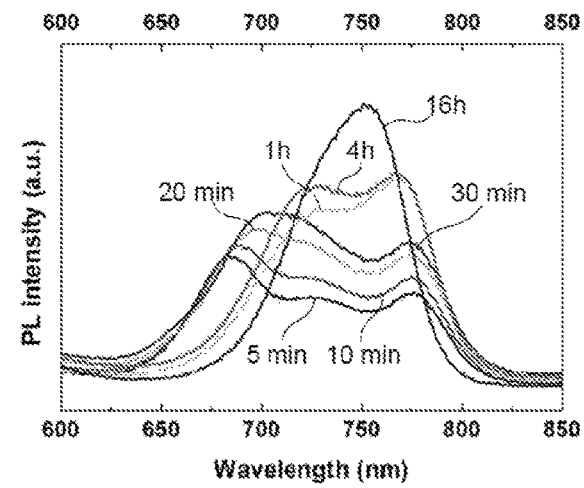

Cation exchange between $CsPbI_3$ and $FAPbI_3$ quantum dots subjected to a single purification step proceeded at a significantly faster rate (FIG. 5A) than the cation exchange between $CsPbI_3$ and $FAPbI_3$ quantum dots subjected to a double purification step (FIG. 5B). Cation exchange between singly purified quantum dots was complete within about 30 minutes, whereas cation exchange between doubly purified quantum dots takes more than 16 hours to complete.

As the further purification step removes extra surface ligand from the quantum dots, it is evident that the speed of cation exchange is dependent on the amount of surface ligand present during cation exchange.

Example 5—Thin Film Fabrication of Hybrid Quantum Dots $CsPbI_3$, $FAPbI_3$ and $[Cs/FA]PbI_3$ hybrid quantum dots (prepared by the procedure of Examples 1, 2 or 3) were redispersed in octane at a concentration of approximately 50 mg/mL. A saturated $Pb(NO_3)_2$ solution was prepared by sonicating 10-20 mg of $Pb(NO_3)_2$ in 20 mL of anhydrous methyl acetate for 10 mins, followed by removal of excess salt by centrifugation at 4,000 rpm for 5 mins. The quantum dots were spin-coated on the substrate (indium tin oxide (ITO) substrate) at 2,000 rpm for 30 seconds, and then swiftly dipped in the $Pb(NO_3)_2$ solution. The film was rinsed using neat, anhydrous methyl acetate, then dried with a stream of air. This procedure was repeated 4 times (to build up approximately 300 nm thick films). Deposition of all films was performed in air (relative humidity <40%)

Example 6—Optical and Structural Properties of Hybrid Quantum Dots

The optical and structural properties of $CsPbI_3$, $Cs_{0.9}FA_{0.1}PbI_3$, $Cs_{0.8}FA_{0.2}PbI_3$, $Cs_{0.75}FA_{0.25}PbI_3$, $Cs_{0.6}FA_{0.4}PbI_3$, $Cs_{0.5}FA_{0.5}PbI_3$, $Cs_{0.4}FA_{0.6}PbI_3$, $Cs_{0.25}FA_{0.75}PbI_3$, $Cs_{0.2}FA_{0.8}PbI_3$ and $FAPbI_3$ quantum dots were investigated. Quantum dots were prepared in accordance with Examples 1, 2 and 3, with molar ratios of the $CsPbI_3$ and $FAPbI_3$ quantum dots being adjusted accordingly.

Optical and structural properties of the quantum dots were determined using UV-vis absorption spectroscopy, transmission electron microscopy and X-ray powder diffraction.

UV-vis absorption spectra for colloidal solutions were collected using a Jasco V670 spectrometer in transmission mode. Transmission electron microscopy (TEM) images were collected using a JEOL JEM-2200FS microscope operated at 200 kV and using a Philips CM 12 microscope operating at 120 kV.

X-ray powder diffraction (XRD) spectra were collected with a STOE STADI P powder diffractometer, operating in transmission mode. A germanium monochromator, Cu Kα1 irradiation and a silicon strip detector (Dectris Mythen) were used.

Results

As the optical absorption spectrum in FIG. 1A shows, the absorption edge of the hybrid quantum dots can be tuned in the red and near infrared spectral region (from 650 nm to 780 nm, corresponding to a bandgap from 1.58 eV to 1.91 eV). The absorption onset is red-shifted after substituting Cs with FA, which is associated with bandgap narrowing upon FA doping. A similar phenomenon is also observed in the steady PL emission measurement of $[Cs/FA]PbI_3$ hybrid quantum dots (FIG. 1B), where the emission peak is red-shifted with increasing amounts of FA in the quantum dots.

The microstructure characterisation of $[Cs/FA]PbI_3$ hybrid quantum dots are shown in FIGS. 1C and 1D. XRD patterns of $[Cs/FA]PbI_3$ hybrid quantum dots with different compositions are consistent with those of the cubic $CsPbI_3$ phase (JPCDS No. 16-1481). Increasing FA content from 0 to 100% induces a gradual shift in the diffraction peaks towards a low angle, without any detectable impurity phase, confirming that the relatively smaller $Cs^+$ cations in $CsPbI_3$ quantum dots can be controllably substituted by larger $FA^+$ cations.

STEM analysis of various $[Cs/FA]PbI_3$ hybrid quantum dots (FIG. 2A-2J) evidences that they are cubic-shaped and monodispersed with sizes around 10 nm. High-resolution STEM micrographs of several hybrid quantum dots particles verifies their single-crystalline nature with high crystallinity. Notably, the gradual replacement of $Cs^+$ with $FA^+$ does not alter the cubic shape of the initial $CsPbI_3$ quantum dots, and the increase in the FA/Cs ratio does not lead to deformation of the crystal or to an obvious change in size.

Example 7—Stability and Defect Density of Hybrid Quantum Dots

The stability of the quantum dots was determined by subjecting a quantum dots thin film (prepared in accordance with Example 5) to humid and hot conditions. $Cs_{0.6}FA_{0.4}PbI_3$ quantum dots thin film and $CsPbI_3$ quantum dots thin film were exposed to humid air (90% relative humidity) for 10 days to determine the stability. The films were then analysed by XRD (conducted as per Example 6). The surface and cross-sectional morphology of the films were recorded using a field-emission scanning electron microscope (FE-SEM, JEOL 7001).

To determine thermal stability, a $Cs_{0.6}FA_{0.4}PbI_3$ quantum dots thin film (prepared in accordance with Example 5) was annealed at 100° C. for 1 hour in air (40% humidity). Changes in the UV-vis absorption spectrum following the annealing process was assessed (conducted as per Example 6).

Defect density and charge mobility was assessed by measuring the space charge limited current (SCLC) of quantum dots thin films (prepared in accordance with Example 5). Capacitor-like devices were fabricated by sandwiching the quantum dots thin films between two kinds of hole transfer material for hole-only device, and between two kinds of electron transfer material for electron-only device. This allows the hole defect density and electron defect density to be calculated separately.

Results

Figure 6A:
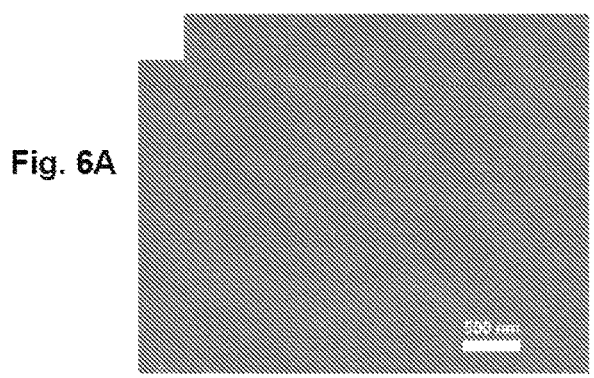
FIG. 6 includes: (A) a surface morphology scanning electron microscope (SEM) image of a $Cs_{0.6}FA_{0.4}PbI_3$ quantum dots film; (B) a cross section SEM image of a $Cs_{0.6}FA_{0.4}PbI_3$ quantum dots film; (C) XRD spectra of $Cs_{0.6}FA_{0.4}PbI_3$ and $CsPbI_3$ quantum dots film on glass after 10 days storage in humid air (relative humidity of 90%); and (D) UV-vis absorption spectra of a $Cs_{0.6}FA_{0.4}PbI_3$ quantum dots thin film before (original) and after annealing at 100° C. for 1 hour in air (60% humidity) (after annealing).
Figure 6B:
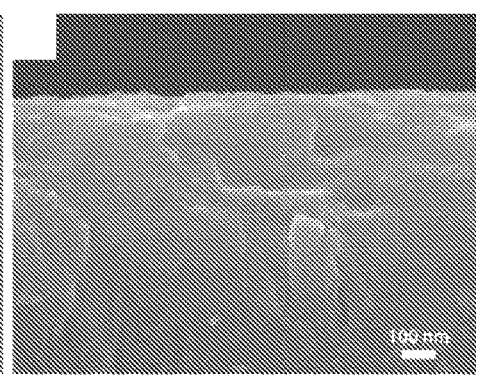
Figure 6C:
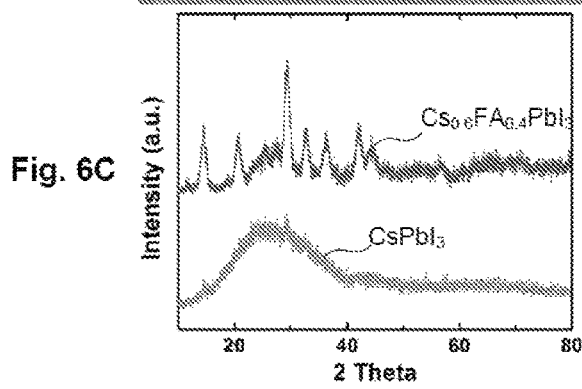
Figure 6D:
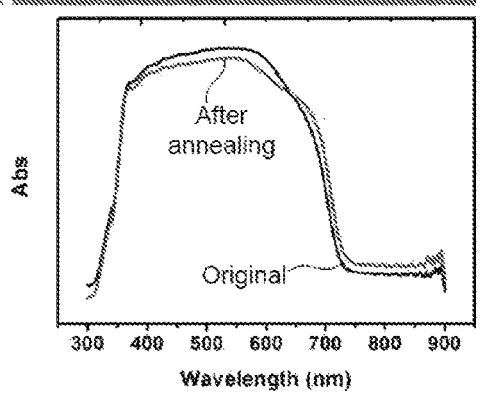
Figure 7A:
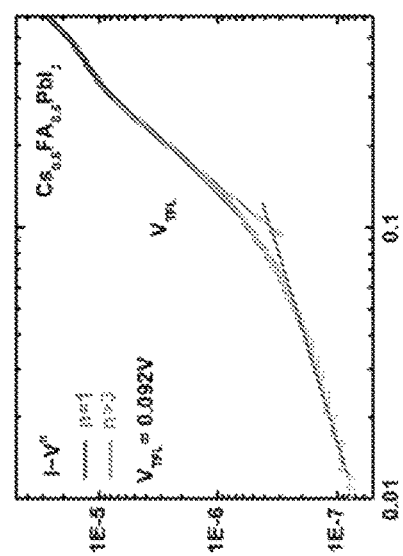
FIG. 7 displays space charge limited current (SCLC) measurements for a hole-only device comprising (A) $CsPbI_3$; (B) $Cs_{0.75}FA_{0.25}PbI_3$; (C) $Cs_{0.5}FA_{0.5}PbI_3$; (D) $Cs_{0.25}FA_{0.75}PbI_3$; and (E) $FAPbI_3$ quantum dots.
Figure 7B:
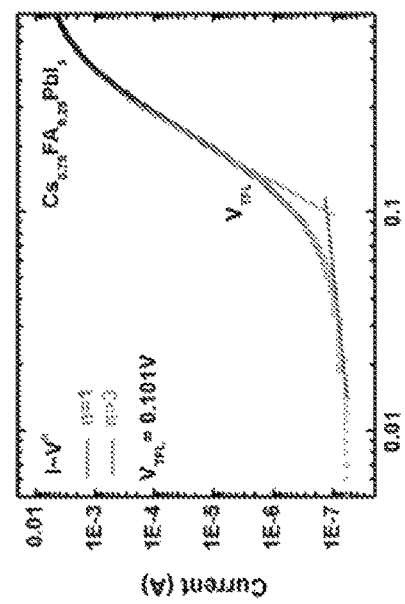
Figure 7C:
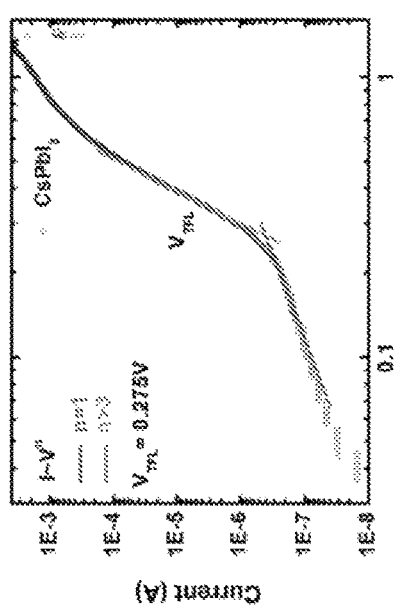
Figure 7D:
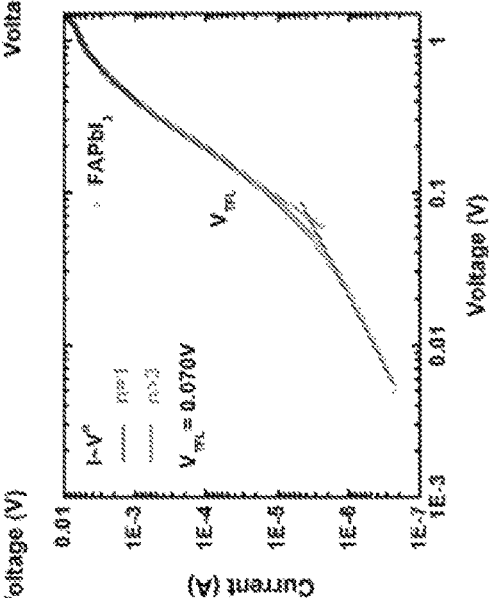
Figure 7E:
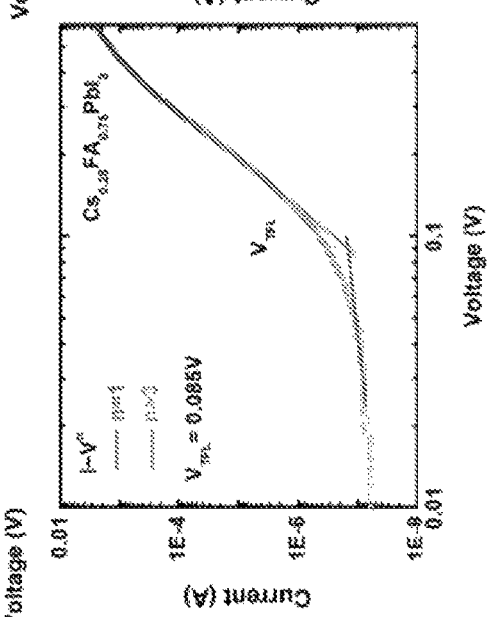

After exposure to humid conditions (90% relative humidity for 10 days), there was no obvious phase change of the $Cs_{0.6}FA_{0.4}PbI_3$ quantum dots thin film (FIG. 6A-6C). The $Cs_{0.6}FA_{0.4}PbI_3$ quantum dots thin film also had good thermal stability, with the light absorption spectrum being unchanged after annealing at 100° C. for 1 hour in air (60% humidity) (FIG. 6D).

In the SCLC current-voltage curve, the current evolves with different biases and forms three regions (FIG. 7 A-E for hole-only device and FIG. 8 A-E for electron-only device). The voltage at which all the traps are filled (trap-filled limit voltage $V_{TFL}$) was determined by the trap density, as per the following equation:

$$V_{TFL} = \frac{e n_t L^2}{2 \varepsilon \varepsilon_0}$$

where $\varepsilon$ and $\varepsilon_0$ are the dielectric constants of perovskite quantum dots and the vacuum permittivity, respectively;
L is the thickness of the obtained perovskite film; and
e is the elementary charge.

The estimated defect densities ($N_{defects}$) of various [Cs/FA]PbI$_3$ hybrid quantum dots thin films are listed in Table 2. The defect density of each film was substantially decreased by approximately 10-fold upon the inclusion of FA in the CsPbI$_3$ quantum dots.

TABLE 2

Estimated defect density of [Cs/FA]PbI$_3$ hybrid quantum dots thin films.

| QDs | Electron only device defect density (cm$^{-3}$) | Hole only device defect density (cm$^{-3}$) |
|---|---|---|
| CsPbI$_3$ | 2.08 × 10$^{16}$ | 9.45 × 10$^{15}$ |
| Cs$_{0.75}$FA$_{0.25}$PbI$_3$ | 4.38 × 10$^{15}$ | 4.06 × 10$^{15}$ |
| Cs$_{0.5}$FA$_{0.5}$PbI$_3$ | 4.32 × 10$^{15}$ | 4.23 × 10$^{15}$ |
| Cs$_{0.25}$FA$_{0.75}$PbI$_3$ | 4.50 × 10$^{15}$ | 4.40 × 10$^{15}$ |
| FAPbI$_3$ | 4.49 × 10$^{15}$ | 4.03 × 10$^{15}$ |

Example 8—Performance of Solar Cell Device Comprising Hybrid Quantum Dots

A solar cell was fabricated with the device structure depicted in FIG. 9C. In brief, $Cs_{0.5}FA_{0.5}PbI_3$ hybrid quantum dots (prepared by the procedure of Example 3) were redispersed in octane at a concentration of approximately 60 mg/mL. Saturated Pb(NO$_3$)$_2$ and FAI formamidinium iodide (FAI) solutions were prepared. A Pb(NO$_3$)$_2$ solution was prepared by sonicating 10-20 mg of Pb(NO$_3$)$_2$ in 20 mL of anhydrous methyl acetate for 10 mins, followed by removal of excess salt by centrifugation at 4,000 rpm for 5 mins. An FAI solution was prepared by adding 0.02 g of FAI to 20 mL ethyl acetate, followed by sonication for 15 mins to reach saturation. The solution was then centrifuged at 3,000 rpm for 3 mins to remove undissolved solids. For thin film fabrication, the quantum dots (approximately 60 mg/mL in octane) were spin-coated on a SnO$_2$-coated indium tin oxide (ITO) glass substrate at 2,000 rpm for 30 seconds, and then swiftly dipped in the Pb(NO$_3$)$_2$ solution. The film was rinsed using neat, anhydrous methyl acetate, then dried with a stream of air. This procedure was repeated 4 times (to build up approximately 300 nm thick films). The films were soaked in the FAI solution for 10 s to enhance the electronic coupling, and rinsed in neat, anhydrous methyl acetate, then dried with a stream of air. Deposition of all films was performed in air (relative humidity <40%). A spiro-OMe TAD (N$^2$,N$^2$,N$^{2'}$,N$^{2'}$,N$^7$,N$^7$,N$^{7'}$,N$^{7'}$-octakis(4-methoxyphenyl)-9,9f-spirobi[9H-fluorene]-2,2',7,7'-tetramine) solution was prepared by dissolving 85.8 mg of spiro-OMeTAD in 1 mL of chlorobenzene, which was doped by 28.8 μL of 4-tert-butylpyridine and 17.5 μL of Li-TSFI (lithium bis-trifluoromethanesulfonimide; 520 mg/mL in acetonitrile) solution. The spiro-OMe TAD solution was spin-coated on the hybrid quantum dots layer at 4,000 rpm for 30 s by dropping 70 μL of the solution on the spinning substrate. On top of the spiro-OMe TAD layer, a gold layer (approximately 100 nm thickness) was thermally evaporated at 0.5 Å/s.

The characteristics of the solar cell were assessed by determining the J-V curve and the external quantum efficiency (EQE). The J-V curve was measured with a source meter (Keithley 2420) using a solar simulator (Newport, Oriel Class AAA, 94063A) at 100 mW/cm$^2$ illumination (AM 1.5 G), equipped with a calibrated silicon reference cell and meter (Newport, 91150V) certificated by NREL. The J-V curves were measured in reverse scan (from 1.3 V to −0.1 V) or forward scan (from −0.1 V to 1.3 V) modes at a scan speed of 100 mV/s. The active area of each device was defined by a metal shadow mask with 0.08 cm$^2$ openings.

The external quantum efficiency (EQE) of the solar cell was determined using the standard test method ASTM E1021-15. Briefly, the EQE was measured using a 300 W xenon light source (Newport, 66902) with an Oriel Cornerstone monochromator and a multimeter in DC mode. A standard Si reference cell was used for calibration before the measurements.

Results

The J-V curve and EQE of the solar cell is shown in FIGS. 9A and 9B. The solar cell had a power conversion efficiency (PCE) of 16.55%. The parameters are summarised in Table 3. No obvious photocurrent hysteresis was observed.

TABLE 3

Power conversion efficiency of solar cell comprising $Cs_{0.5}FA_{0.5}PbI_3$ hybrid quantum dots.

| Quantum dots | PCE (%) | $J_{sc}$ (mA/cm$^2$) | $V_{oc}$ (V) | FF (%) |
|---|---|---|---|---|
| Cs$_{0.5}$FA$_{0.5}$PbI$_3$ | 16.55% | 18.09 | 1.168 | 78.3 |

Example 9—Performance of Comparative Solar Cell Device Comprising Hybrid Quantum Dots Prepared from Doubly Purified CsPbI$_3$ and FAPbI$_3$ Quantum Dots $Cs_{0.5}FA_{0.5}PbI_3$ hybrid quantum dots were prepared using the protocol according to Example 3, wherein the CsPbI$_3$ and FAPbI$_3$ quantum dots were subjected to a double purification step in accordance with Example 4 prior to cation exchange. The concentrations and molar ratios were calculated as per Examples 1-3. The surface ligand (oleic acid) was present at a concentration of 0.005-0.01 g/mL in the CsPbI$_3$ quantum dots (50 mg/mL) and a ratio of 0.1-0.5 moles per mole of Pb in the CsPbI$_3$ quantum dots prior to cation exchange. The surface ligand (oleic acid) was present at a concentration of 0.01-0.05 g/mL in the FAPbI$_3$ quantum dots (50 mg/mL) and a ratio of 1-2.5 moles per mole of Pb in the FAPbI$_3$ quantum dots prior to cation exchange. The surface ligand (oleic acid) was present at a concentration of 0.005-0.02 g/mL in the Cs$_{0.5}$FA$_{0.5}$PbI$_3$ hybrid quantum dots prior to spin coating (i.e. dispersed in octane) and a ratio of 0.1-0.5 moles per mole of Pb in the Cs$_{0.5}$FA$_{0.5}$PbI$_3$ hybrid quantum dots prior to spin coating. A solar cell comprising the hybrid quantum dots was prepared, and its characteristics were assessed in accordance with Example 8.

Results

Figure 10:
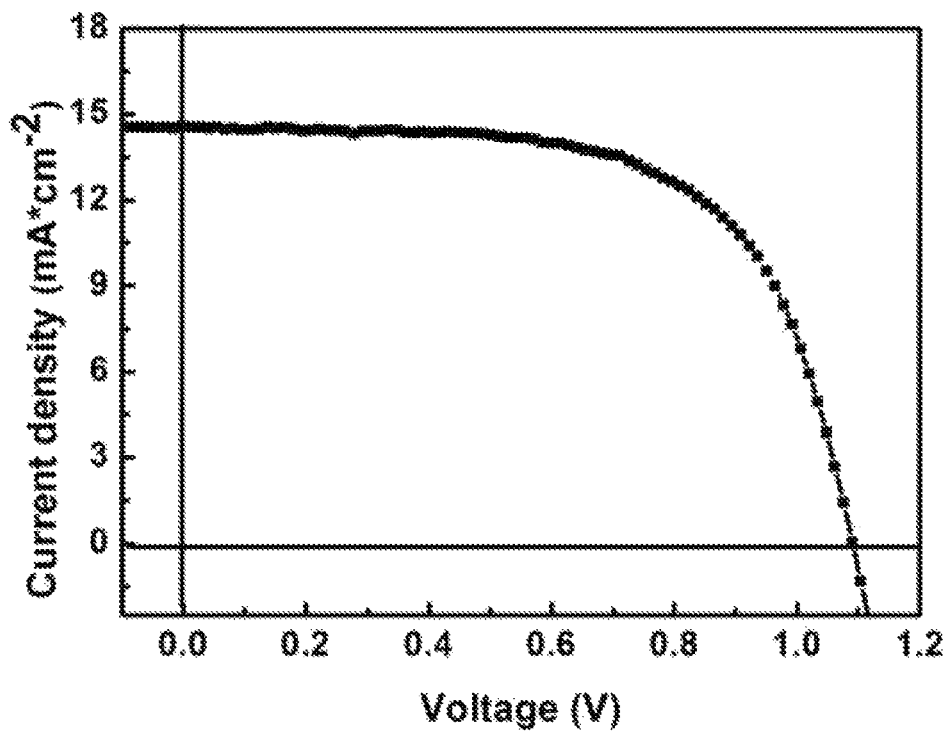
FIG. 10 displays the stabilised J-V curve of a solar cell device comprising hybrid $Cs_{0.5}FA_{0.5}PbI_3$ quantum dots produced from $CsPbI_3$ and $FAPbI_3$ quantum dots subjected to a double purification step prior to cation exchange.

The J-V curve of the solar cell is shown in FIG. 10. The parameters are summarised in Table 4. The solar cell had a power conversion efficiency (PCE) of 10.17%, which is significantly lower than a solar cell comprising hybrid quantum dots produced from singly purified quantum dots (10.17% vs 16.55% PCE).

TABLE 4

Power conversion efficiency of solar cell comprising Cs$_{0.5}$FA$_{0.5}$PbI$_3$ hybrid quantum dots formed from doubly purified CsPbI$_3$ and FAPbI$_3$ quantum dots.

| Quantum dots | PCE (%) | J$_{sc}$ (mA/cm$^2$) | V$_{oc}$ (V) | FF (%) |
|---|---|---|---|---|
| Cs$_{0.5}$FA$_{0.5}$PbI$_3$ (doubly purified) | 10.17% | 14.15 | 1.05 | 68.30 |

Thus, [Cs/FA]PbI$_3$ hybrid quantum dots have improved phase stability, a lower defect density and a lower bandgap compared to pure CsPbI$_3$ quantum dots, and the performance may be improved by controlling the surface ligand concentration.

Example 10—Photoluminescence of Hybrid Quantum Dots Compared to Hybrid Quantum Dots Prepared from Doubly Purified CsPbI$_3$ and FAPbI$_3$ Quantum Dots Cs$_{0.5}$FA$_{0.5}$PbI$_3$ hybrid quantum dots were prepared using the protocol according to Example 3 (Cs$_{0.5}$FA$_{0.5}$PbI$_3$-QD-OR). Comparative Cs$_{0.5}$FA$_{0.5}$PbI$_3$ hybrid quantum dots were prepared using the protocol according to Example 3, wherein the CsPbI$_3$ and FAPbI$_3$ quantum dots were subjected to a double purification step in accordance with Example 4 prior to cation exchange (Cs$_{0.5}$FA$_{0.5}$PbI$_3$-QD-OL). As a further comparison, hybrid quantum dots were prepared using the protocol according to Example 3, wherein the resulting hybrid quantum dots were purified a further time by repeating the purification process described in Example 3 (Cs$_{0.5}$FA$_{0.5}$PbI$_3$-QD*-OR). Photoluminescence spectra was obtained using the process of Examples 3 and 4, and photoluminescence quantum yields (PLQY) were calculated using rhodamine 6G in ethanol as a reference.

Results

Figure 11:
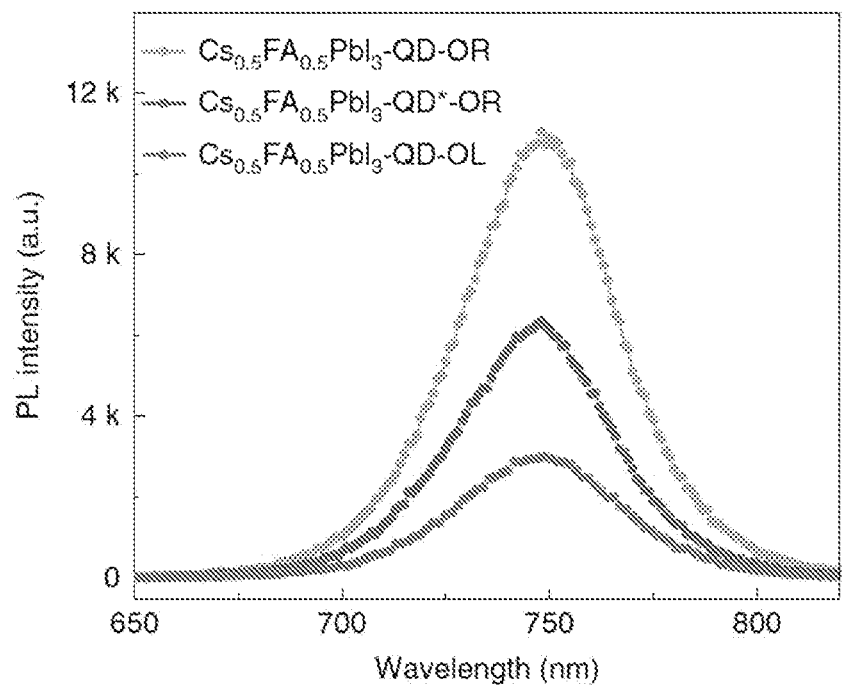
FIG. 11 shows the photoluminescence spectra of hybrid $Cs_{0.5}FA_{0.5}PbI_3$ quantum dots produced from $CsPbI_3$ and $FAPbI_3$ quantum dots subjected to a double purification step prior to cation exchange ($Cs_{0.5}FA_{0.5}PbI_3$-QD-OL), hybrid $Cs_{0.5}FA_{0.5}PbI_3$ quantum dots produced from $CsPbI_3$ and $FAPbI_3$ quantum dots subjected to a single purification step prior to cation exchange ($Cs_{0.5}FA_{0.5}PbI_3$-QD-OR) and $Cs_{0.5}FA_{0.5}PbI_3$-QD-OR quantum dots which were purified an additional time ($Cs_{0.5}FA_{0.5}PbI_3$-QD*-OR) in hexane.

The Cs$_{0.5}$FA$_{0.5}$PbI$_3$ hybrid quantum dots prepared using the process of Example 3 (using singly purified CsPbI$_3$ and FAPbI$_3$ quantum dots; Cs$_{0.5}$FA$_{0.5}$PbI$_3$-QD-OR) showed a significantly higher PL intensity than the hybrid quantum dots prepared from doubly purified CsPbI$_3$ and FAPbI$_3$ quantum dots (Cs$_{0.5}$FA$_{0.5}$PbI$_3$-QD-OL), and the hybrid quantum dots which were purified a further time following ligand medicated cation exchange (Cs$_{0.5}$FA$_{0.5}$PbI$_3$-QD*-OR) (FIG. 11), with PLQY values of 68%, 23% and 47% for Cs$_{0.5}$FA$_{0.5}$PbI$_3$-QD-OR, Cs$_{0.5}$FA$_{0.5}$PbI$_3$-QD-OL and Cs$_{0.5}$FA$_{0.5}$PbI$_3$-QD*-OR, respectively.

Example 11—Performance of Solar Cell Device Comprising Hybrid Quantum Dots Compared to Hybrid Quantum Dots Prepared from Doubly Purified CsPbI$_3$ and FAPbI$_3$ Quantum Dots Solar cell devices were prepared in accordance with Examples 8 and 9 using quantum dots prepared in accordance with Examples 1, 2 and 3, with molar ratios of the CsPbI$_3$ and FAPbI$_3$ quantum dots being adjusted accordingly. Comparative large-grain Cs$_{0.25}$FA$_{0.75}$PbI$_3$ bulk thin-film devices were prepared by dissolving formamidinium iodide (1 M) with excess of PbI$_2$ (1.1 M) in a mixed solvent of DMF and DMSO (1:4 v/v) followed by addition of caesium iodide stock solution (1.5 M in DMSO) to achieve the desired composition. The precursor was spin-coated onto SnO$_2$ substrates at 2,000 rpm for 10 seconds, and 6,000 rpm for 30 seconds, during which chlorobenzene was dropped on the spinning substrate 15 seconds before the end of the second step. The substrates were annealed on a hot plate at 65° C. for 10 mins and 100° C. for 60 mins to obtain crystalline perovskite films. The remainder of the solar cell device was prepared in accordance with Example 8.

The characteristics of the solar cells were assessed in accordance with the procedure of Example 8. The cross-sectional morphology of the device was assessed with a Scios DualBeam focused ion beam scanning electron microscope (FEI) system. Images were obtained with a FEI F20 FEG-S/TEM instrument.

Results

Figure 12:
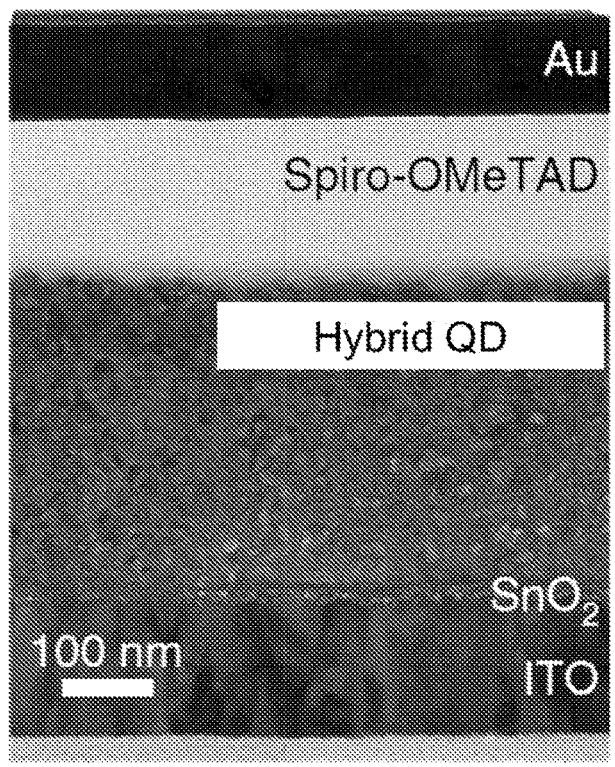
FIG. 12 is a cross-section TEM image of a solar cell comprising hybrid quantum dots.
Figure 13:
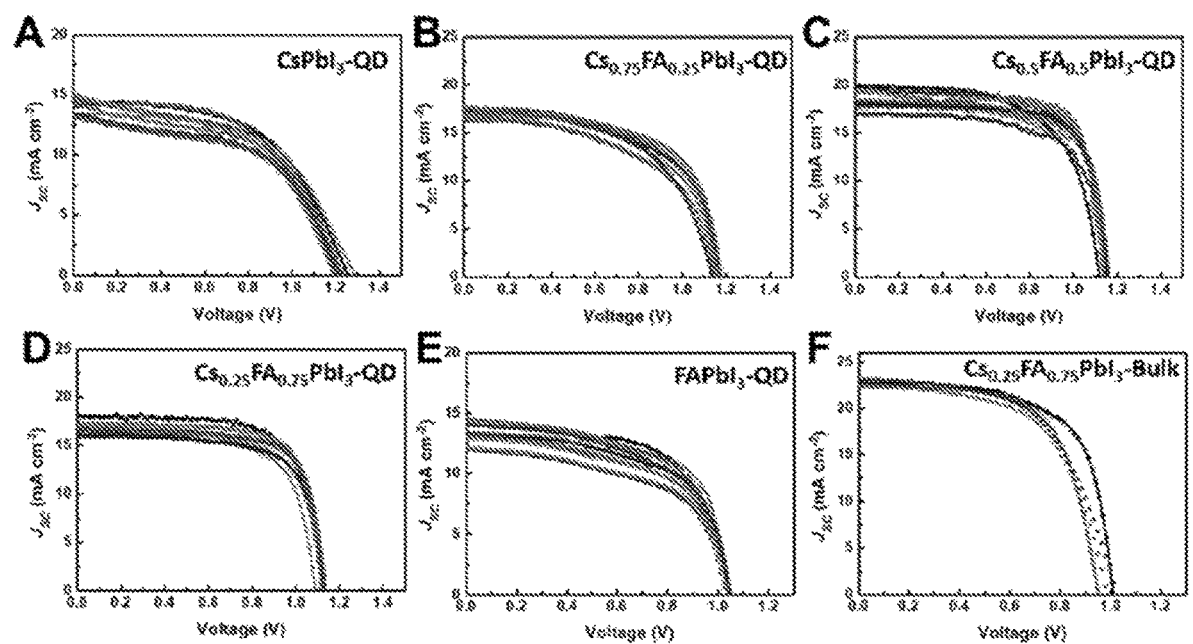
FIG. 13 shows the photocurrent density-voltage (J-V) characteristics of solar cells comprising quantum dots of varying stoichiometries, wherein the cells comprise (A) $CsPbI_3$; (B) $Cs_{0.75}FA_{0.25}PbI_3$; (C) $Cs_{0.5}FA_{0.5}PbI_3$; (D) $Cs_{0.25}FA_{0.75}PbI_3$; and (E) $FAPbI_3$ quantum dots; and (F) represents a $Cs_{0.25}FA_{0.75}PbI_3$ bulk solar cell device.
Figure 14:
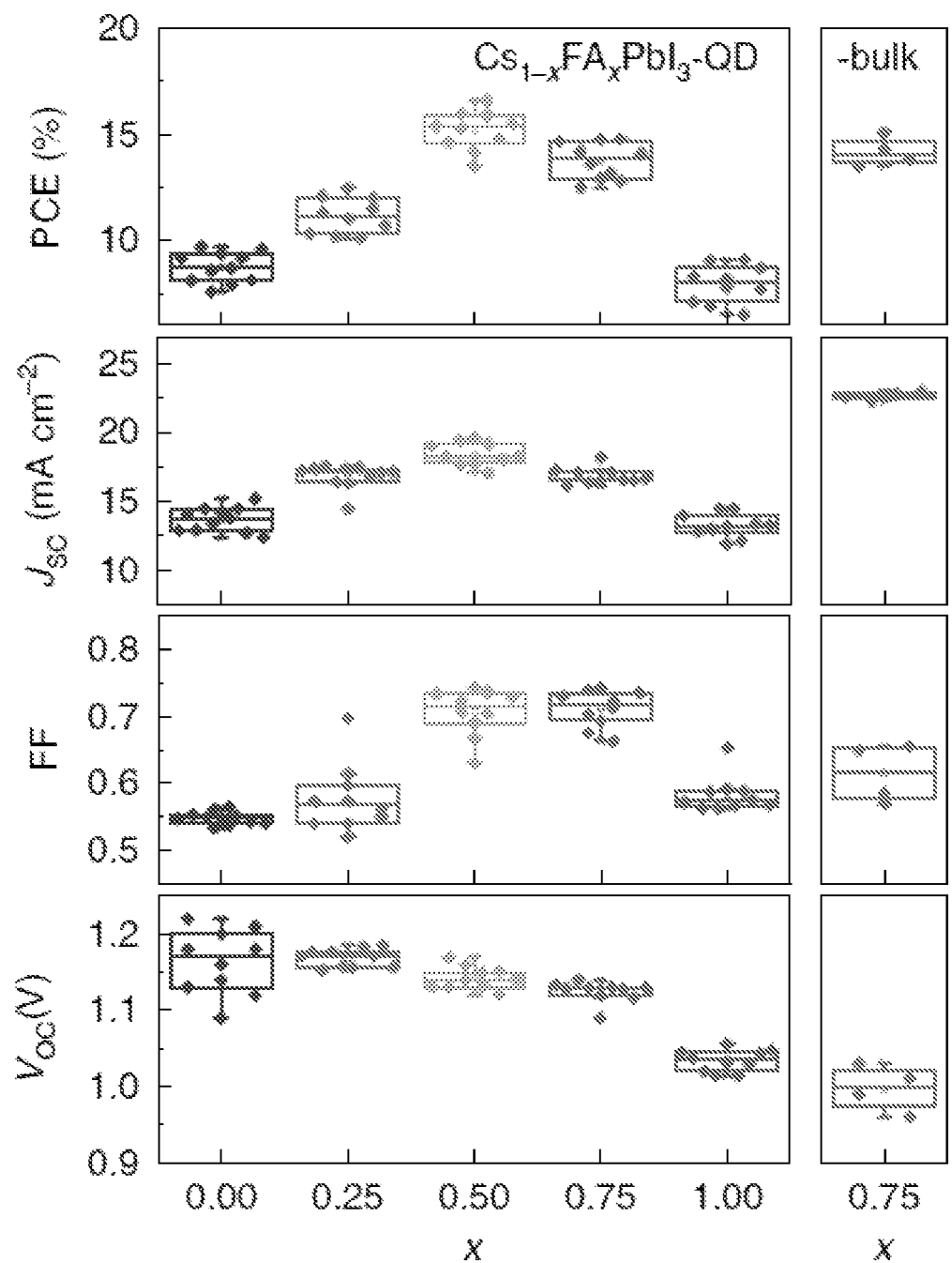
FIG. 14 is a box plot showing the performance evolution of solar cells comprising hybrid quantum dots of varying stoichiometries (11 devices for each composition) in comparison to a bulk device. The plots show the median (centre line), 25$^{th}$ (bottom edge of box), 75$^{th}$ (top edge of box), 95$^{th}$ (upper whisker) and 5$^{th}$ (lower whisker) percentiles. All PCEs were obtained on the reverse scan.

A transmission electron microscopy (TEM) cross-section image of a solar cell comprising the hybrid quantum dots is presented in FIG. 12. The performance of solar cell devices comprising quantum dots of different stoichiometries is presented in FIGS. 13 and 14. All of the devices comprising hybrid Cs/FAPbI$_3$ quantum dots exhibited markedly increased PCEs compared with CsPbI$_3$ and FAPbI$_3$ devices, which is a result of the improvement in J$_{SC}$ and FF, and the reduction in V$_{OC}$ loss. The Cs$_{0.5}$FA$_{0.5}$PbI$_3$ hybrid quantum dots delivered the best photovoltaic performance, with the average PCE increasing from about 10% to about 15% upon formamidinium incorporation. All devices had a much higher V$_{OC}$ than the comparative large-grain Cs$_{0.25}$FA$_{0.75}$PbI$_3$ bulk thin-film device.

Example 12—Effects of Quantum Dots Composition on Defect Reduction

Cs$_{0.5}$FA$_{0.5}$PbI$_3$ hybrid quantum dots were prepared using the protocol according to Example 3 (Cs$_{0.5}$FA$_{0.5}$PbI$_3$-QD-OR). Comparative Cs$_{0.5}$FA$_{0.5}$PbI$_3$ hybrid quantum dots were prepared using the protocol according to Example 3, wherein the CsPbI$_3$ and FAPbI$_3$ quantum dots were subjected to a double purification step in accordance with Example 4 prior to cation exchange (Cs$_{0.5}$FA$_{0.5}$PbI$_3$-QD-OL). CsPbI$_3$ quantum dots were prepared in accordance with Example 1. Quantum dots were coated as films onto tin oxide substrates, and solar cell devices were prepared in accordance with the procedure of Examples 5, 8 and 11.

Photoluminescence spectra were obtained using the process of Examples 3 and 4.

STEM examination was carried out using a probe-corrected JEOL ARM200F equipped with a cold-field emission gun operating at an acceleration voltage of 200 kV. HAADF images were acquired with inner and outer collection angles of 68 and 280 mrad, respectively, ensuring Z-contrast, while bright-field images were acquired with a maximum collection angle of 17 mrad. All images (1,024×1,024 pixels) were acquired with a dwell time of 10 ms per pixel and a convergence angle of 25 mrad, resulting in a probe size of about 0.1 nm and a current of 26.4 pA. Images were processed by the Gatan Digital Micrograph software using the spatial filter to smooth the image first, and then the FFT filter was combined with the mask tool to remove noise. The deconvolution tool was used to increase the quality of the images.

SCLC measurements were performed in accordance with Example 7.

Results

Figure 15:
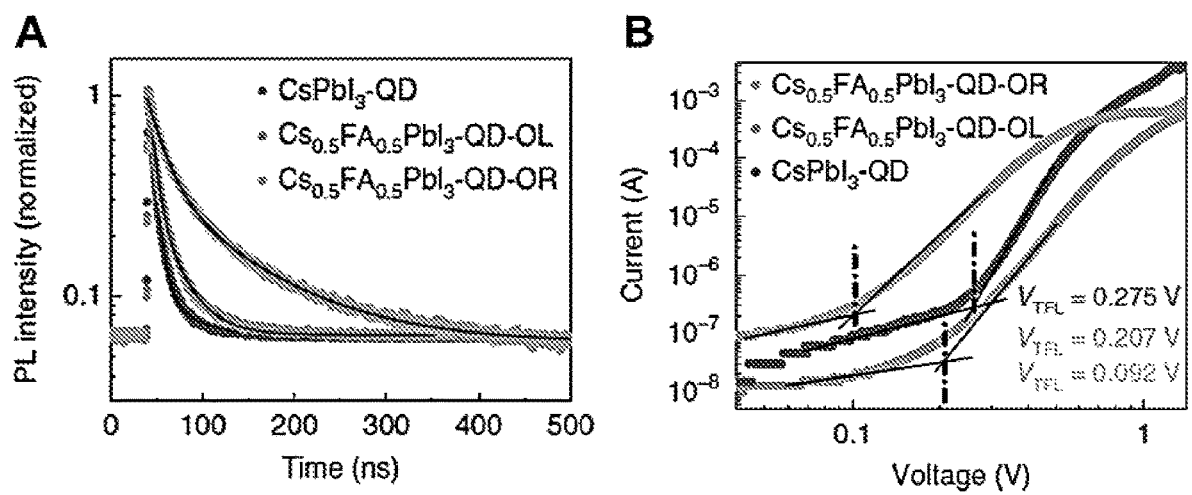
FIG. 15 displays the characteristics of films and devices comprising hybrid quantum dots produced from $CsPbI_3$ and $FAPbI_3$ quantum dots subjected to a double and single purification step prior to cation exchange. (A) is a TRPL spectra of hybrid $Cs_{0.5}FA_{0.5}PbI_3$ quantum dots produced from $CsPbI_3$ and $FAPbI_3$ quantum dots subjected to a double purification step prior to cation exchange ($Cs_{0.5}FA_{0.5}PbI_3$-QD-OL), hybrid $Cs_{0.5}FA_{0.5}PbI_3$ quantum dots produced from $CsPbI_3$ and $FAPbI_3$ quantum dots subjected to a single purification step prior to cation exchange ($Cs_{0.5}FA_{0.5}PbI_3$-QD-OR) and $CsPbI_3$ quantum dots ($CsPbI_3$-QD) thin films. (B) shows the J-V characteristics of hole-only devices used for estimating the SCLC defect concentration of the samples of A. The cross-over voltage between the ohmic and logarithmic slopes is taken as the trap-filling voltage ($V_{TFL}$).
Figure 16:
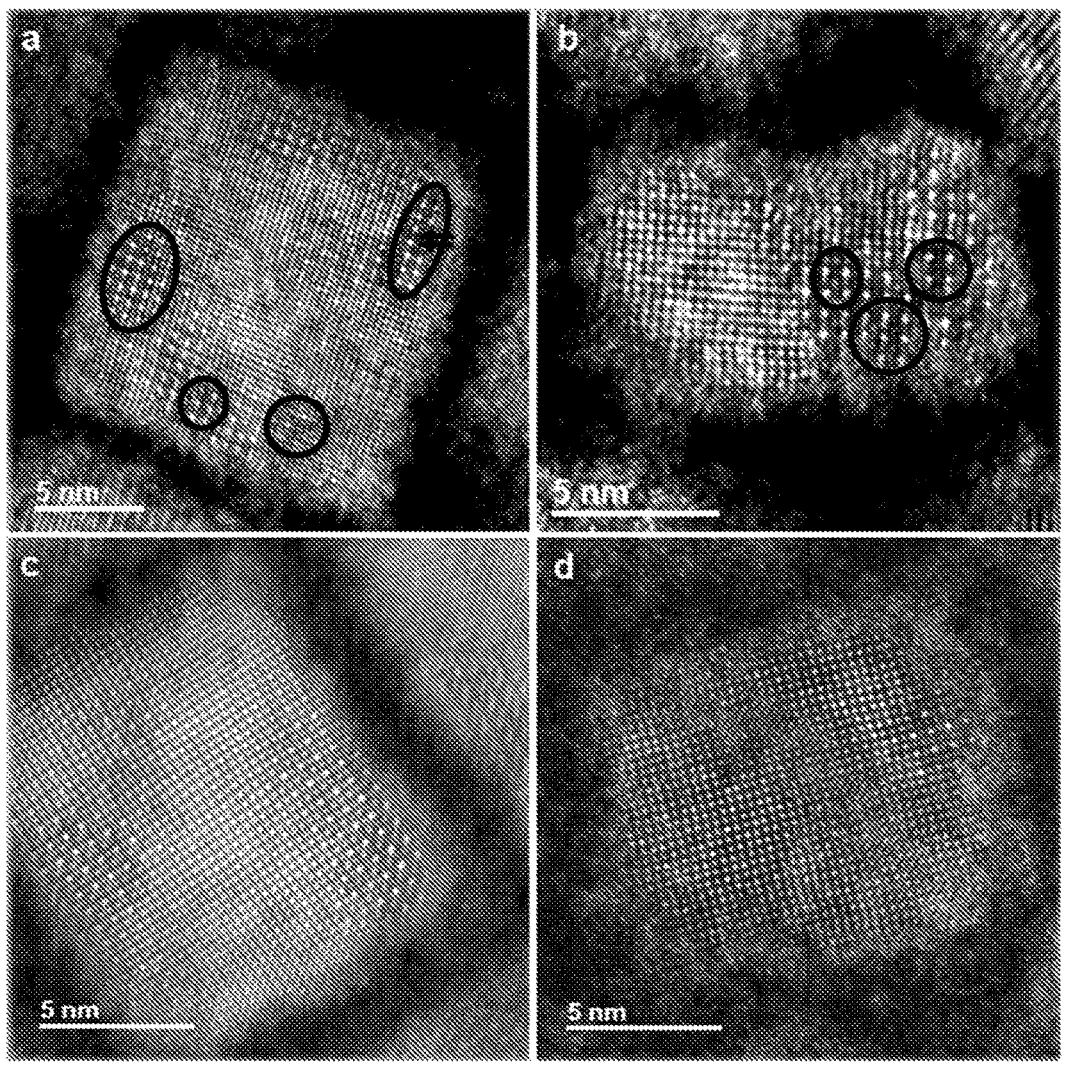
FIG. 16 includes the atomic-resolution HAADF-STEM images of (A) and (B) hybrid $Cs_{0.5}FA_{0.5}PbI_3$ quantum dots produced from $CsPbI_3$ and $FAPbI_3$ quantum dots subjected to a double purification step prior to cation exchange; and (C) and (D) hybrid $Cs_{0.5}FA_{0.5}PbI_3$ quantum dots produced from $CsPbI_3$ and $FAPbI_3$ quantum dots subjected to a single purification step prior to cation exchange. Circled areas indicate defective sites.

To build on the results of Example 7, time-resolved photoluminescence (TRPL) decay measurements were performed on quantum dots films, and a 97 ns carrier lifetime was deduced from the fitted TRPL decay curve of the film comprising $Cs_{0.5}FA_{0.5}PbI_3$ hybrid quantum dots prepared using the process of Example 3 (using singly purified $CsPbI_3$ and $FAPbI_3$ quantum dots; $Cs_{0.5}FA_{0.5}PbI_3$-QD-OR), compared to a carrier lifetime of 26 ns for the $CSPbI_3$ film (FIG. 15A). Interestingly, no significant life-time increase was observed for the hybrid quantum dots prepared from doubly purified $CsPbI_3$ and $FAPbI_3$ quantum dots ($Cs_{0.5}FA_{0.5}PbI_3$-QD-OL). It was proposed that this was due to insufficient coverage of surface ligands on the parent $CsPbI_3$ and $FAPbI_3$ quantum dots which could generate undesirable effects before or during cation exchange, which was confirmed by HADDF-STEM analysis of $Cs_{0.5}FA_{0.5}PbI_3$-QD-OR (FIGS. 16C and 16D) and $Cs_{0.5}FA_{0.5}PbI_3$-QD-OL (FIGS. 16A and 16B), which clearly shows defective sites on the $Cs_{0.5}FA_{0.5}PbI_3$-QD-OL quantum dots (circled). The extended charge-recombination lifetime observed for the $Cs_{0.5}FA_{0.5}PbI_3$-QD-OR films may be attributed to the effects of the ligand and FA presence in suppressing the formation of deep-level trap defects that cause non-radiative trap-assisted recombination. Thus, the process for preparation of the hybrid quantum dots, in particular surface ligand control, plays an important role in suppressing defect formation.

The SCLC measurements of a film comprising hybrid quantum dots prepared from doubly purified $CsPbI_3$ and $FAPbI_3$ quantum dots ($Cs_{0.5}FA_{0.5}PbI_3$-QD-OL) were determined in comparison to the data of Example 7 for films comprising $Cs_{0.5}FA_{0.5}PbI_3$ hybrid quantum dots prepared using the process of Example 3 (using singly purified $CsPbI_3$ and $FAPbI_3$ quantum dots; $Cs_{0.5}FA_{0.5}PbI_3$-QD-OR), and $CsPbI_3$ (FIG. 15B). The linear rise at lower voltages observed for all films, followed by a logarithmic slope of greater than three with increased voltage is indicative of trap filling. The cross-over voltage between the two slopes is taken as the trap-filling voltage from which the trap density can be estimated. Trap filling occurs at lower voltages for the $Cs_{0.5}FA_{0.5}PbI_3$-QD-OR film compared to the $CsPbI_3$ and $Cs_{0.5}FA_{0.5}PbI_3$-QD-OL films. This indicates a lower trap density and significant FF improvement and smaller $V_{OC}$ loss in the corresponding solar cell device.

Example 13—Stability of Hybrid Quantum Dots Films and Solar Cells

Hybrid $Cs_{0.5}FA_{0.5}PbI_3$ quantum dots were prepared in accordance with Example 3, $CsPbI_3$ quantum dots were prepared in accordance with Example 1 and were coated as films onto $SnO_2$-coated ITO glass substrates, and solar cell devices were prepared in accordance with the procedure of Examples 8 and 11. Devices and films were exposed to ambient conditions, illumination under continuous 100 mW/cm² irradiation by a LED grow light (Spectrum King MLH140) under open circuit condition for 96 hours in a nitrogen atmosphere, illumination for 3 hours at 25 mW/cm², or under 1-sun illumination for 600 hours.

Photoluminescence, PCE and $J_{SC}$ were determined in accordance with Example 8. Ion conductivity was extracted from the current changes of a lateral device under a 0.35 V/μm electrical field and the activation energy for ion migration was obtained by fitting the ion conductivity at different temperature according to the Arrhenius equation.

Results

Figure 17:
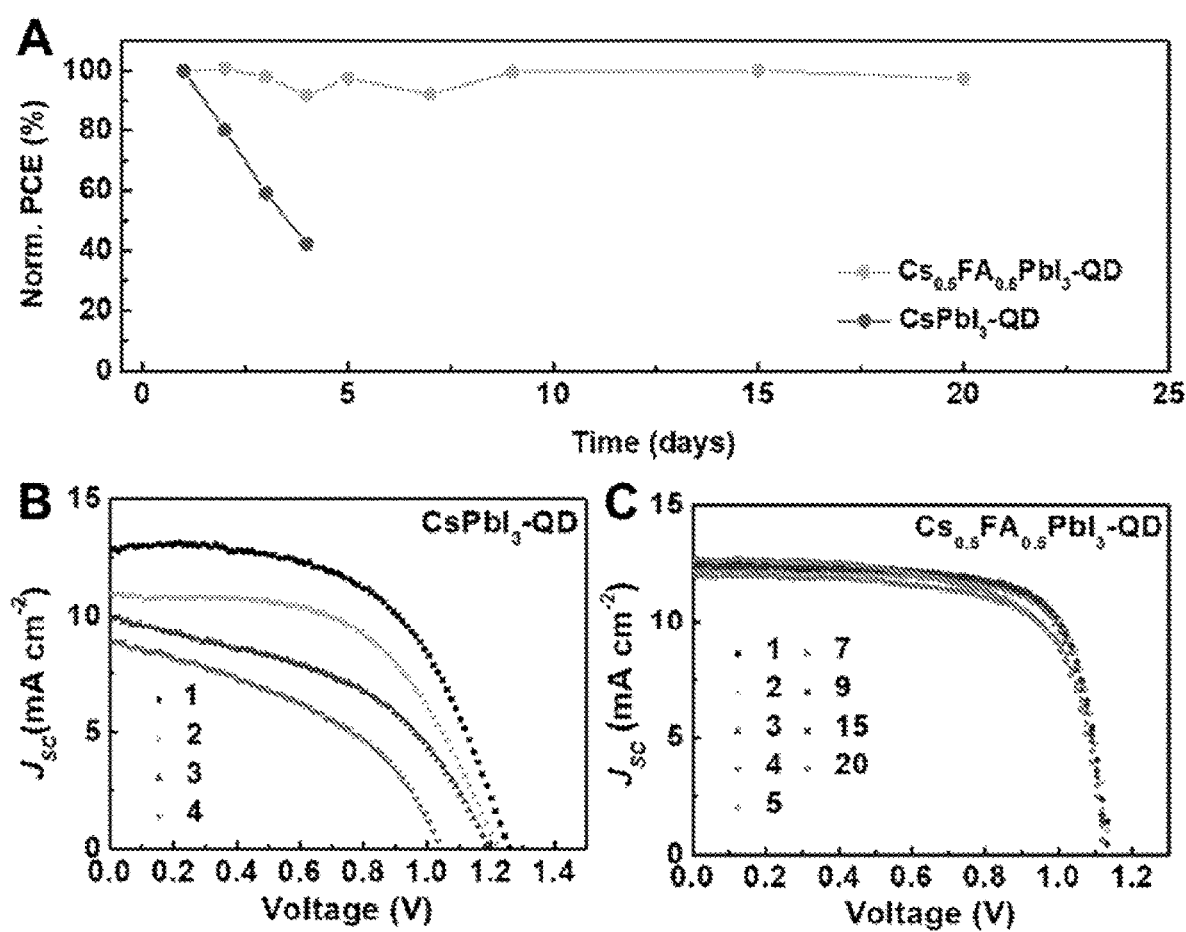
FIG. 17 displays the stability of solar cell devices comprising hybrid $Cs_{0.5}FA_{0.5}PbI_3$ quantum dots produced from $CsPbI_3$ and $FAPbI_3$ quantum dots subjected to a single purification step prior to cation exchange ($Cs_{0.5}FA_{0.5}PbI_3$-QD) compared to devices comprising $CsPbI_3$ quantum dots ($CsPbI_3$-QD) in ambient air and a relative humidity of 50-70%. (A) is a graph of the normalised PCE over time; (B) is a graph showing J-V curves of the $CsPbI_3$ device at 1, 2, 3 and 4 days, respectively; and (C) is a graph showing the J-V curves of the $Cs_{0.5}FA_{0.5}PbI_3$ device at 1, 2, 3, 4, 5, 7, 9, 15 and 20 days, respectively.

The stability of the devices under ambient conditions was investigated. The PCE evolution of both $CsPbI_3$ and $Cs_{0.5}FA_{0.5}PbI_3$ quantum dots devices were measured over a long period of storage in ambient air (relative humidity of 50-70%). The $CsPbI_3$ quantum dots device lost the majority of its efficiency within 4 days, whereas the $Cs_{0.5}FA_{0.5}PbI_3$ quantum dots device retained over 97% of its original efficiency after storage for 20 days (FIG. 17).

Figure 18:
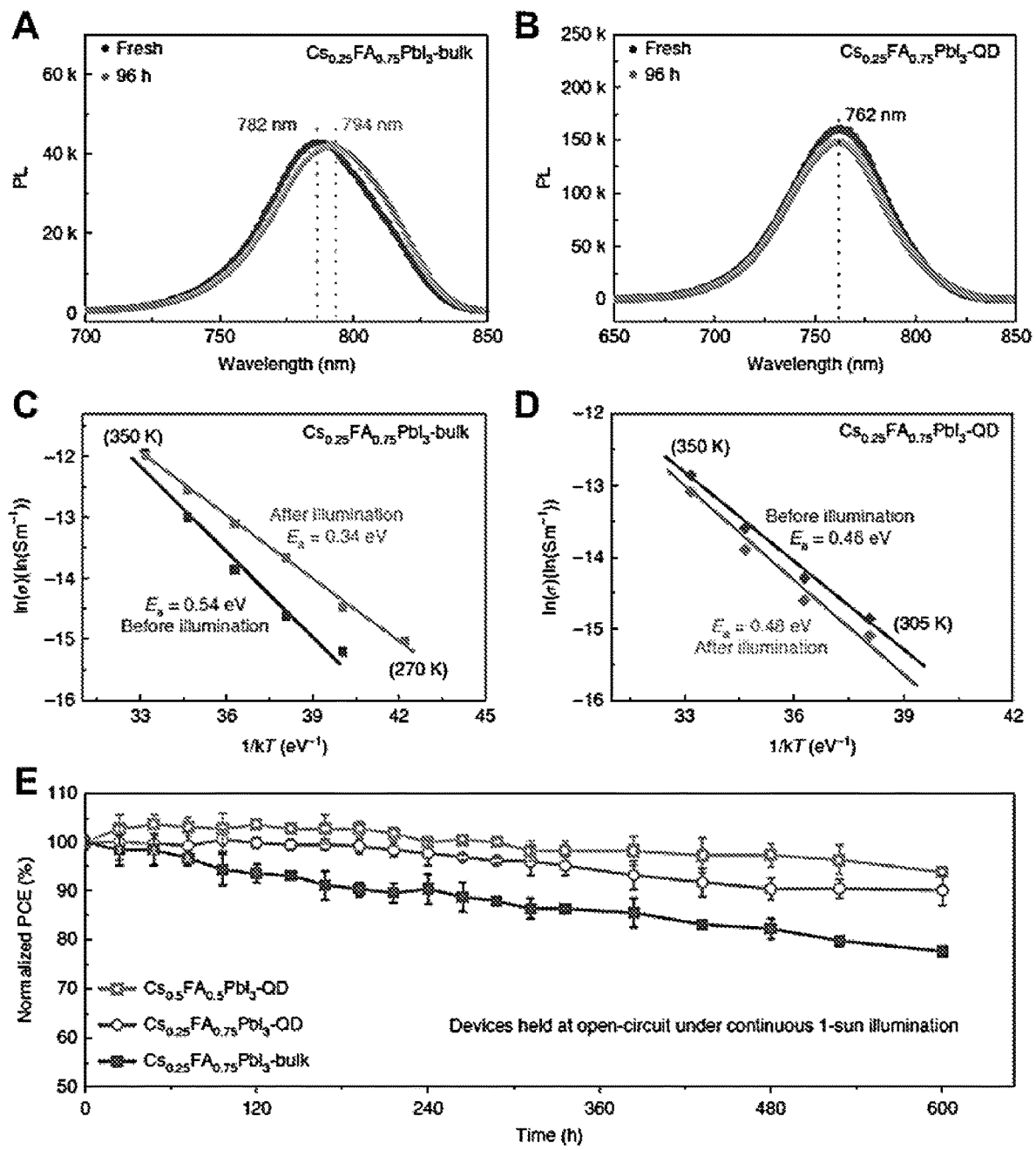
FIG. 18 illustrates the stability of quantum dots films and devices comprising hybrid $Cs_{0.5}FA_{0.5}PbI_3$ quantum dots produced from $CsPbI_3$ and $FAPbI_3$ quantum dots subjected to a single purification step prior to cation exchange ($Cs_{0.5}FA_{0.5}PbI_3$-QD); and hybrid $Cs_{0.25}FA_{0.75}PbI_3$ quantum dots produced from $CsPbI_3$ and $FAPbI_3$ quantum dots subjected to a single purification step prior to cation exchange ($Cs_{0.25}FA_{0.75}PbI_3$-QD); and a hybrid $Cs_{0.25}FA_{0.75}PbI_3$ bulk thin-film and device ($Cs_{0.25}FA_{0.75}PbI_3$-bulk): (A) and (B) display the PL spectra of $Cs_{0.25}FA_{0.75}PbI_3$-bulk and $Cs_{0.25}FA_{0.75}PbI_3$-QD films, respectively, before (fresh) and after illumination for 96 hours (96 h). (C) and (D) are Arrhenius plots of the ion conductivity of the $Cs_{0.25}FA_{0.75}PbI_3$-bulk and $Cs_{0.25}FA_{0.75}PbI_3$-QD films, respectively, before and after illumination at 25 mW/cm$^2$ for 3 hours. The slope (activation energy for ion migration ($E_a$) was calculated using the Arrhenius equation. (E) is a graph showing the long-term stability of solar cell devices comprising a $Cs_{0.5}FA_{0.5}PbI_3$-QD film, a $Cs_{0.25}FA_{0.75}PbI_3$-QD film and a $Cs_{0.25}FA_{0.75}PbI_3$-bulk film at open circuit under 1-sun illumination (mean±SEM, where n=3).

Photoluminescence (PL) emission changes of the films were determined before and after continuous light irradiation in nitrogen. The $Cs_{0.25}FA_{0.75}PbI_3$ hybrid quantum dots film showed a significant blue shift in the PL peak position compared to the corresponding bulk film (FIGS. 18A and 18B). After continuous illumination for 96 hours, the bulk film PL emission peak had a red shift of 12 nm, whereas the $Cs_{0.25}FA_{0.75}PbI_3$ hybrid quantum dots film had a negligible change in the PL emission, which indicates suppressed ion migration. This was confirmed by ion conductivity measurements, where the activation energy ($E_a$) for ion migration in the $Cs_{0.25}FA_{0.75}PbI_3$ hybrid quantum dots film does not substantially change after illumination (FIG. 18D), suggesting that light irradiation does not increase ion migration in the film. Conversely, the $E_a$ for the corresponding bulk film decreased from 0.54 eV to 0.34 eV after illumination (FIG. 18C).

Figure 19:
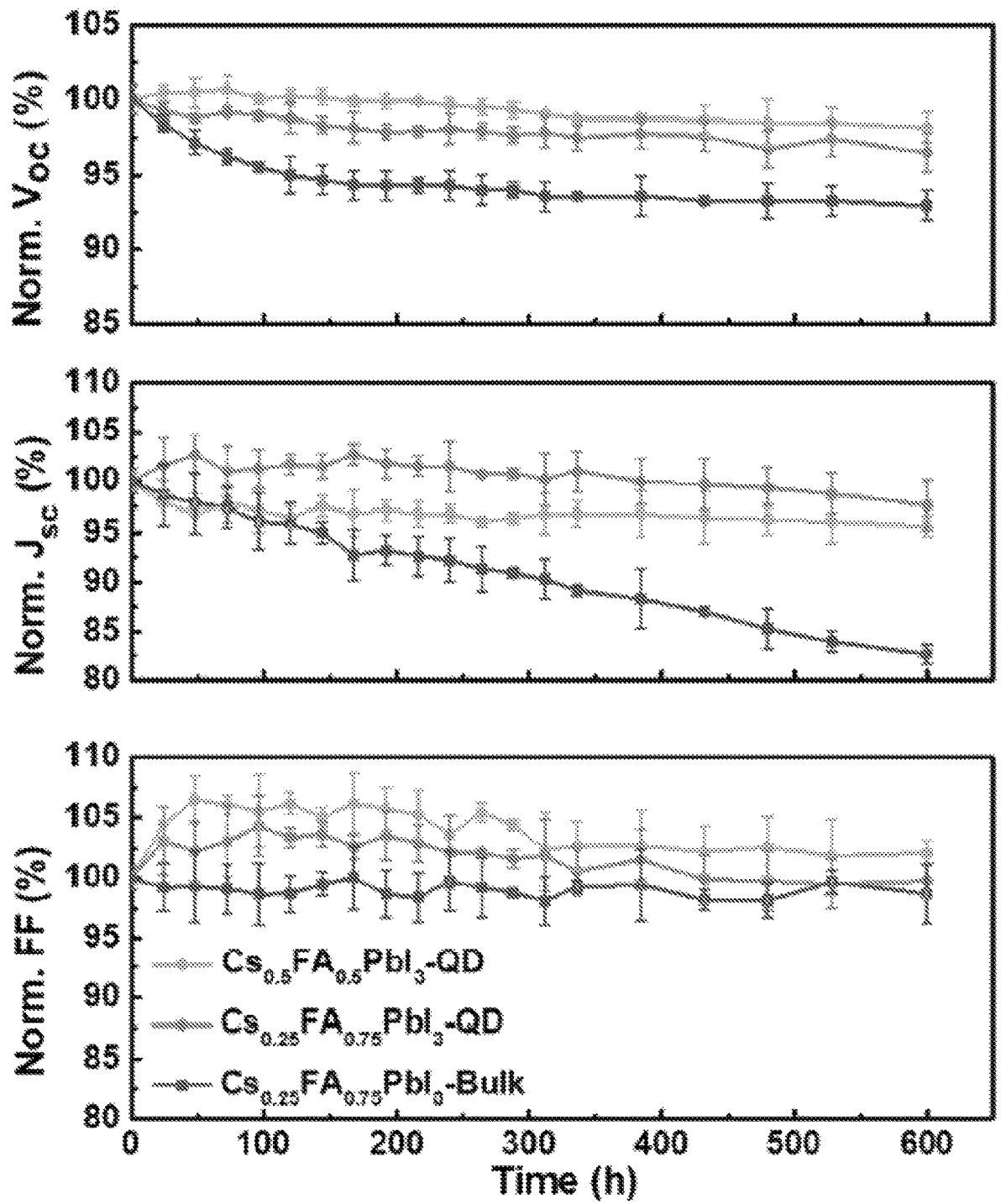
FIG. 19 shows the long-term stability of parameters ($V_{OC}$, $J_{SC}$ and FF) of solar cell devices comprising a $Cs_{0.5}FA_{0.5}PbI_3$-QD film, a $Cs_{0.25}FA_{0.75}PbI_3$-QD film and a $Cs_{0.25}FA_{0.75}PbI_3$-bulk film at open circuit under 1-sun illumination (mean±SEM, where n=3).
Figure 20:
FIG. 20 is a set of photographic images of quantum dots films applied to various substrates, wherein (A) is a bare commercial ITO substrate; (B) is one layer of quantum dots on a commercial ITO substrate; (C) is two layers of quantum dots of a commercial ITO substrate; (D) is three layers of quantum dots on a commercial ITO substrate; (E) is four layers of quantum dots on a commercial ITO substrate; (F) is a bare fluorine-doped tin oxide (FTO) substrate; (G) is one layer of quantum dots on an FTO substrate; (H) is four layers of quantum dots on an FTO substrate; and (I) is one layer of quantum dots on a TiO$_2$-coated FTO glass substrate.

Long-term stability experiments on solar cell devices under illumination were performed by holding the devices at open circuit under continuous 1-sun illumination without cooling in nitrogen. The $Cs_{0.25}FA_{0.75}PbI_3$ and $Cs_{0.5}FA_{0.5}PbI_3$ hybrid quantum dots devices retained 90% and 94% of their original PCEs after 600 h illumination, whereas the large-grain $Cs_{0.25}FA_{0.75}PbI_3$ bulk thin-film device lost over 20% of its original PCE after 600 hours (FIG. 18E). The corresponding $V_{OC}$, $J_{SC}$ and FF values are provided in FIG. 19. The PCE retention of the hybrid quantum dots devices appears to be due to their coupled $V_{OC}$ and FF stability.

Example 14—Scalable Coating Techniques

Commercial ITO substrates (2.5×2.5 cm²), FTO substrates (2×2 cm²), $TiO_2$-coated FTO glass (2×2 cm²), and FTO glass (6×6 cm$^2$) were coated with quantum dots using doctor blading (blade coating). In brief, 25 µL (for 2.5×2.5 cm$^2$ and 2×2 cm$^2$ substrates) or 75 µL (for 6×6 cm$^2$ substrate) of CsPbI$_3$ quantum dots (60 mg/mL in octane) were applied to the substrates using blade coating with a blade gap of 80 µm and a speed of 1 cm/s at room temperature. The process was repeated up to five times to vary the thickness of the coating.

The concentration of the quantum dots in the coating solution (ink) was varied from 37.5 mg/mL to 75 mg/mL in octane to determine the effect of the concentration on the thickness of the layer. In brief, 25 µL of CsPbI$_3$ quantum dots (37.5 mg/mL, 50 mg/mL or 75 mg/mL in octane) was applied to an FTO glass substrate (2×2 cm$^2$) using blade coating with a blade gap of 80 µm and a speed of 1 cm/s at room temperature. The process was repeated up to five times. The film thickness was estimated using cross-section SEM using methods described in Example 7.

A flexible polyethylene terephthalate (PET) substrate (5×6 cm$^2$) was coated with Cs$_{0.25}$FA$_{0.75}$PbI$_3$ quantum dots (prepared in accordance with Example 3, with the molar ratio of the parent quantum dots adjusted accordingly) using blade coating. 75 µL of Cs$_{0.25}$FA$_{0.75}$PbI$_3$ quantum dots (60 mg/mL in octane) were applied to the PET substrate using blade coating, with a blade gap of 100 µm and a speed of 1 cm/s at room temperature. The process was repeated four times.

Spin-coating was performed in accordance with the process described in Example 8.

Results

Figure 21:
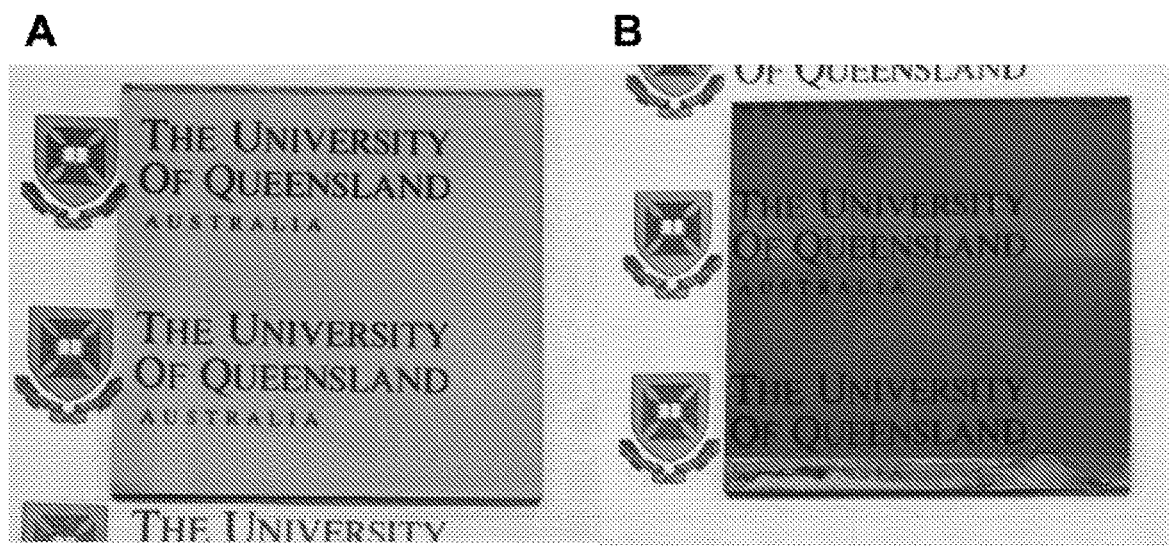
FIG. 21 is a set of photographic images of quantum dots films, with (A) one layer and (B) four layers of quantum dots on an FTO glass substrate with a large surface area (36 cm$^2$).

FIGS. 20A-E demonstrate that the thickness of the coating may be manipulated by varying the number of layers applied to the substrate, with 0-4 layers on a commercial ITO substrate, respectively. Similar results were obtained with the FTO substrates (FIGS. 20F-H; 0, 1 and 4 layers, respectively); TiO$_2$-coated FTO glass (FIG. 20I; 1 layer); and an FTO glass substrate with a larger surface area (FIGS. 21A and B; 1 and 4 layers, respectively). All coating methods produced uniform films.

The concentration of the quantum dots in the coating solution was found to affect the coating thickness. Table 5 presents the correlation between the quantum dots concentration in the coating solution and thickness of the coating using both spin coating and blade coating.

TABLE 5

Correlation between concentration of quantum dots in coating solution and coating thickness on an FTO glass substrate.

| Coating method | Concentration of quantum dots (mg/mL) | No. of layers | Thickness (nm) | Thickness/ layer (nm) |
|---|---|---|---|---|
| Spin coating | 75 | 4 | 220 | 55 |
| Blade coating | 75 | 3 | 240 | 80 |
| Blade coating | 50 | 4 | 160 | 40 |
| Blade coating | 37.5 | 5 | 110 | 22 |

Figure 22:
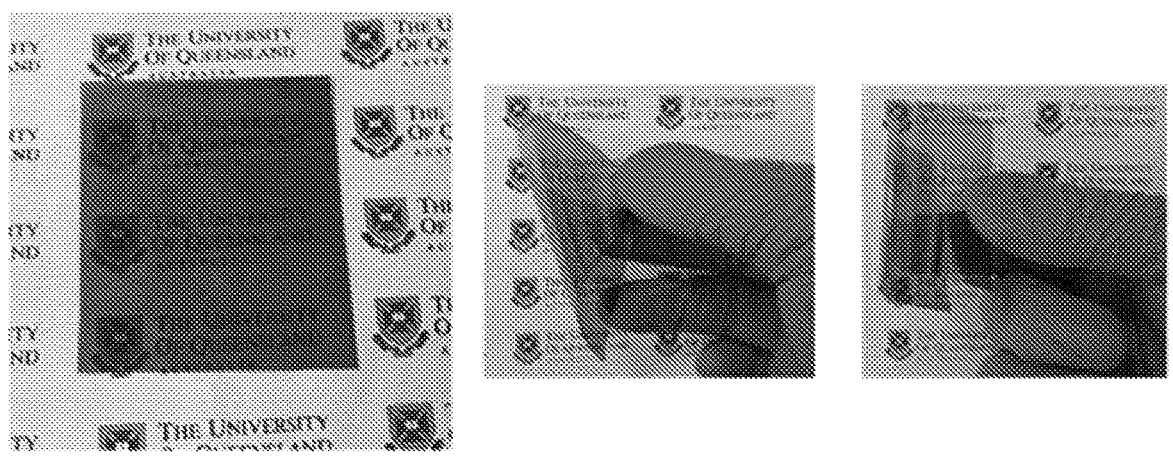
FIG. 22 is a set of photographic images of a film comprising quantum dots coated on a flexible PET substrate.

A quantum dots film was applied to a flexible PET substrate and resulted in a uniform film (FIG. 22).

Example 15—Effect of Coating Method and Parameters on Solar Cell Performance Solar cell devices were prepared in accordance with Example 8, with the coating method for the quantum dots layer being varied.

In brief, solar cells were fabricated with the device structure depicted in FIG. 9C, with the substrate being a TiO$_2$-coated FTO glass substrate (1.5×1.5 cm$^2$). Cs$_{0.25}$FA$_{0.75}$PbI$_3$ hybrid quantum dots (prepared by the procedure of Example 3) were redispersed in octane at a concentration of approximately 60 mg/mL.

Spin-coated films were prepared using Cs$_{0.25}$FA$_{0.75}$PbI$_3$ hybrid quantum dots as per Example 8 unless otherwise indicated.

Blade-coated films were prepared in accordance with the following procedure unless otherwise indicated. 15 µL of Cs$_{0.25}$FA$_{0.75}$PbI$_3$ hybrid quantum dots (60 mg/mL in octane) were applied to a TiO$_2$-coated FTO glass substrate (1.5×1.5 cm$^2$) using blade coating with a blade gap of 80 µm and a speed of 1 cm/s at room temperature. The film was dipped in a saturated Pb(NO$_3$)$_2$ solution (prepared in accordance with Example 8) for several seconds, rinsed in neat, anhydrous methyl acetate for several seconds and dried with a stream of air. The process was repeated four to five times (to build up approximately 300-400 nm thick films).

Deposition of all films was performed in air (relative humidity <40%). A spiro-OMe TAD solution was prepared by dissolving 73.5 mg of spiro-OMeTAD in 1 mL of chlorobenzene, which was doped by 28.8 µL of 4-tert-butylpyridine and 17.5 µL of Li-TSFI (520 mg/mL in acetonitrile) solution. The spiro-OMe TAD solution was spin-coated on the hybrid quantum dots film at 4,000 rpm for 30 s by dropping 70 µL of the solution on the spinning substrate. On top of the spiro-OMe TAD layer, a gold layer (approximately 80 nm thickness) was thermally evaporated at 0.5 Å/s.

The solar cell characteristics were assessed as per the methods of Example 8.

Results

Table 6 compares the solar cell performance following coating using different concentrations of quantum dots in the coating solution. Coating with a solution comprising quantum dots at a concentration of 60 mg/mL was found to produce a device with a greater PCE than at a concentration of 75 mg/mL.

TABLE 6

Effect of concentration of quantum dots in coating solution on solar cell performance.

| Concentration of quantum dots (mg/mL) | Coating method | PCE (%) | J$_{sc}$ (mA/cm$^2$) | V$_{oc}$ (V) | FF (%) |
|---|---|---|---|---|---|
| 75 | Blade coating | 1.37 | 4.71 | 1.01 | 0.29 |
| 60 | Blade coating | 7.78 | 12.50 | 1.09 | 0.57 |

The blade gap was also found to affect solar cell performance, with a blade gap of 80 µm producing a device with a PCE of 11.40% (Table 7).

TABLE 7

Effect of blade gap on solar cell performance.

| Blade gap (µm) | PCE (%) | J$_{sc}$ (mA/cm$^2$) | V$_{oc}$ (V) | FF (%) |
|---|---|---|---|---|
| 100 | 10.33 | 14.10 | 1.12 | 0.65 |
| 80 | 11.40 | 14.69 | 1.12 | 0.69 |

TABLE 7-continued

Effect of blade gap on solar cell performance.

| Blade gap (μm) | PCE (%) | $J_{sc}$ (mA/cm$^2$) | $V_{oc}$ (V) | FF (%) |
|---|---|---|---|---|
| 50 | 8.73 | 12.88 | 1.10 | 0.62 |
| N/A (spin coating) | 8.76 | 13.31 | 1.08 | 0.61 |

Spin coating and blade coating methods were compared, with both methods resulting in devices with comparable PCEs (Table 8). This indicates that larger scale solar cells comprising the quantum dots of the invention may be produced using blade coating, which is a scalable coating technique, without losing their efficiency.

TABLE 8

Effect of coating method on solar cell performance.

| Coating method | Pb(NO$_3$)$_2$ loading time (s) | MeOAc loading time (s) | PCE (%) | $J_{sc}$ (mA/cm$^2$) | $V_{oc}$ (V) | FF (%) |
|---|---|---|---|---|---|---|
| Spin coating | 0 | 0 | 12.56 | 17.39 | 1.09 | 0.66 |
| Blade coating | 5 | 5 | 12.45 | 16.60 | 1.10 | 0.68 |

Consistent with the data of Table 6, a lower concentration of quantum dots in the coating solution increased the performance of the solar cell (Table 9). A longer loading time in the Pb(NO$_3$)$_2$ and methyl acetate solutions following coating of the quantum dots also increased solar cell performance, likely due to removal of excess long-chain organic ligands.

TABLE 9

Effect of concentration of quantum dots in the coating solution and the ligand solution loading time on solar cell performance.

| Concentration of quantum dots (mg/mL) | Coating method | Pb(NO$_3$)$_2$ loading time (s) | MeOAc loading time (s) | PCE (%) | $J_{sc}$ (mA/cm$^2$) | $V_{oc}$ (V) | FF (%) |
|---|---|---|---|---|---|---|---|
| 75 | Spin coating | 0 | 0 | 0.50 | 0.99 | 0.72 | 0.70 |
| 75 | Blade coating | 0 | 0 | 0.57 | 0.93 | 0.77 | 0.79 |
| 50 | Blade coating | 0 | 0 | 4.10 | 7.10 | 0.85 | 0.68 |
| 75 | Blade coating | 5 | 5 | 1.04 | 1.57 | 0.80 | 0.83 |

The thickness of the electron transport layer (e.g. titanium dioxide layer) also effected solar cell performance, with a greater thickness of 40 nm corresponding to an increased PCE of the solar cell (Table 10).

TABLE 10

Effect of TiO$_2$ layer thickness on solar cell performance.

| TiO$_2$ thickness (nm) | Coating method | Pb(NO$_3$)$_2$ loading time (s) | MeOAc loading time (s) | PCE (%) | $J_{sc}$ (mA/cm$^2$) | $V_{oc}$ (V) | FF (%) |
|---|---|---|---|---|---|---|---|
| 20 | Blade coating | 0 | 5 | 6.30 | 8.64 | 1.12 | 0.65 |
| 40 | Blade coating | 0 | 5 | 9.48 | 11.49 | 1.13 | 0.73 |
| 20 | Spin coating | 0 | 5 | 1.77 | 3.54 | 1.00 | 0.50 |
| 40 | Spin coating | 0 | 5 | 4.54 | 8.06 | 1.07 | 0.52 |

The disclosure of every patent, patent application, and publication cited herein is hereby incorporated herein by reference in its entirety.

The citation of any reference herein should not be construed as an admission that such reference is available as "Prior Art" to the instant application.

Throughout the specification the aim has been to describe the preferred embodiments of the invention without limiting the invention to any one embodiment or specific collection of features. Those of skill in the art will therefore appreciate that, in light of the instant disclosure, various modifications and changes can be made in the particular embodiments exemplified without departing from the scope of the present invention. All such modifications and changes are intended to be included within the scope of the appended claims.

The invention claimed is:

1. A process for preparing hybrid perovskite quantum dots, the process comprising the steps of:
   a) preparing first quantum dots having a first composition and a first surface ligand at a first target amount;
   b) preparing second quantum dots having a second composition and a second surface ligand at a second target amount; and,
   c) preparing a solution comprising a ratio of the first and second quantum dots so that the first and second quantum dots undergo ligand-mediated cation exchange to form hybrid quantum dots having a composition determined by the first and second compositions and the ratio
   wherein the first composition and the second composition independently comprise a compound of formula I:

$$AMX_3 \qquad (I)$$

wherein:
   A is an alkali metal cation, CH$_3$NH$_3^+$ or NH$_2$CH=NH$_2^+$;
   M is a metal cation; and
   each X is independently a halide;
   wherein the second composition is a composition other than the first composition;
   wherein a molar ratio of a compound of formula I in the first quantum dots to the first surface ligand at the first target amount is in the range of from 1:2 to 1:25;
   and wherein a molar ratio of a compound of formula I in the second quantum dots to the second surface ligand at the second target amount is in the range of from 1:3 to 1:30.

2. The process according to claim 1, wherein the first quantum dots are synthesised with a first surface ligand at a first amount and are at least partially purified to reduce the amount of the first surface ligand to the first target amount.

3. The process according to claim 2, wherein a molar ratio of a compound of formula I in the first quantum dots to the first surface ligand at the first amount is in the range of from 1:20 to 1:45.

4. The process according to claim 2, wherein a molar ratio of the first surface ligand at the first target amount to the first surface ligand at the first amount is in the range of from 1:2 to 1:25.

5. The process according to claim 2, wherein the process comprises preparing the first quantum dots using a process comprising the steps of:
   a) preparing a first product solution comprising the first quantum dots comprising the first surface ligand at the first amount; and
   b) at least partially purifying the first quantum dots to create a first solution comprising the first quantum dots comprising the first surface ligand at the first target amount.

6. The process according to claim 5, wherein the process comprises at least partially purifying the first quantum dots using a process comprising the steps of:
   a) precipitating the first quantum dots from the first product solution;
   b) separating the precipitate from the first product solution; and
   c) dispersing the precipitate in a first solvent to form the first solution.

7. The process according to claim 5, wherein the first target amount is a concentration in the range of from 0.01 g/mL to 0.5 g/mL in the first solution.

8. The process according to claim 5, wherein the first amount is a concentration in the range of from 0.1 g/mL to 0.9 g/mL in the first product solution.

9. The process according to claim 1, wherein the first composition is $CsPbI_3$ and the second composition is $FAPbI_3$.

10. The process according to claim 1, wherein the second quantum dots are synthesised with a second surface ligand at a second amount and are at least partially purified to reduce the amount of the second surface ligand to the second target amount.

11. The process according to claim 10, wherein a molar ratio of a compound of formula I in the second quantum dots to the second surface ligand at the second amount is in the range of from 1:15 to 1:40.

12. The process according to claim 10, wherein a molar ratio of the second surface ligand at the second target amount to the second surface ligand at the second amount is in the range of from 1:1.2 to 1:15.

13. The process according to claim 10, wherein the process comprises preparing the second quantum dots using a process comprising the steps of:
   a) preparing a second product solution comprising the second quantum dots comprising the second surface ligand at the second amount; and
   b) at least partially purifying the second quantum dots to create a second solution comprising the second quantum dots comprising the second surface ligand at the second target amount.

14. The process according to claim 13, wherein the process comprises at least partially purifying the second quantum dots using a process comprising the steps of:
   a) precipitating the second quantum dots from the second product solution;
   b) separating the precipitate from the second product solution; and
   c) dispersing the precipitate in a second solvent to form the second solution.

15. The process according to claim 13, wherein the second target amount is a concentration in the range of from 0.05 g/mL to 0.7 g/mL in the second solution.

16. The process according to claim 13, wherein the second amount is a concentration in the range of from 0.1 g/mL to 0.9 g/mL in the second product solution.

17. The process according to claim 1, wherein the first and second surface ligands are independently selected from the group consisting of an amine selected from the group consisting of optionally substituted alkyl amine, optionally substituted alkenyl amine, optionally substituted aralkyl amine and optionally substituted aryl amine; a phosphine selected from the group consisting of optionally substituted trialkyl phosphine, optionally substituted alkyl phosphine, optionally substituted alkenyl phosphine, optionally substituted aryl phosphine, optionally substituted triaryl phosphine and optionally substituted aralkyl phosphine; an alkali metal cation; an acid selected from the group consisting of optionally substituted alkyl carboxylic acid, optionally substituted alkenyl carboxylic acid, optionally substituted aralkyl carboxylic acid and optionally substituted aryl carboxylic acid; a halide or a pseudo halide; a thiol selected from the group consisting of optionally substituted alkyl thiol, optionally substituted alkenyl thiol, optionally substituted aryl thiol and optionally substituted cycloalkyl thiol; and combinations thereof.

18. The process according to claim 17, wherein the acid is selected from the group consisting of oleic acid, benzoic acid and acetic acid.

19. The process according to claim 1, wherein the hybrid perovskite quantum dots have the formula $Cs_yFA_{1-y}PbI_3$, wherein y is a value in the range of from 0.1 to 0.9 and is determined by the ratio of the first and second quantum dots.

* * * * *